(12) United States Patent
Masaki et al.

(10) Patent No.: US 12,261,128 B2
(45) Date of Patent: Mar. 25, 2025

(54) SEMICONDUCTOR MEMORY DEVICE

(71) Applicant: Kioxia Corporation, Tokyo (JP)

(72) Inventors: Mitsunori Masaki, Yokkaichi (JP); Hisashi Kato, Yokkaichi (JP); Kazuhiro Nojima, Mie (JP); Shoichi Miyazaki, Yokkaichi (JP); Akira Yotsumoto, Yokkaichi (JP); Kanako Shiga, Yokkaichi (JP); Yu Hirotsu, Kuwana (JP); Osamu Matsuura, Kuwana (JP)

(73) Assignee: Kioxia Corporation, Tokyo (JP)

( * ) Notice: Subject to any disclaimer, the term of this patent is extended or adjusted under 35 U.S.C. 154(b) by 662 days.

(21) Appl. No.: 17/411,238

(22) Filed: Aug. 25, 2021

(65) Prior Publication Data

US 2022/0262744 A1 Aug. 18, 2022

(30) Foreign Application Priority Data

Feb. 18, 2021 (JP) ................. 2021-024143

(51) Int. Cl.
*H01L 23/00* (2006.01)
*H10B 41/27* (2023.01)
*H10B 43/10* (2023.01)
*H10B 43/27* (2023.01)
*H10B 43/35* (2023.01)
*H10B 43/50* (2023.01)

(52) U.S. Cl.
CPC .......... *H01L 23/562* (2013.01); *H10B 41/27* (2023.02); *H10B 43/27* (2023.02); *H10B 43/35* (2023.02); *H10B 43/50* (2023.02); *H10B 43/10* (2023.02)

(58) Field of Classification Search
None
See application file for complete search history.

(56) References Cited

U.S. PATENT DOCUMENTS

| | | | | |
|---|---|---|---|---|
| 2011/0151667 | A1* | 6/2011 | Hwang | H10B 41/20 257/E21.585 |
| 2017/0179026 | A1* | 6/2017 | Toyama | H10B 41/41 |
| 2017/0194345 | A1* | 7/2017 | Nojima | H10B 43/27 |
| 2019/0096899 | A1* | 3/2019 | Tagami | H10B 43/10 |
| 2019/0371813 | A1* | 12/2019 | Oike | H10B 43/10 |
| 2020/0098782 | A1 | 3/2020 | Nojima et al. | |

FOREIGN PATENT DOCUMENTS

CN 108377660 A 8/2018
JP 2020-047810 A 3/2020

* cited by examiner

*Primary Examiner* — Yara B Green
*Assistant Examiner* — Fakeha Sehar
(74) *Attorney, Agent, or Firm* — Oblon, McClelland, Maier & Neustadt, L.L.P.

(57) ABSTRACT

Semiconductor memory device includes: a first and second member each extending in a first direction in a boundary part between a first and second block region and arranged in the first direction; a support pillar arranged between the first and second member at the boundary part; conductive layers separated from one another and arranged in a third direction and split by the first and second member, and the support pillar into a first and second portion; and a memory pillar penetrating through the conductive layers. The support pillar includes a lower and upper pillar. A side face of the lower pillar and an extension of a side face of the upper pillar are displaced from each other in a plane based on a second and the third direction.

19 Claims, 53 Drawing Sheets

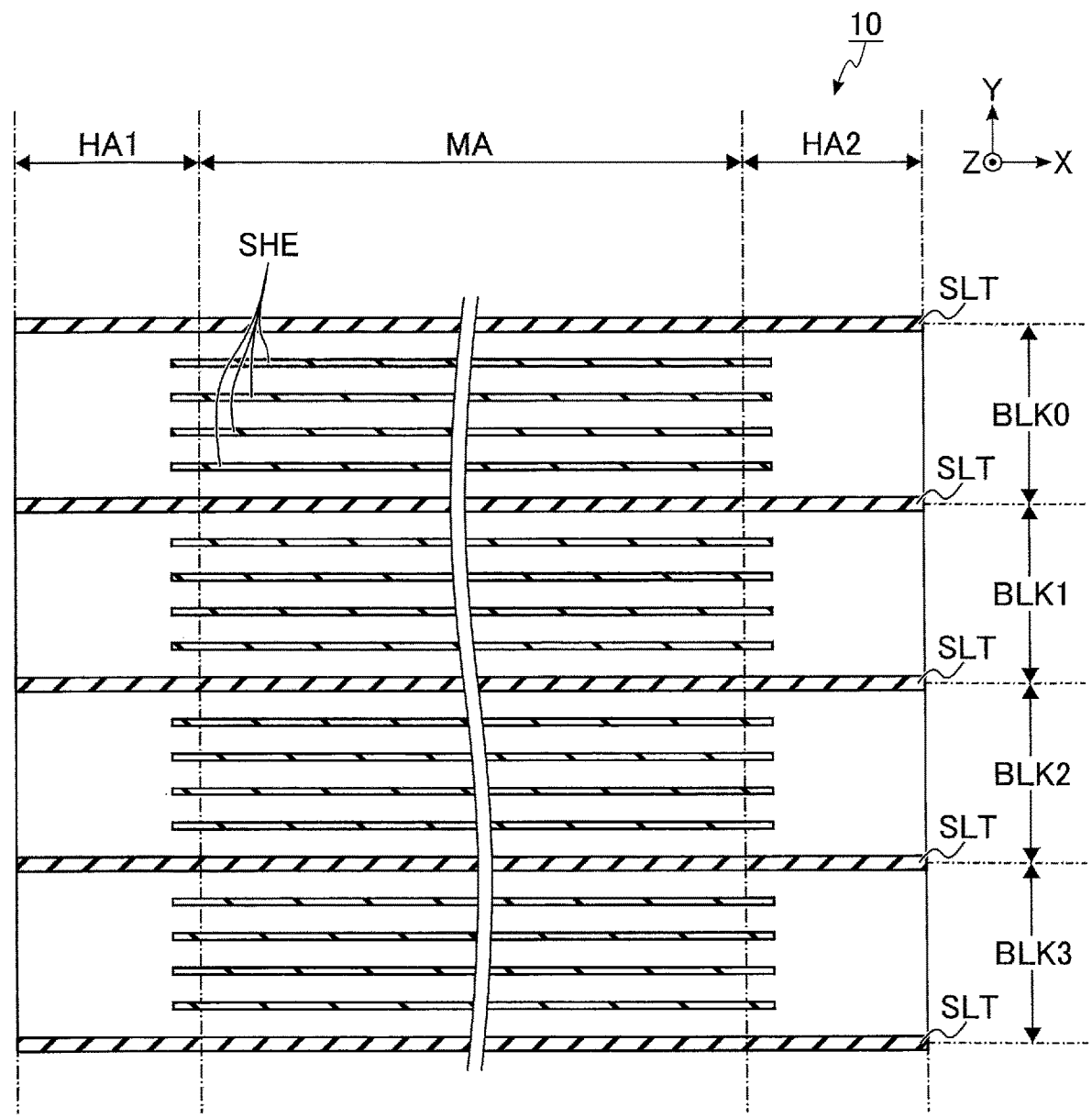
F I G. 3

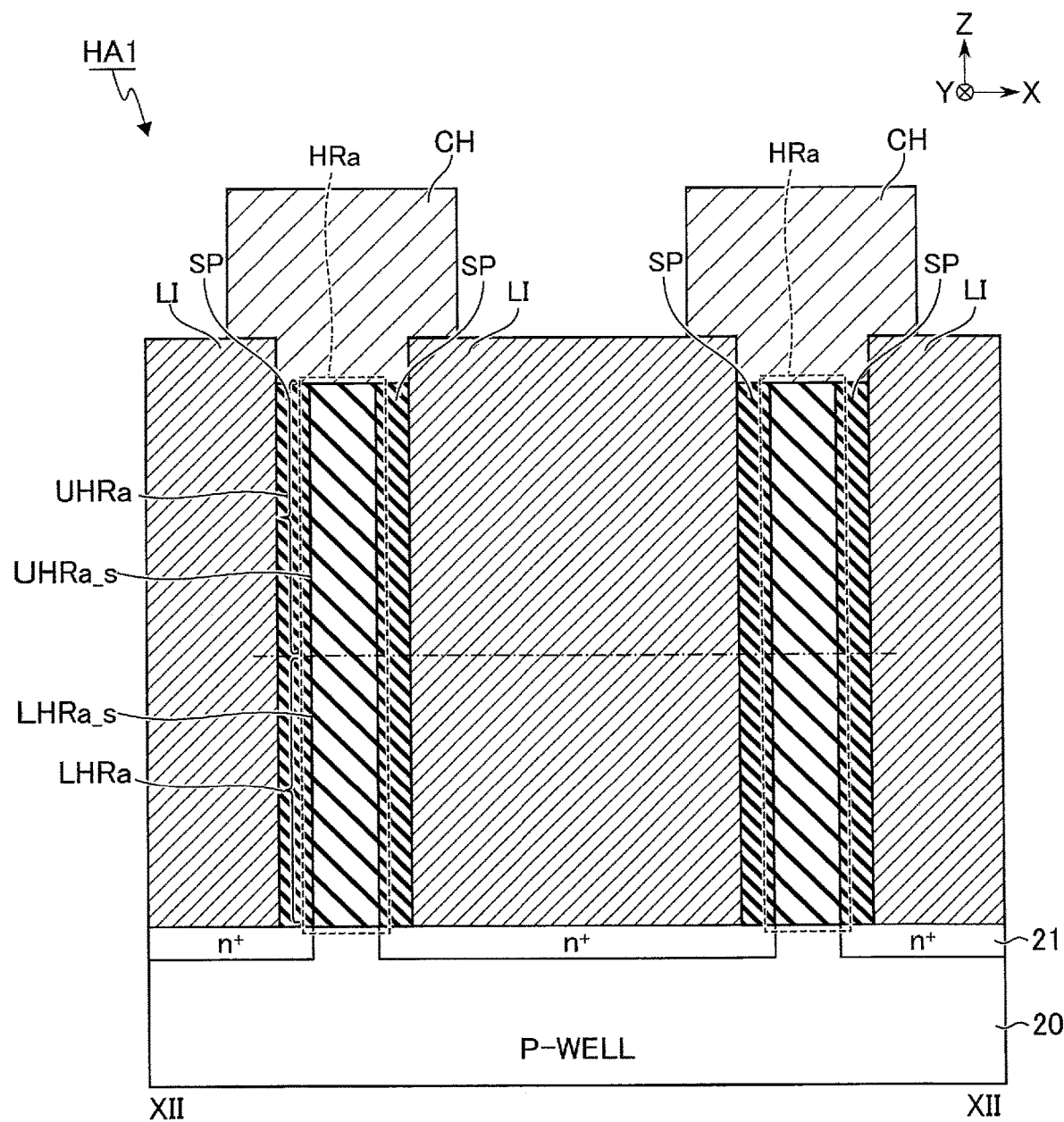
F I G. 12

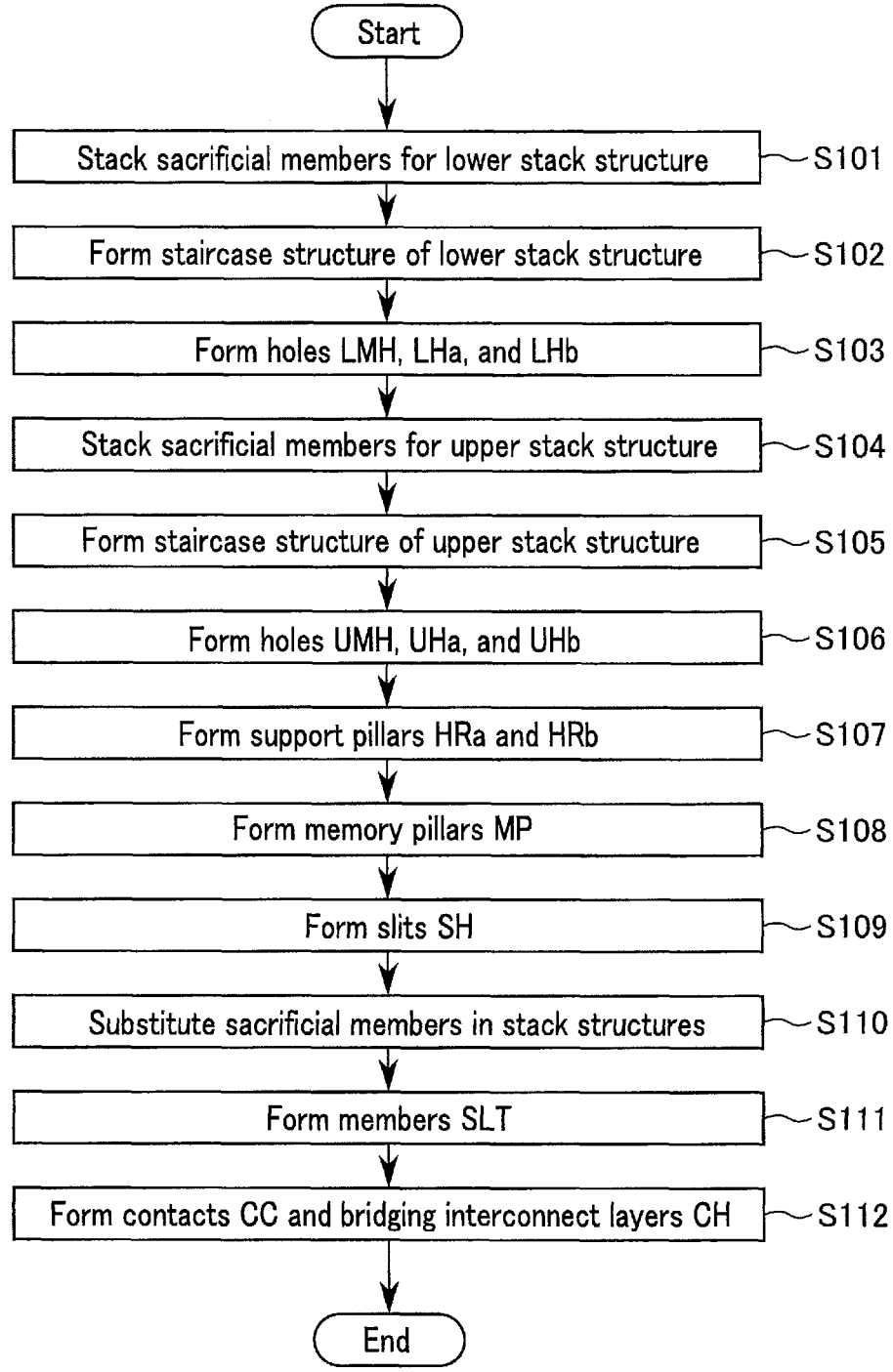
F I G. 13

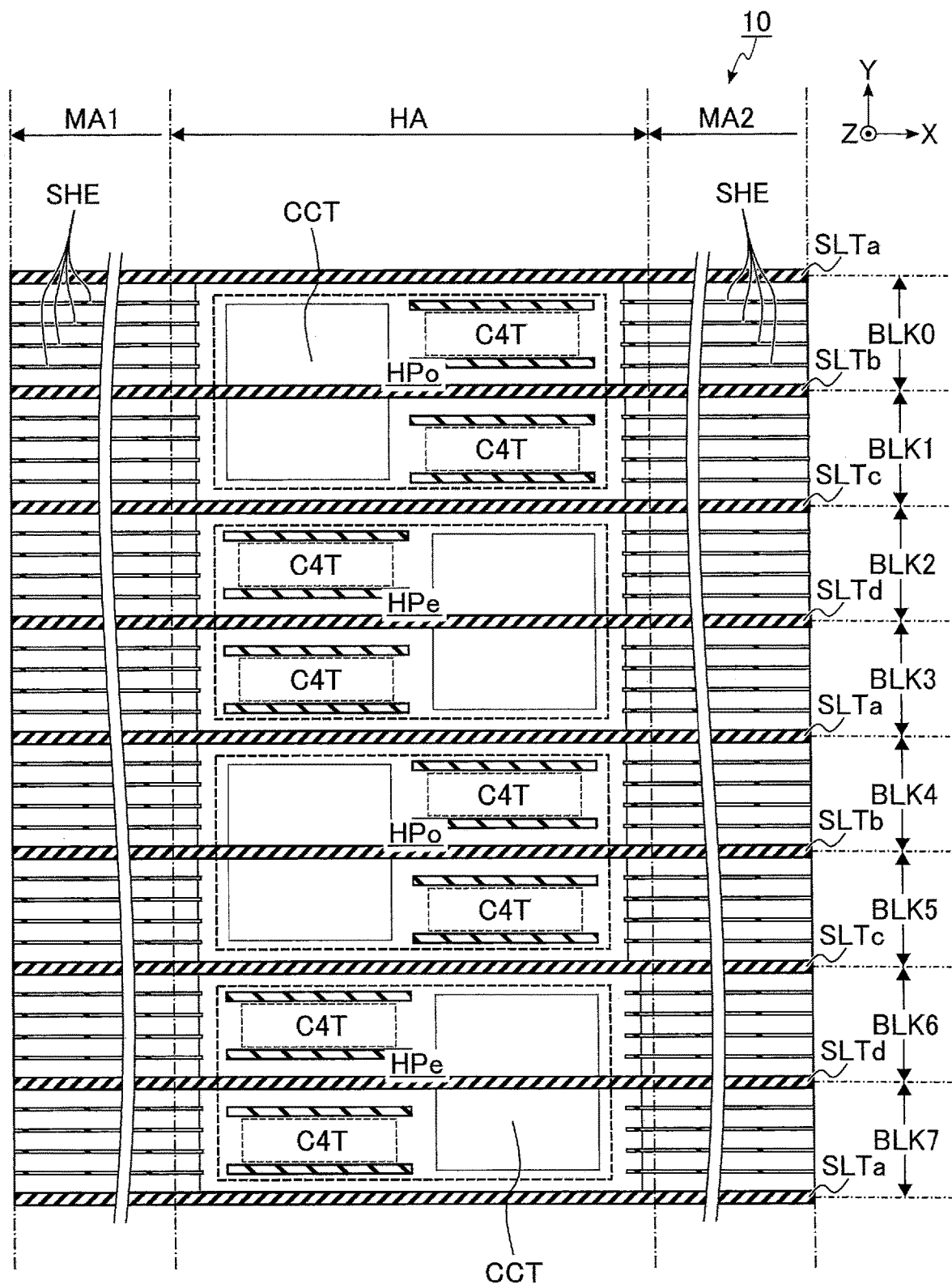
F I G. 30

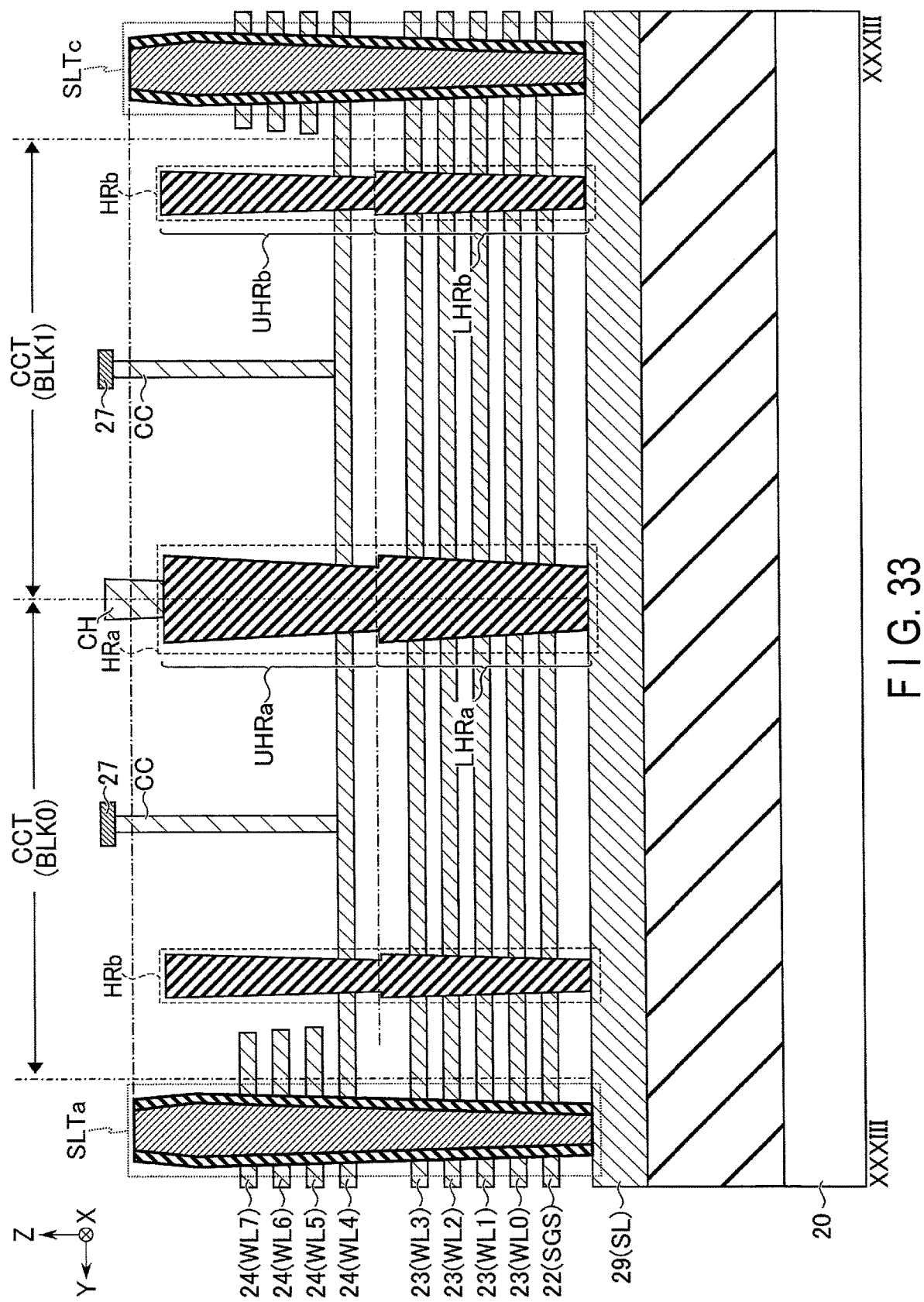
F I G. 33

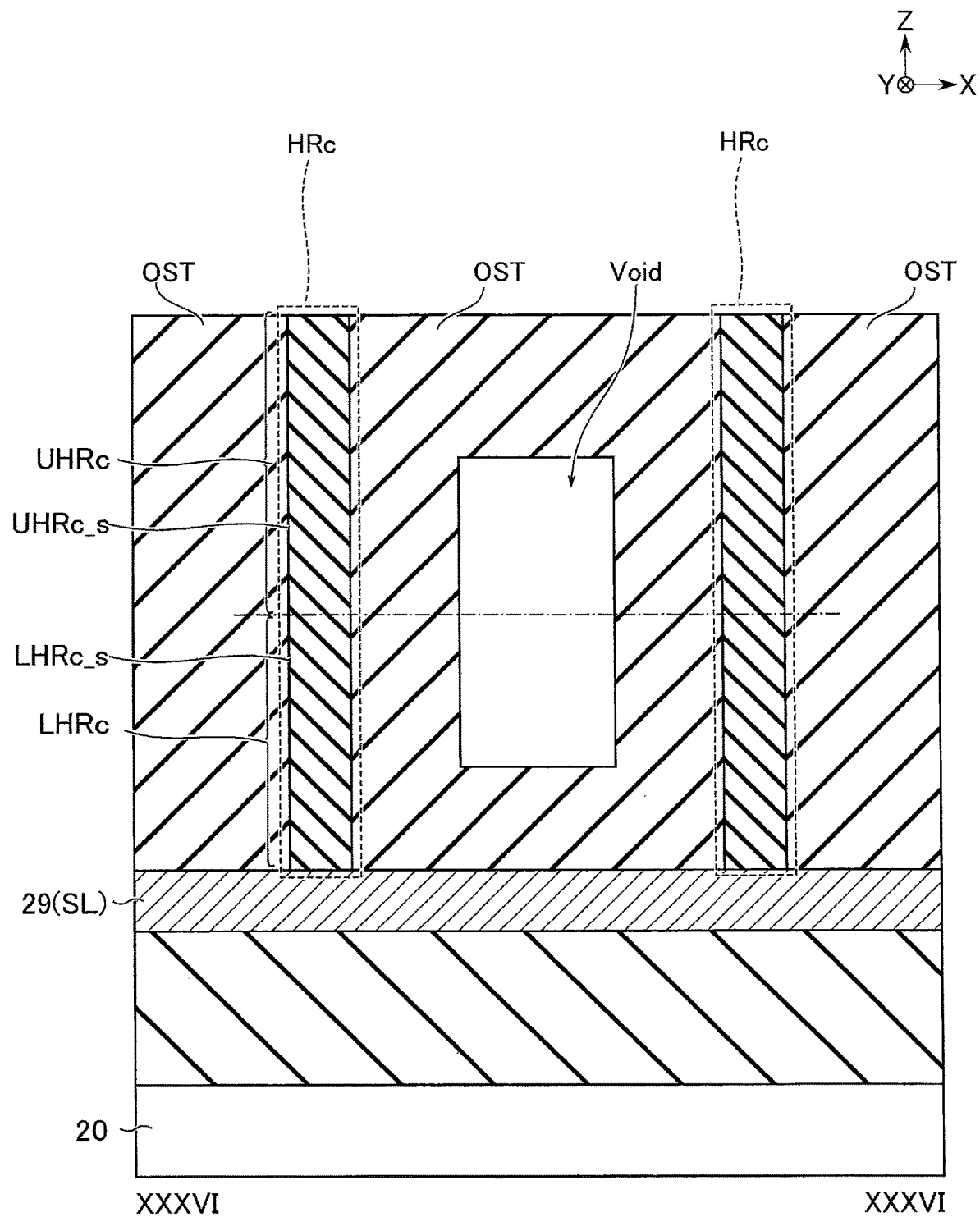
F I G. 36

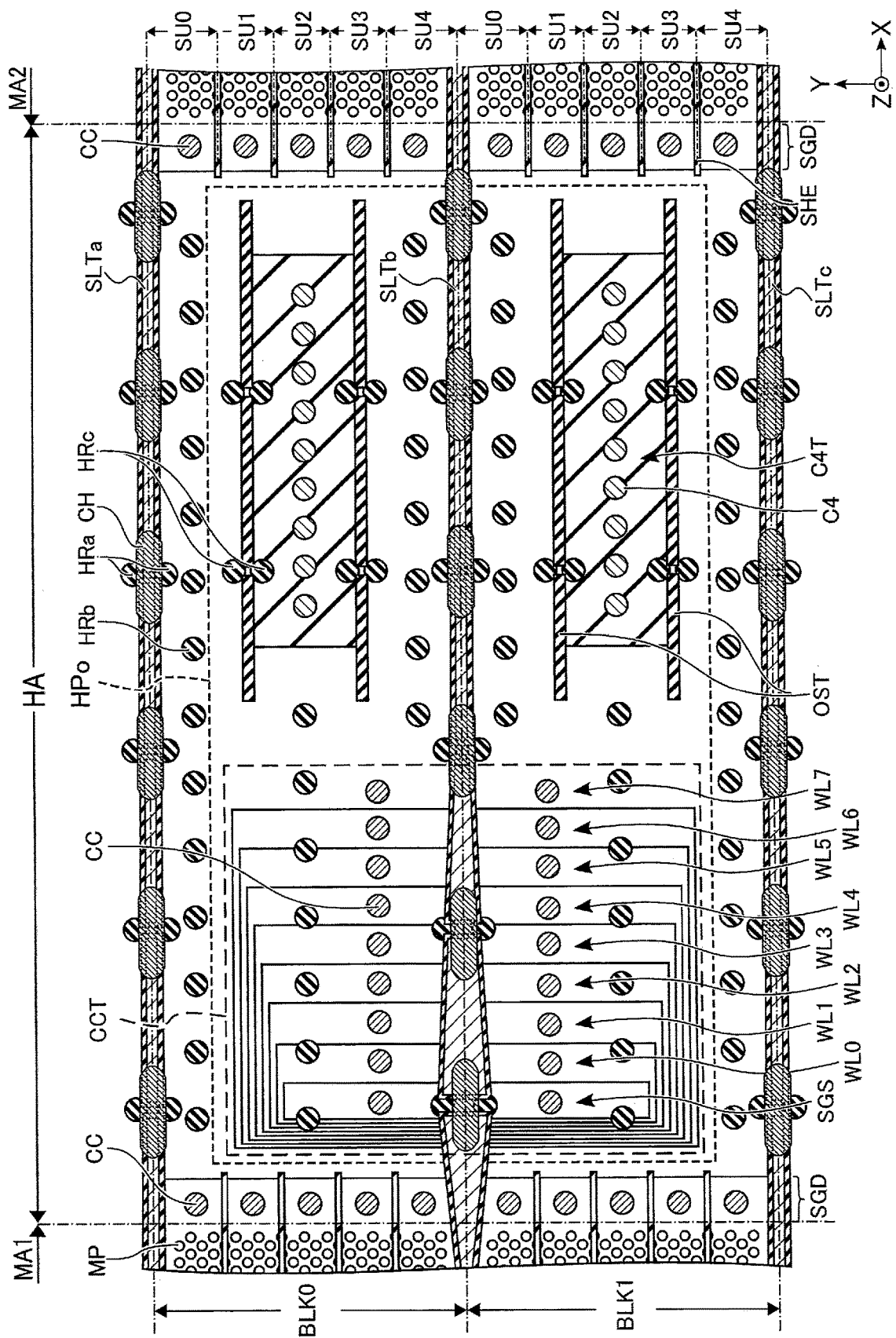
F I G. 50

SEMICONDUCTOR MEMORY DEVICE

CROSS-REFERENCE TO RELATED APPLICATIONS

This application is based upon and claims the benefit of priority from Japanese Patent Application No. 2021-024143, filed Feb. 18, 2021, the entire contents of which are incorporated herein by reference.

FIELD

Embodiments described herein relate generally to a semiconductor memory device.

BACKGROUND

As a semiconductor memory device capable of storing data in a non-volatile manner, a NAND flash memory is known. Such a semiconductor memory device as represented by a NAND flash memory adopts a three-dimensional memory structure for enhanced integration and increased capacity.

BRIEF DESCRIPTION OF THE DRAWINGS

FIG. 3 is a plan view showing an exemplary planar layout of the memory cell array in the semiconductor memory device according to the first embodiment.

FIG. 12 is a sectional view taken along the line XII-XII indicated in FIG. 8 and shows an exemplary sectional structure of the memory cell array, for its hookup area, in the semiconductor memory device according to the first embodiment.

FIG. 13 is a flowchart showing an exemplary method for manufacturing the semiconductor memory device according to the first embodiment.

FIG. 30 is a plan view showing an exemplary planar layout of a memory cell array in a semiconductor memory device according to a second embodiment.

FIG. 33 is a sectional view taken along the line XXXIII-XXXIII indicated in FIG. 31 and shows an exemplary sectional structure of the memory cell array, for its hookup area, in the semiconductor memory device according to the second embodiment.

FIG. 36 is a sectional view taken along the line XXXVI-XXXVI indicated in FIG. 31 and shows an exemplary sectional structure of the memory cell array, for its hookup area, in the semiconductor memory device according to the second embodiment.

FIG. 50 is a plan view showing a detailed exemplary planar layout of a memory cell array, for its hookup area, in a semiconductor memory device according to a second modification of the second embodiment.

DETAILED DESCRIPTION

Figure 1:
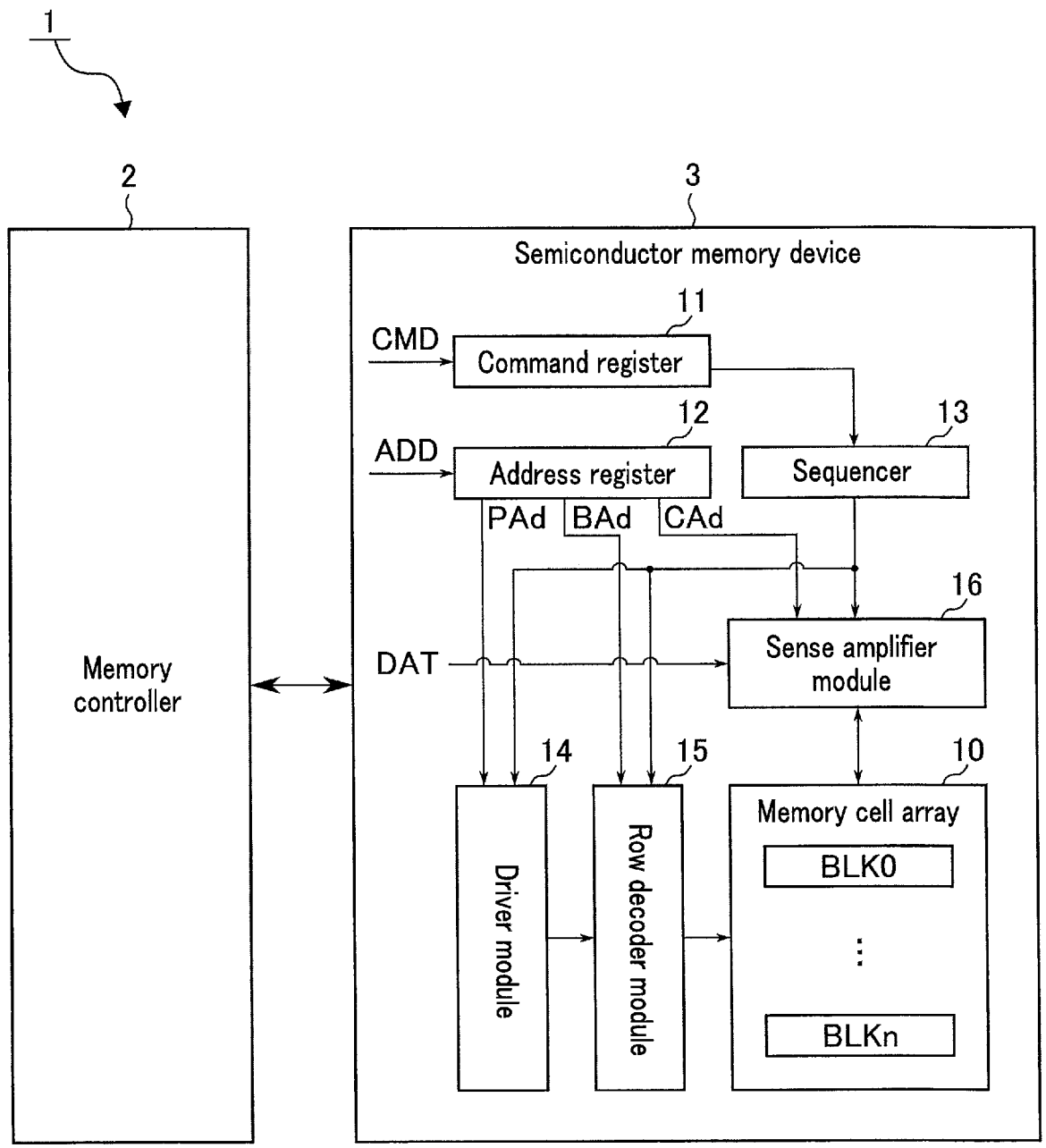
FIG. 1 is a block diagram showing a memory system that embraces a semiconductor memory device according to a first embodiment.

In general, according to one embodiment, a semiconductor memory device includes a substrate, a first member and a second member, a first support pillar, a plurality of conductive layers including a first conductive layer and a second conductive layer, and a first memory pillar. The substrate has a first block region and a second block region each extending in a first direction. The first block region and the second block region are arranged in a second direction crossing the first direction. The first member and the second member each extend in the first direction in a first boundary part between the first block region and the second block region. The first member and the second member are arranged in the first direction. The first support pillar is arranged between the first member and the second member at the first boundary part. The plurality of conductive layers are separated from one another and arranged in a third direction crossing each of the first direction and the second direction. The plurality of conductive layers are split by the first member, the second member, and the first support pillar into a first portion located in the first block region and a second portion located in the second block region. The first memory pillar penetrates through the plurality of conductive layers. The first memory pillar includes a portion intersecting the first conductive layer and functioning as a first memory cell and a portion intersecting the second conductive layer and functioning as a second memory cell next to the first memory cell in the third direction. The first support pillar has a first shape which includes a lower pillar having an upper end at a level between the first conductive layer and the second conductive layer and an upper pillar having a lower end at a level between the first conductive layer and the second conductive layer, and in which a side face of the lower pillar and an extension of a side face of the upper pillar are displaced from each other in a plane based on the second direction and the third direction.

The embodiments will now be described with reference to the drawings. The dimensions, scales, etc., used in the drawings are not binding on actual products.

The description will use the same reference signs for the elements or components having the same or substantially the same functions and configurations. For the purpose of distinguishing between elements having the same or substantially the same configurations, the description may add different characters or numerals after their respective reference signs.

1. FIRST EMBODIMENT 1.1. Configuration
1.1.1 Memory System

FIG. 1 is a block diagram for explaining a configuration of a memory system according to a first embodiment. The memory system here is a storage device adapted for connection with an external host device (not illustrated). Examples of the memory system include a memory card such as an SD™ card. The memory system may instead be a universal flash storage (UFS), a solid state drive (SSD), or the like. The memory system according to the embodiment, denoted by reference sign "1", includes a memory controller 2 and a semiconductor memory device 3.

The memory controller 2 is configured as, for example, an integrated circuit such as a system-on-a-chip (SoC). The memory controller 2 controls the semiconductor memory device 3 based on commands from the host device. In a concrete implementation, for example, the memory controller 2 writes data designated by the host device for a write operation into the semiconductor memory device 3. Also, the memory controller 2 reads data designated by the host device for a read operation from the semiconductor memory device 3 and sends it to the host device.

The semiconductor memory device 3 is a memory adapted to store data in a non-volatile manner. Examples of the semiconductor memory device 3 include a NAND flash memory.

Communications between the memory controller 2 and the semiconductor memory device 3 comply with, for example, a single data rate (SDR) interface, a toggle double data rate (DDR) interface, an open NAND flash interface (ONFI), etc.

1.1.2 Semiconductor Memory Device

Referring to the block diagram in FIG. 1, an internal configuration of the semiconductor memory device according to the first embodiment will be described. The semiconductor memory device 3 includes, for example, a memory cell array 10, a command register 11, an address register 12, a sequencer 13, a driver module 14, a row decoder module 15, and a sense amplifier module 16.

The memory cell array 10 includes multiple blocks BLK0 to BLKn, where n is an integer equal to or greater than 1. Each block BLK is a set of multiple memory cells capable of storing data in a non-volatile manner, and used as, for example, a unit of data erase operation. The memory cell array 10 is provided with multiple bit lines and multiple word lines. In one example, each memory cell is associated with one bit line and one word line. A more detailed description about the configuration of the memory cell array 10 will be given later.

The command register 11 stores a command CMD received by the semiconductor memory device 3 from the memory controller 2. Examples of the command CMD include instructions to cause the sequencer 13 to conduct read, write, and erase operations, etc.

The address register 12 stores address information ADD received by the semiconductor memory device 3 from the memory controller 2. The address information ADD contains, for example, a block address BAd, a page address PAd, and a column address CAd. In exemplary operations, the block address BAd, the page address PAd, and the column address CAd are used for selecting a block BLK, a word line, and a bit line, respectively.

The sequencer 13 takes total control over the operations of the semiconductor memory device 3. In exemplary operations, the sequencer 13 controls the driver module 14, the row decoder module 15, the sense amplifier module 16, etc. to perform read, write, and erase operations, etc., according to the command CMD held at the command register 11.

The driver module 14 generates voltage for use in each of the read, write, and erase operations, etc. The driver module 14 applies the generated voltage to a signal line corresponding to a selected word line according to, for example, the page address PAd stored in the address register 12.

The row decoder module 15 refers to the block address BAd stored in the address register 12 to select a single corresponding block BLK in the memory cell array 10. Then, for example, the row decoder module 15 transfers the voltage applied to the signal line corresponding to the selected word line to this selected word line in the selected block BLK.

The sense amplifier module 16 in the write operation applies a given voltage to each bit line according to write data DAT received from the memory controller 2. Also, the sense amplifier module 16 in the read operation determines data stored in a memory cell based on the voltage of the corresponding bit line and transfers the determination result to the memory controller 2 as read data DAT.

1.1.3 Circuit Configuration of Memory Cell Array

Figure 2:
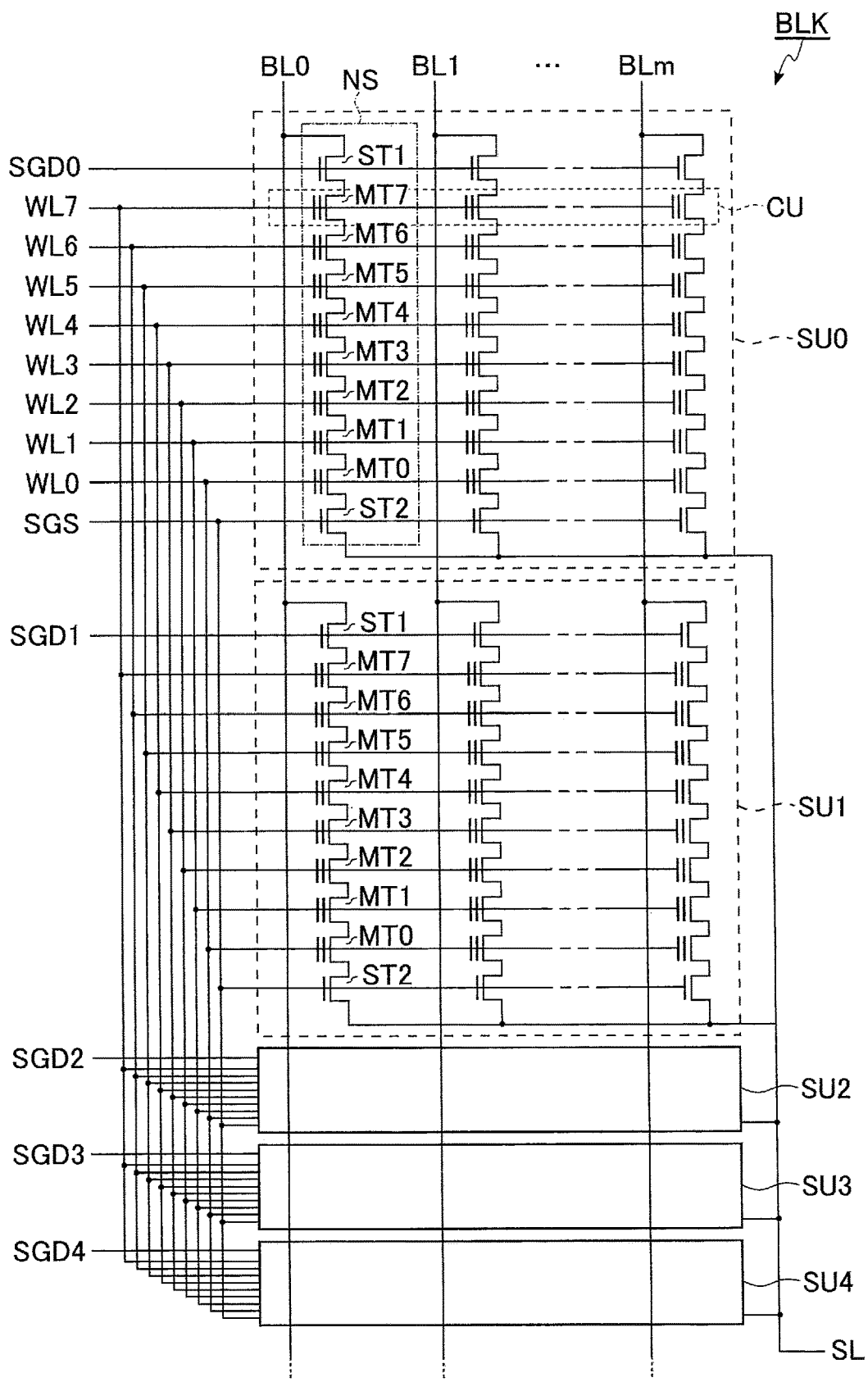
FIG. 2 is a circuit diagram showing an exemplary circuit configuration of a memory cell array in the semiconductor memory device according to the first embodiment.

FIG. 2 is a circuit diagram showing an exemplary circuit configuration of the memory cell array in the semiconductor memory device according to the first embodiment. FIG. 2 shows one of the multiple blocks BLK included in the memory cell array 10. As shown in FIG. 2, the block BLK includes, for example, five string units SU0 to SU4.

Each string unit SU includes multiple NAND strings NS associated with respective bit lines BL0 to BLm, where m is an integer equal to or greater than 1. The NAND strings NS each include, for example, memory cell transistors MT0 to MT7 and select transistors ST1 and ST2. The memory cell transistors MT each include a control gate and a charge accumulating layer, and store data in a non-volatile manner. The select transistors ST1 and ST2 are each used for the selection of the applicable string unit SU in various operations.

In each NAND string NS, the memory cell transistors MT0 to MT7 are coupled in series. The select transistor ST1 has its drain coupled to an associated bit line BL, and its source coupled to one end of the serially-coupled memory cell transistors MT0 to MT7. The other end of the serially-coupled memory cell transistors MT0 to MT7 is coupled to the drain of the select transistor ST2. The select transistor ST2 has its source coupled to a source line SL.

The memory cell transistors MT0 to MT7 each provided in multiple numbers within the same block BLK have their control gates coupled to respective word lines WL0 to WL7. The multiple select transistors ST1 in each of the string units SU0 to SU4 have their gates coupled to the respective, corresponding one of select gate lines SGD0 to SGD4. The multiple select transistors ST2 have their gates coupled to a select gate line SGS.

The bit lines BL0 to BLm are assigned respective column addresses differing from one another. Each bit line BL is shared by the NAND strings NS having the same column address, over the multiple blocks BLK. The word lines WL0 to WL7 as a group are provided for one respective block BLK. The source line SL is shared by, for example, the multiple blocks BLK.

A set including multiple memory cell transistors MT coupled to the common word line WL within one string unit SU may be called a "cell unit CU". In one example, the storage capacity of the cell unit CU, constituted by the memory cell transistors MT each adapted to store 1-bit data, is defined as "1-page data". Each cell unit CU may have a storage capacity of 2-pages data or more according to the bit number of data its memory cell transistors MT are adapted to store.

Note that the memory cell array 10 included in the semiconductor memory device 3 according to the first embodiment is not limited to the exemplary circuit configuration described above. For example, the number of string units SU in each block BLK may be discretionarily set. The numbers of the memory cell transistors MT and the select transistors ST1 and ST2 in each NAND string NS may be discretionarily set, as well.

1.1.4 Structure of Memory Cell Array

An exemplary structure of the memory cell array in the semiconductor memory device according to the first embodiment will be described. Note that the drawings which will be referred to below assume an X direction, a Y direction, and a Z direction. The X direction corresponds to the direction in which the word lines WL extend. The Y direction corresponds to the direction in which the bit lines BL extend. The Z direction corresponds to the direction perpendicular to the surface of a semiconductor substrate 20 employed for the formation of the semiconductor memory device 3. The plan views use hatching as appropriate to achieve better viewability. Such hatching is not necessarily related to materials or properties of the hatched objects or components. The sectional views may also omit components as appropriate to achieve better viewability.

1.1.4.1 Overview of Planar Layout

FIG. 3 is a plan view showing an exemplary planar layout of the memory cell array in the semiconductor memory device according to the first embodiment. What is shown in FIG. 3 covers a structural part corresponding to four blocks BLK0 to BLK3. As shown in FIG. 3, for example, the memory cell array 10 is, in one planar layout, partitioned into a memory area MA and hookup areas HA1 and HA2 in the X direction. The memory cell array 10 includes multiple members SLT and SHE.

The memory area MA is arranged between the hookup areas HA1 and HA2. The memory area MA includes multiple NAND strings NS. The hookup areas HA1 and HA2 are each used for forming connections between the row decoder module 15 and the stacked interconnects (e.g., the word lines WL0 to WL7 and the select gate lines SGD and SGS).

The multiple members SLT each have multiple portions (not illustrated) extending in the X direction, and are arranged in the Y direction. Each member SLT extends in the boundary part between the neighboring blocks BLK so as to traverse the memory area MA and the hookup areas HA1 and HA2 in the X direction. In an exemplary structure, each member SLT includes an embedded insulator and an embedded plate-shape contact. Also, each member SLT is provided together with later-described support pillars (not illustrated) so that the stacked interconnects are each split into portions next to each other via this member SLT.

The multiple members SHE each extend in the X direction and are arranged in the Y direction. In the example shown, four members SHE are provided between the members SLT, for each pair of the neighboring members SLT. Each member SHE traverses the memory area MA in the X direction. Here, the ends of each member SHE belong to the hookup areas HA1 and HA2, respectively. In an exemplary structure, each member SHE includes an embedded insulator. Also, each member SHE is provided so that the select gate line SGD is split into portions next to each other via this member SHE.

According to the planar layout of the memory cell array 10 described above, each region delimited by the members SLT corresponds to one respective block BLK. Also, each region delimited by applicable ones of the members SLT and SHE corresponds to one respective string unit SU. In one example, the memory cell array 10 repeats the layout as shown in FIG. 3 in the Y direction.

Note that the memory cell array 10 included in the semiconductor memory device 3 according to the embodiment is not limited to the exemplary planar layout described above. For example, the number of members SHE provided between the neighboring members SLT may be discretionarily set. The number of string units SU formed between the neighboring members SLT may be changed according to the number of members SHE provided between these members SLT.

1.1.4.2 Memory Area (Planar Layout)

Figure 4:
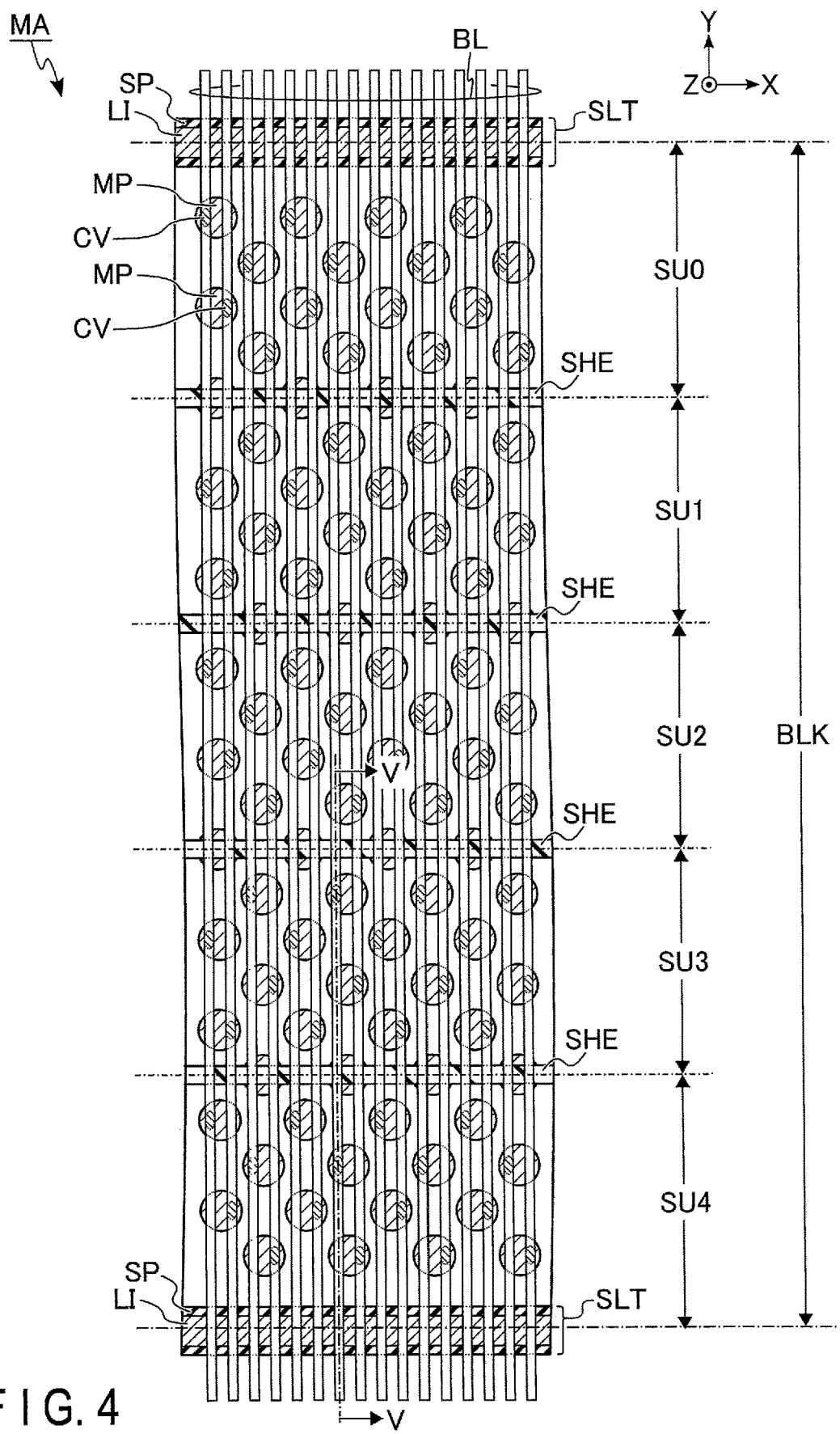
FIG. 4 is a plan view showing a detailed exemplary planar layout of the memory cell array, for its memory area, in the semiconductor memory device according to the first embodiment.

FIG. 4 is a plan view showing a detailed exemplary planar layout of the memory cell array, for its memory area MA, in the semiconductor memory device according to the first embodiment. What is shown in FIG. 4 covers one block BLK (i.e., string units SU0 to SU4) and two members SLT sandwiching the block BLK. As shown in FIG. 4, the memory cell array 10 in its memory area MA includes multiple memory pillars MP, multiple contacts CV, and multiple bit lines BL. Each member SLT includes a contact LI and spacers SP.

The memory pillars MP each function as, for example, an individual NAND string NS. These multiple memory pillars MP are arranged in, for example, twenty-four staggered rows between two neighboring members SLT. Here, in one example, the memory pillars MP in the fifth, tenth, fifteenth, and twentieth rows from the top (with reference to the figure) each overlap with one respective member SHE.

The multiple bit lines BL each extend in the Y direction, and are arranged in the X direction. Each bit line BL overlaps with at least one memory pillar MP for each string unit SU. In the example shown in FIG. 4, two bit lines BL overlap with one memory pillar MP. In the structure where multiple bit lines BL together overlap with one memory pillar MP, one of such bit lines BL and the corresponding memory pillar MP are electrically coupled to each other via the respective contact CV.

In one example, there is no contact CV between each memory pillar MP contacting with the member SHE and the bit lines BL. In other words, a contact CV to be provided between the memory pillar MP abutting two different select gate lines SGD and each bit line BL is omitted. The numbers or the layout of the memory pillars MP and the members SHE, arranged between the neighboring members SLT, or other components are not limited to the exemplary structure described with reference to FIG. 4, but may be discretionarily altered. The number of bit lines BL overlapping with each memory pillar MP may be discretionarily set.

The contact LI is a conductor extending along the X-Z plane. The spacers SP are each an insulator provided on the respective side face of the contact LI. As such, the contact LI is surrounded by the spacers SP in plan view.

(Sectional Structure)

Figure 5:
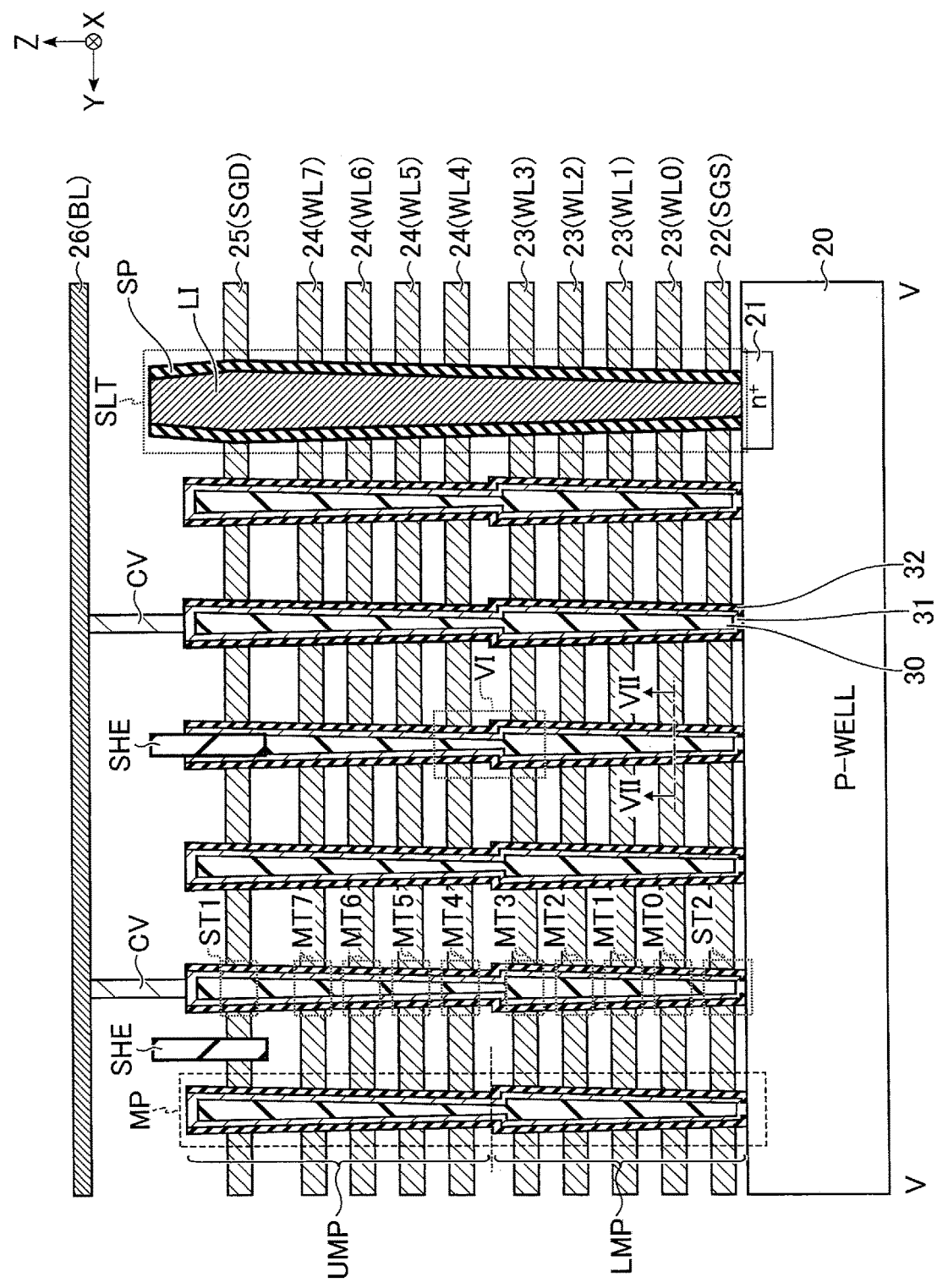
FIG. 5 is a sectional view taken along the line V-V indicated in FIG. 4 and shows an exemplary sectional structure of the memory cell array in the semiconductor memory device according to the first embodiment.

FIG. 5 is a sectional view taken along the line V-V indicated in FIG. 4 and shows an exemplary sectional structure of the memory cell array, for its memory area MA, in the semiconductor memory device according to the first embodiment. As shown in FIG. 5, the memory cell array 10 further includes a semiconductor substrate 20, and conductive layers 22 to 26. The description will also refer to FIG. 6, which is an enlarged view of the region VI indicated in FIG. 5 and which shows an exemplary sectional structure of one memory pillar in the semiconductor memory device according to the first embodiment.

The semiconductor substrate 20 has a P-type well region. The P-type well region constitutes a surface portion of the semiconductor substrate 20 and contains one or more P-type impurities (e.g., boron). There is an N-type semiconductor region 21 in the P-type well region. The N-type semiconductor region 21 is provided in the surface portion of the P-type well region and diffused with one or more N-type impurities. For example, phosphorus is doped in the N-type semiconductor region 21.

The conductive layer 22 is provided above the semiconductor substrate 20 via an intervening insulation layer (not illustrated). In one example, the conductive layer 22 is formed in a plate shape extending along the X-Y plane. The conductive layer 22 serves as the select gate line SGS. The conductive layer 22 contains, for example, tungsten.

Above the conductive layer 22, insulation layers (not illustrated) and the conductive layers 23 are alternately stacked. In one example, each conductive layer 23 is formed in a plate shape extending along the X-Y plane. These stacked conductive layers 23 serve as the word lines WL0 to WL3, respectively in the order from the side of the semiconductor substrate 20. The conductive layers 23 each contain, for example, tungsten.

Above the uppermost conductive layer 23, insulation layers (not illustrated) and the conductive layers 24 are alternately stacked. In one example, each conductive layer 24 is formed in a plate shape extending along the X-Y plane. These stacked conductive layers 24 serve as the word lines WL4 to WL7, respectively in the order from the side of the semiconductor substrate 20. The conductive layers 24 each contain, for example, tungsten.

The conductive layer 25 is provided above the uppermost conductive layer 24 via an intervening insulation layer (not illustrated). In one example, the conductive layer 25 is formed in a plate shape extending along the X-Y plane. The conductive layer 25 serves as the select gate line SGD. The conductive layer 25 contains, for example, tungsten.

The conductive layer 26 is provided above the conductive layer 25 via an intervening insulation layer (not illustrated). In one example, the conductive layer 26 is formed in a line shape extending in the Y direction and serves as the bit line BL. As such, there are multiple conductive layers 26 arranged along the X direction in the region not illustrated in the figure. Each conductive layer 26 contains, for example, copper.

Figure 6:
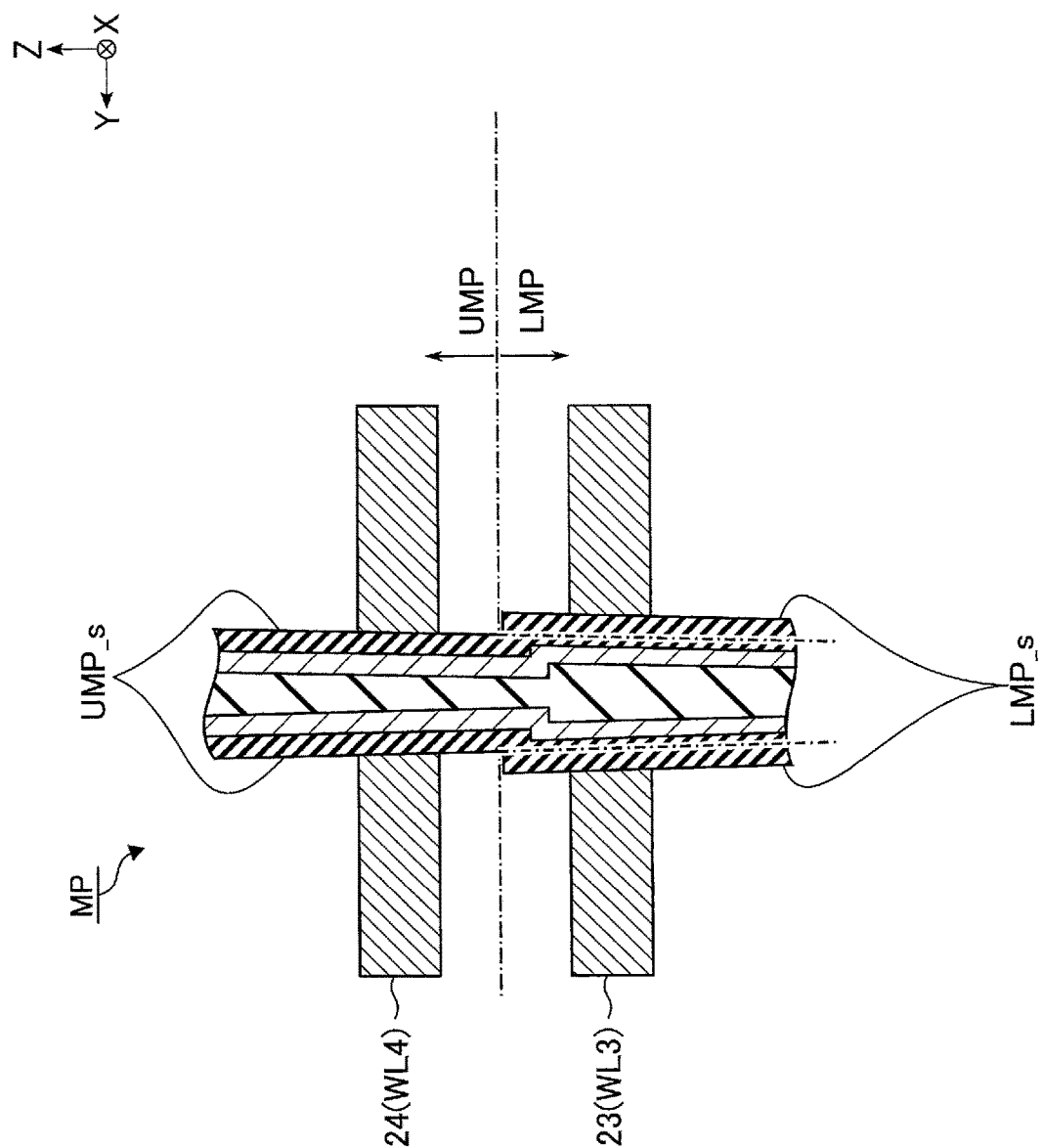
FIG. 6 is an enlarged view of the region VI indicated in FIG. 5 and shows an exemplary sectional structure of the memory cell array in the semiconductor memory device according to the first embodiment.

The memory pillars MP each extend in the Z direction and each include an upper pillar UMP and a lower pillar LMP. The lower pillar LMP penetrates through the conductive layers 22 and 23. The upper pillar UMP penetrates through the conductive layers 24 and 25. The lower pillar LMP has its lower end in contact with the P-type well region. The upper end of the lower pillar LMP and the lower end of the upper pillar UMP contact each other at a level between the uppermost conductive layer 23 and the lowermost conductive layer 24. Each of the lower pillar LMP and the upper pillar UMP increases the area of the cross-section taken along the X-Y plane (hereinafter, an "X-Y sectional area"), from the lower portion toward the upper portion. The X-Y sectional area of the lower pillar LMP at its upper end is larger than the X-Y sectional area of the upper pillar UMP at its lower end. The lower pillar LMP has a side face LMP_s and the upper pillar UMP has a side face UMP_s, the former and the extension of the latter (indicated by the dashed-dotted lines in FIG. 6) being displaced from each other and not in conformity to each other. Such a displacement between the side face LMP_s of the lower pillar LMP and the extension of the side face UMP_s of the upper pillar UMP is present not only in the cross-section along the Y-Z plane ("Y-Z cross-section") as shown in FIG. 6 but also in any cross-section based on directions that includes the Z direction.

A portion where the memory pillar MP and the conductive layer 22 intersect each other functions as the select transistor ST2. A portion where the memory pillar MP and one conductive layer 23 or one conductive layer 24 intersect each other functions as one memory cell transistor MT. A portion where the memory pillar MP and the conductive layer 25 intersect each other functions as the select transistor ST1.

The memory pillars MP each include, for example, a core film 30, a semiconductor film 31, and a lamination film 32. The core film 30 extends in the Z direction. In one example, the core film 30 has its upper end located at the level of a layer higher than the conductive layer 25, and its lower end located at the level of a layer higher than the P-type well region. The semiconductor film 31 surrounds the core film 30. A part of the semiconductor film 31 contacts the P-type well region at the lower end of the memory pillar MP. The lamination film 32 covers the side and bottom faces of the semiconductor film 31, except for the portion of the semiconductor film 31 in contact with the P-type well region. The core film 30 contains, for example, an insulator made of silicon oxide, etc. The semiconductor film 31 contains, for example, silicon.

The contact CV, which may be of a columnar shape, is provided on the upper face of the semiconductor film 31 disposed in the memory pillar MP. In the exemplary structural part shown in the figure, there are two memory pillars MP in each of the sectional regions delimited by the members SLT and SHE, with one contact CV corresponding to one of these two memory pillars MP. In the memory area MA, the memory pillars MP that do not overlap with the member SHE and that are shown without a connected contact CV in the figure are also connected with the respective, corresponding contacts CV in the region not illustrated in the figure.

Each contact CV is connected with, at its upper face, one conductive layer 26, i.e., one bit line BL. One conductive layer 26 is connected with one contact CV for each of the regions delimited by the members SLT and SHE. As such, each conductive layer 26 is electrically coupled to the memory pillar MP provided between the neighboring SLT and SHE, and also to the memory pillar MP provided between the two neighboring members SHE.

The member SLT includes, for example, a portion formed along the X-Z plane so that it splits the conductive layers 22 to 25. The Y-Z cross-section of the member SLT has, for example, a bowing shape. More specifically, the member SLT has different Y-direction lengths, with the minimum length at the upper or the lower end and the maximum length at the given part between the upper and the lower ends.

The contact LI in the member SLT is provided along the spacers SP. The contact LI has its upper end located in the layer between the conductive layers 25 and 26. The lower end of the contact LI is in contact with the N-type semiconductor region 21. The spacers SP are each disposed between the contact LI and the conductive layers 22 to 25. By the presence of the spacers SP, the contact LI is separated and insulated from the conductive layers 22 to 25.

The member SHE includes, for example, a portion formed along the X-Z plane so that it splits the conductive layer 25. The member SHE has its upper end located in the layer between the conductive layers 25 and 26. The lower end of the member SHE is located in the layer between the conductive layers 24 and 25. The member SHE contains, for example, an insulator made of silicon oxide, etc. The upper end of the member SHE and the upper end of the member SLT may be either at the same level or at levels different from each other. Also, the upper end of the member SHE and the upper end of the memory pillar MP may be either at the same level or at levels different from each other. Note also that the number of the conductive layers 22 to 25 may be discretionarily set. For example, a multiple of the conductive layers 25 may be provided, in which case the lower end of the member SHE is located in the layer between the uppermost conductive layer 24 and the lowermost conductive layer 25. Thus, the location of the lower end of the member SHE deepens according to the increase in number of the conductive layers 25.

Figure 7:
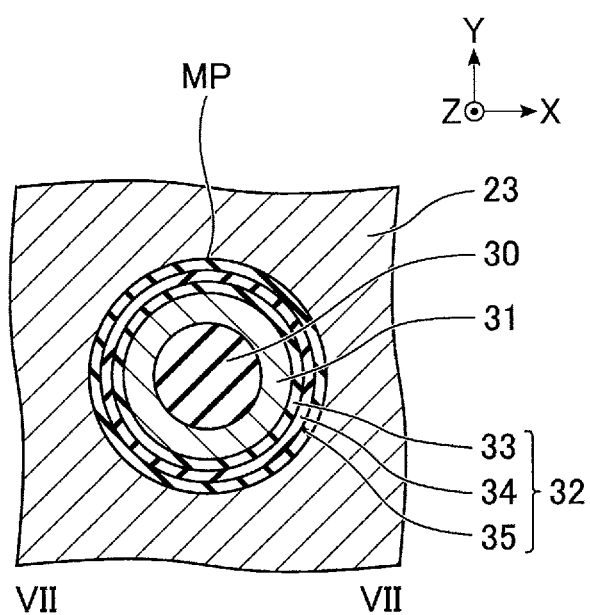
FIG. 7 is a sectional view taken along the line VII-VII indicated in FIG. 5 and shows an exemplary sectional structure of a memory pillar in the semiconductor memory device according to the first embodiment.

FIG. 7 is a sectional view taken along the line VII-VII indicated in FIG. 5 and shows an exemplary sectional structure of the memory pillar in the semiconductor memory device according to the first embodiment. More specifically, what is shown in FIG. 7 is a sectional structure of the memory pillar MP at the level of a layer parallel to the surface of the semiconductor substrate 20 and which includes the conductive layer 23. As shown in FIG. 7, the lamination film 32 includes, for example, a tunnel insulation film 33, a charge accumulation film 34, and a block insulation film 35.

In the cross-section embracing the conductive layer 23, the core film 30 is at, for example, the central part of the memory pillar MP. The semiconductor film 31 surrounds the side face of the core film 30. The tunnel insulation film 33 surrounds the side face of the semiconductor film 31. The charge accumulation film 34 surrounds the side face of the tunnel insulation film 33. The block insulation film 35 surrounds the side face of the charge accumulation film 34. The conductive layer 23 surrounds the side face of the block insulation film 35.

The semiconductor film 31 serves as a channel (current path) for the memory cell transistors MT0 to MT7 and the select transistors ST1 and ST2. The tunnel insulation film 33 and the block insulation film 35 both contain, for example, silicon oxide. The charge accumulation film 34 has a function of accumulating electric charges and contains, for example, silicon nitride. With these components, the memory pillars MP are each capable of functioning as one NAND string NS.

In the semiconductor memory device 3 according to the first embodiment, a voltage application to the lowermost conductive layer 22 can, in the near-surface portion across the P-type well region and the N-type semiconductor region 21, form a current path between the semiconductor film 31 in the memory pillar MP and the contact LI. This enables the semiconductor memory device 3 to cause a current flow between the bit line BL and the contact LI via the memory pillar MP. That is, the contact LI in the member SLT may be utilized as a part of the source line SL.

1.1.4.3 Hookup Area (Planar Layout)

In the semiconductor memory device 3 according to the first embodiment, an even-numbered block BLK in the hookup area HA1 and an odd-numbered block BLK in the hookup area HA2 are similar in structure. Also, an even-numbered block BLK in the hookup area HA2 and an odd-numbered block BLK in the hookup area HA1 are similar in structure.

In more concrete terms, for example, the block BLK0 in the hookup area HA2 has a planar layout similar to a reverse layout of the block BLK1 in the hookup area HA1 in which the structures of the block BLK1 are turned over in each of the X and Y directions. The block BLK1 in the hookup area HA2 has a planar layout similar to a reverse layout of the block BLK0 in the hookup area HA1 in which the structures of the block BLK0 are turned over in each of the X and Y directions. For the first embodiment, the description will denote an even-numbered block BLK by reference sign "BLKe", and an odd-numbered block BLK by reference sign "BLKo".

Figure 8:
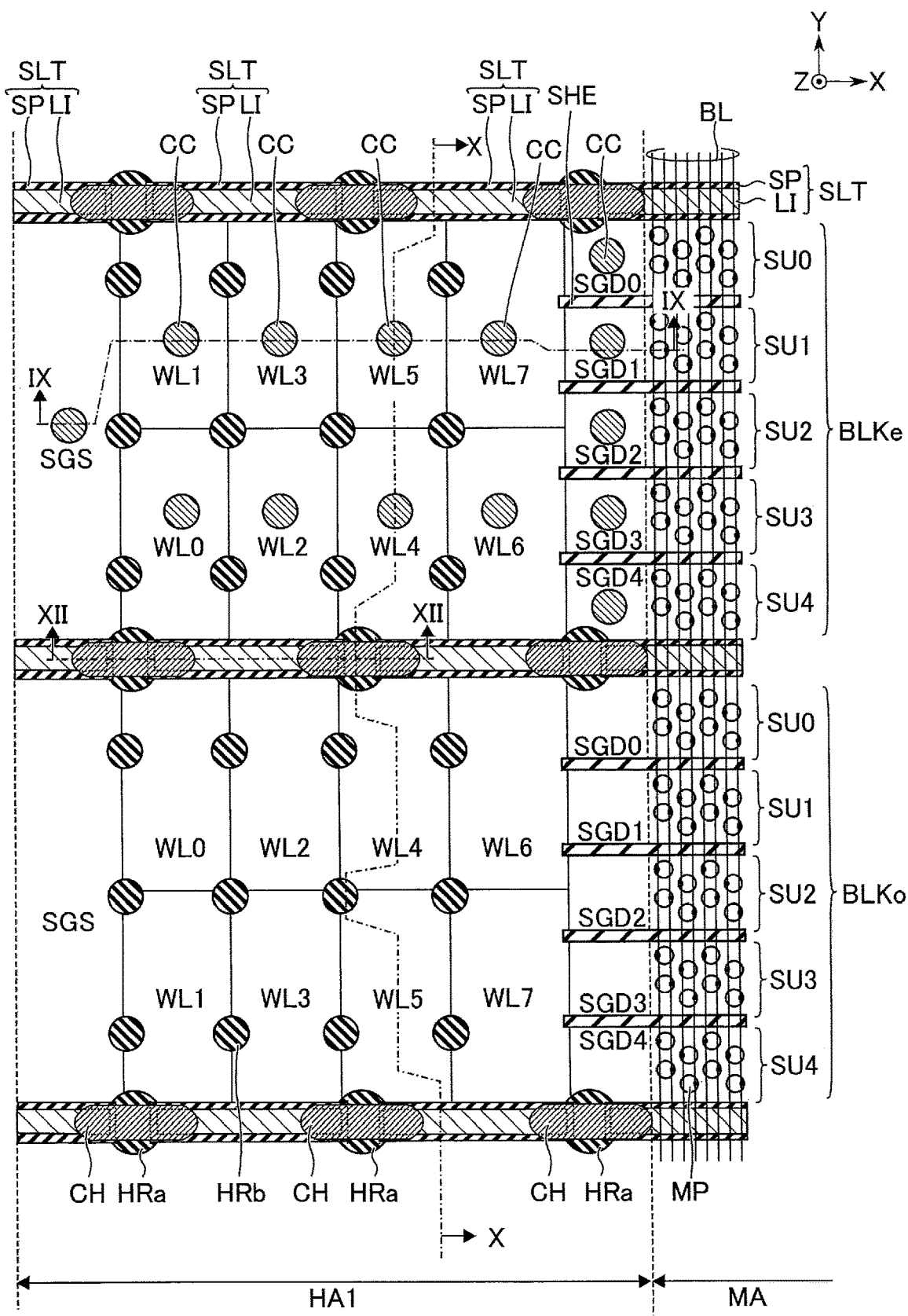
FIG. 8 is a plan view showing a detailed exemplary planar layout of the memory cell array, for its hookup area, in the semiconductor memory device according to the first embodiment.

FIG. 8 is a plan view showing a detailed exemplary planar layout of the memory cell array, for its hookup area, in the semiconductor memory device according to the first embodiment. What is shown in FIG. 8 covers structural portions corresponding to the neighboring blocks BLKe and BLKo in the hookup area HA1, and also a part of the nearby memory area MA. An explanation will be given of a planar layout of the blocks BLK in the hookup areas HA1 and HA2, with reference to the planar layout of the blocks BLKe and BLKo in the hookup area HA1 shown in FIG. 8.

As shown in FIG. 8, the select gate line SGS, the word lines WL0 to WL7, and the select gate lines SGD in the hookup area HA1 each include a portion (terrace portion) that does not overlap with the upper interconnect layers (conductive layers) of the stacked interconnects. Also, the memory cell array 10 in its hookup area HA1 includes multiple contacts CC, multiple bridging interconnect layers CH, and multiple support pillars HRa and HRb.

In the hookup area HA1, each portion not overlapping with the upper interconnect layers has a shape that resembles a step, a terrace, a rimstone, or the like. More specifically, there is a difference in level between the select gate line SGS and the word line WL0, between the word line WL0 and the word line WL1, . . . , between the word line WL6 and the word line WL7, and between the word line WL7 and the select gate line SGD. FIG. 8 shows an example where the end portions of the word lines WL0 to WL7 are together formed in a double-row staircase shape having one difference in level in the Y direction and multiple differences in level in the X direction.

In a region of overlap between the hookup area HA1 and the block BLKe, the multiple contacts CC are provided on the respective terrace portions of the select gate line SGS, the word lines WL0 to WL7, and the select gate lines SGD0 to SGD4. Meanwhile, in a region of overlap between the hookup area HA1 and the block BLKo, multiple contacts CC for the stacked interconnects are omitted.

On the other hand, while not covered by the illustration, in a region of overlap between the hookup area HA2 and the block BLKo, the multiple contacts CC are provided on the respective terrace portions of the select gate line SGS, the word lines WL0 to WL7, and the select gate lines SGD0 to SGD4. Also, in a region of overlap between the hookup area HA2 and the block BLKe, multiple contacts CC for the stacked interconnects are omitted.

The select gate line SGS, the word lines WL0 to WL7, and the select gate lines SGD0 to SGD4 are electrically coupled to the row decoder module 15 via the respective corresponding contacts CC. In other words, voltage application is performed for each of the select gate line SGS, the word lines WL0 to WL7, and the select gate lines SGD0 to SGD4 via, for example, the contact CC provided in either of the hookup area HA1 or the hookup area HA2. Note that each interconnect layer may be provided with a contact CC in both the hookup area HA1 and the hookup area HA2. In such a structure, voltages are applied to, for example, a word line WL from both of the contact CC in the hookup area HA1 and the contact CC in the hookup area HA2.

In the hookup areas HA1 and HA2, the multiple support pillars HRa are arranged in the boundary part between two neighboring blocks BLK. Each member SLT is divided into multiple portions by at least one support pillar HRa. In the example shown in FIG. 8, three support pillars HRa are provided for one member SLT so that this member SLT is divided into four portions. Note that three support pillars HRa are likewise arranged in the non-illustrated hookup area HA2. As such, the member SLT, including the non-illustrated part, is divided into seven portions. The support pillar HRa has a length in the Y direction that is greater than the Y-direction width of the member SLT. The support pillars HRa arranged in the respective two boundary parts sandwiching the block BLK are located at the positions equivalent to each other with respect to the X direction.

Each support pillar HRa is in contact with the spacers SP of the respective two portions of the member SLT that sandwich the support pillar HRa. The contacts LI in the respective two portions of the member SLT that sandwich the support pillar HRa are electrically coupled with each other via the bridging interconnect layer CH formed above the support pillar HRa.

In the hookup areas HA1 and HA2, the multiple support pillars HRb are suitably arranged in the regions excluding the positions where the members SLT and the support pillars HRa are formed and the positions where the contacts CC are formed.

(Sectional Structure)

Figure 9:
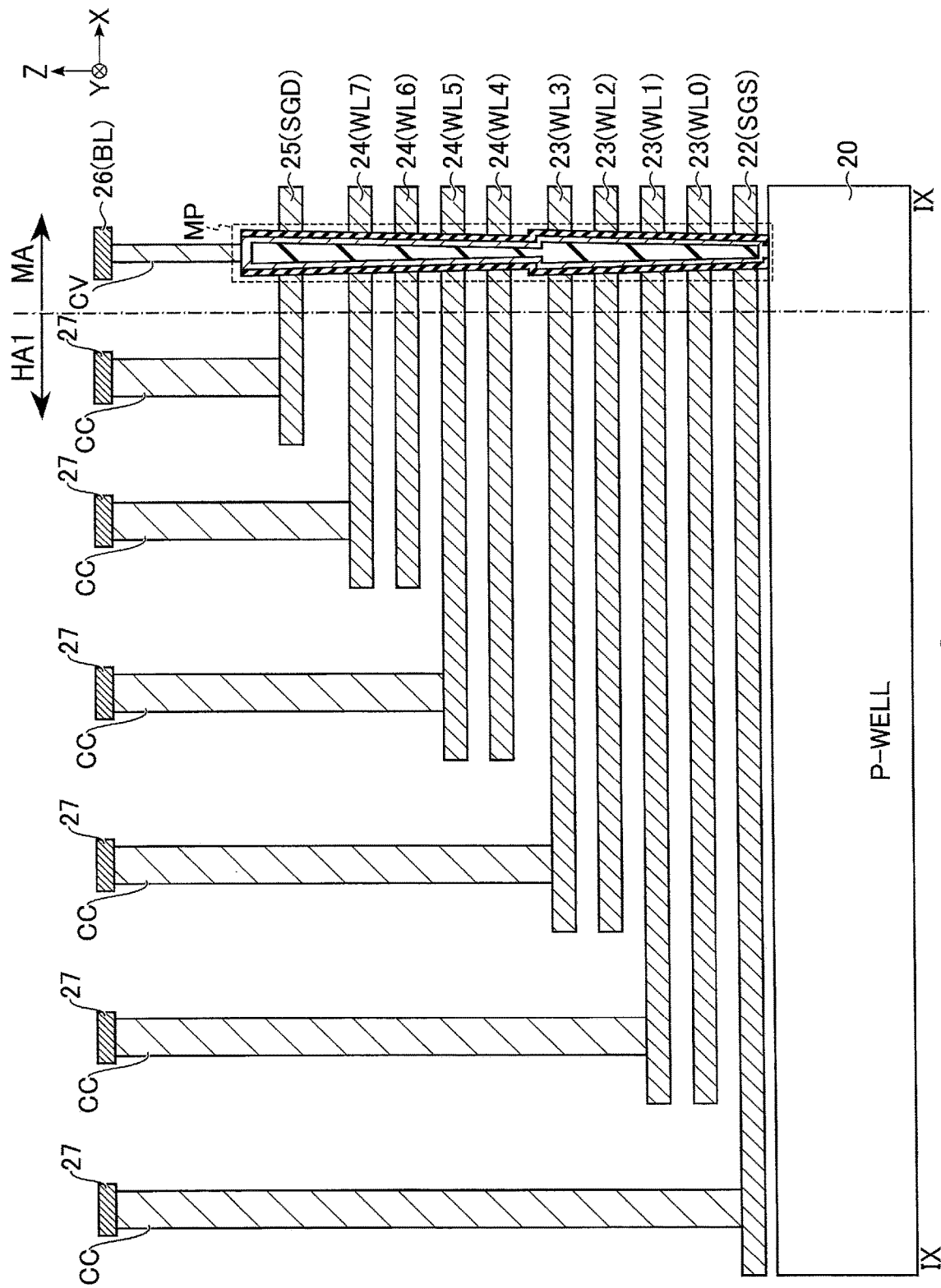
FIG. 9 is a sectional view taken along the line IX-IX indicated in FIG. 8 and shows an exemplary sectional structure of the memory cell array, for its hookup area, in the semiconductor memory device according to the first embodiment.
Figure 10:
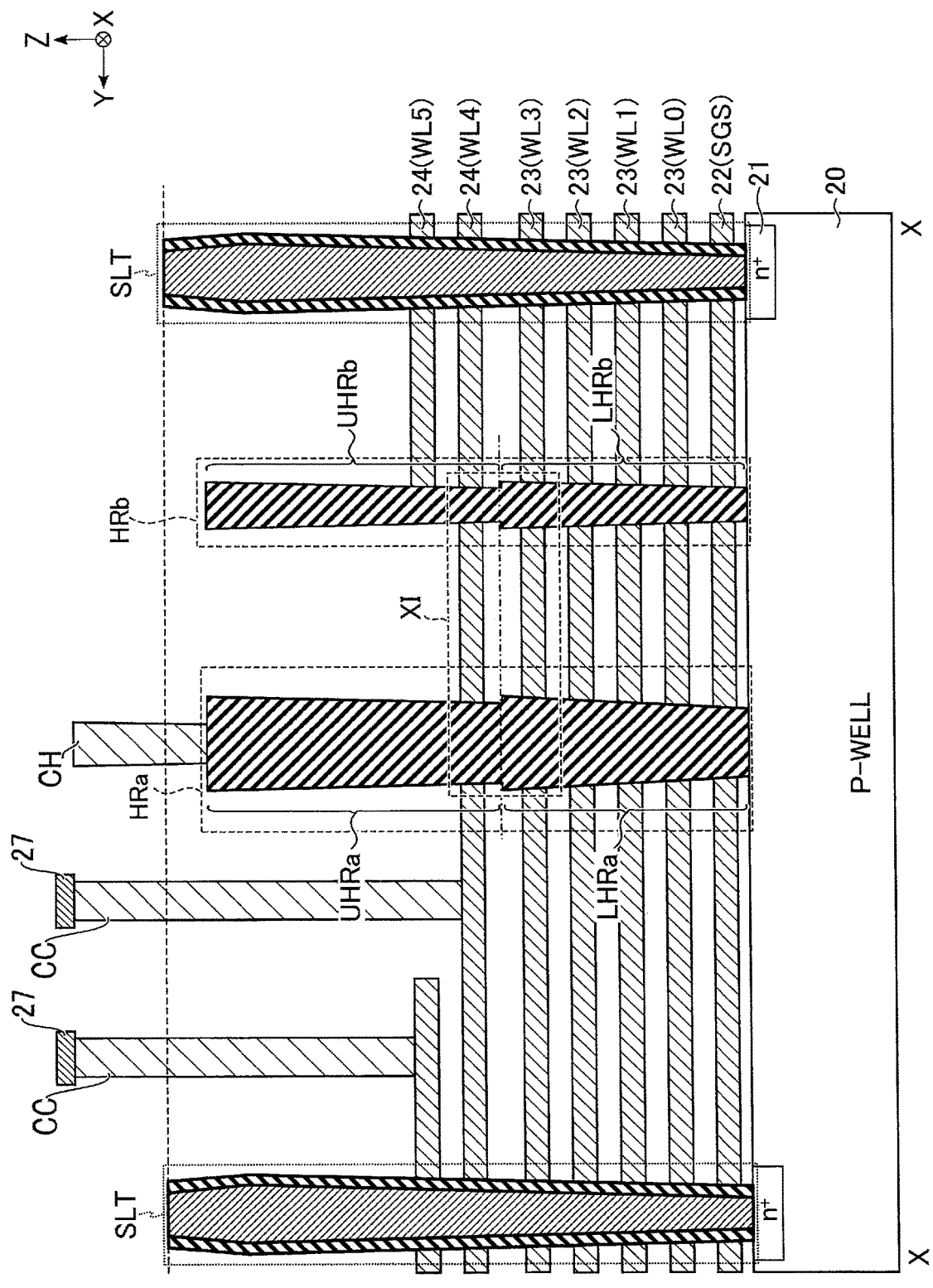
FIG. 10 is a sectional view taken along the line X-X indicated in FIG. 8 and shows an exemplary sectional structure of the memory cell array, for its hookup area, in the semiconductor memory device according to the first embodiment.
Figure 11:
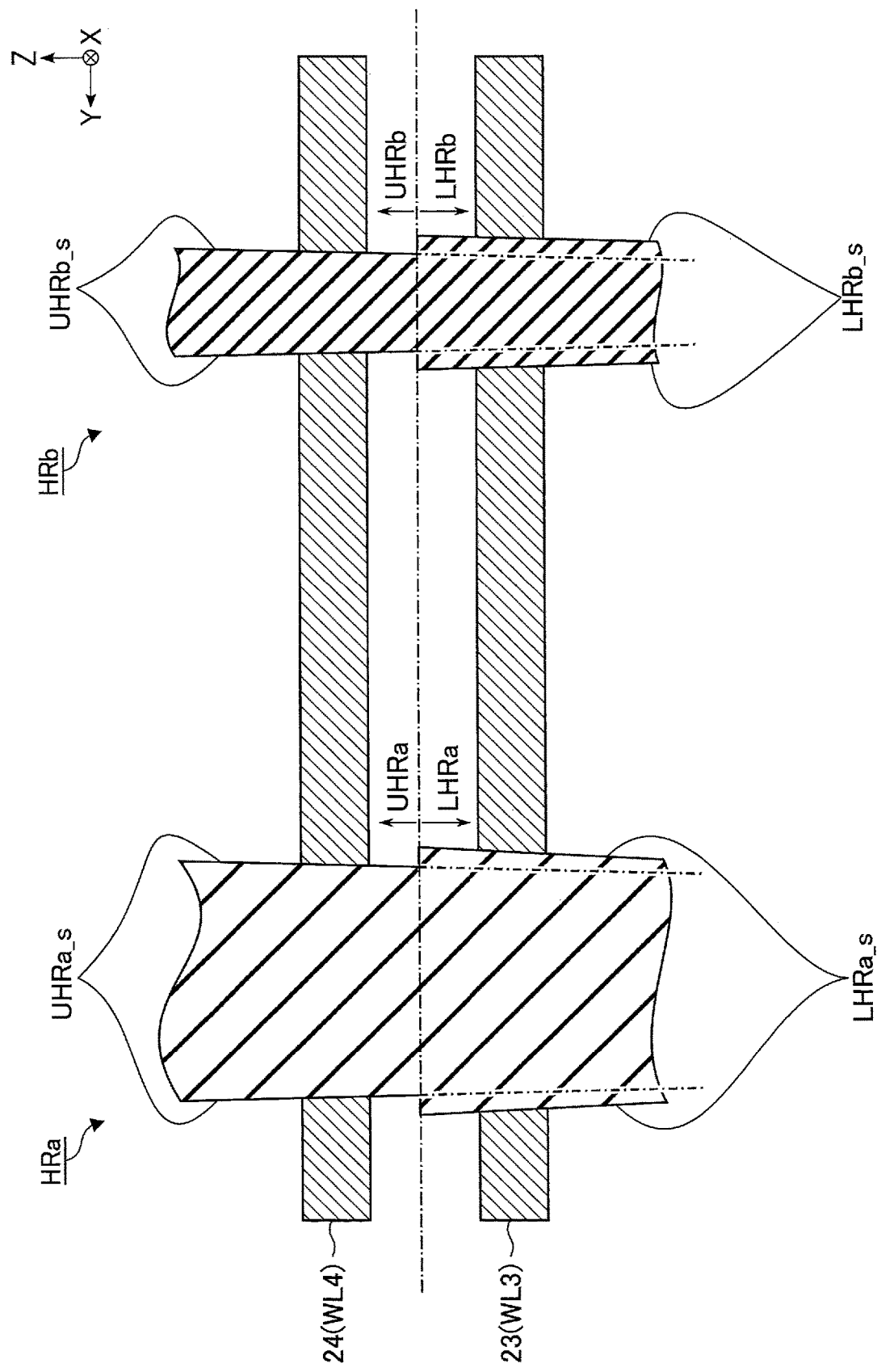
FIG. 11 is an enlarged view of the region XI indicated in FIG. 10 and shows an exemplary sectional structure of the memory cell array, for its hookup area, in the semiconductor memory device according to the first embodiment.

FIGS. 9, 10, 11, and 12 show exemplary sectional structures of the memory cell array, for its hookup area, in the semiconductor memory device according to the first embodiment. FIG. 9 is a sectional view taken along the line IX-IX indicated in FIG. 8. FIG. 10 is a sectional view taken along the line X-X indicated in FIG. 8. FIG. 11 is an enlarged view of the region XI indicated in FIG. 10. FIG. 12 is a sectional view taken along the line XII-XII indicated in FIG. 8.

As shown in FIG. 9, the memory cell array 10 in its hookup area HA1 further includes multiple conductive layers 27. The end portion of the conductive layer 22 corresponding to the select gate line SGS, the end portions of the multiple conductive layers 23 and 24 corresponding to the word lines WL, and the end portion of the conductive layer 25 corresponding to the select gate line SOD are formed in a staircase shape.

The multiple contacts CC are provided on the respective terrace portions of the select gate line SGS, the word lines WL0 to WL7, and the select gate lines SGD. The top of each contact CC is provided with one conductive layer 27. Each conductive layer 27 is electrically coupled with the row decoder module 15 and located, for example, at the level of a layer same as the conductive layer 26. Accordingly, each of the conductive layers 22 to 25 is electrically coupled with the row decoder module 15 via the corresponding contact CC and conductive layer 27. Here, each of the conductive layers 22 to 25 may be electrically coupled with the row decoder module 15 using a further intervening connection by one or more conductive layers (not illustrated) provided at the level higher than the conductive layers 27.

Referring to FIG. 10, in each of the hookup areas HA1 and HA2, the multiple interconnect layers (more specifically, the conductive layer 24 corresponding to the word line WL4 and the conductive layer 24 corresponding to the word line WL5, for example) are formed in a shape having steps along the Y direction. As such, the structure of the stacked interconnects for each block BLK in the hookup areas HA1 and HA2 has a Y-Z cross-section asymmetric with respect to the central axis extending along the Z direction.

As understood from the above description, the bridging interconnect layer CH may be formed directly above the corresponding support pillar HRa. The bridging interconnect layer CH is arranged in such a manner as to overlap with an end of each of the two portions of the member SLT, which are separated by the support pillar HRa and located on the respective sides of this support pillar HRa. In an example, the bridging interconnect layer CH has a lower end constituted by a portion matching the upper end of the contact LI disposed in the member SLT, and a portion matching the upper end of the support pillar HRa. Such a lower end of the bridging interconnect layer CH contacts with the upper ends of the respective contacts LI disposed in the two portions of the divided member SLT, located on the respective sides of the support pillar HRa. Note that the lower end of the bridging interconnect layer CH may be either in contact with or separate from the upper end of the support pillar HRa.

As shown in FIGS. 10 to 12, the support pillars HRa and HRb each have a structure in which an insulator fills the hole extending in the Z direction. The support pillars HRa and HRb each penetrate through the stacked interconnects.

The support pillar HRa includes an upper pillar UHRa and a lower pillar LHRa. The lower pillar LHRa has its lower end in contact with the P-type well region. The upper end of the lower pillar LHRa and the lower end of the upper pillar UHRa contact each other at a level between the uppermost conductive layer 23 and the lowermost conductive layer 24. The lower pillar LHRa and the upper pillar UHRa increase their respective X-Y sectional areas from the lower portion toward the upper portion.

Also, the X-Y sectional area of the lower pillar LHRa at its upper end is larger than the X-Y sectional area of the upper pillar UHRa at its lower end. More specifically, the upper end of the lower pillar LHRa is longer in the Y direction than the lower end of the upper pillar UHRa. The lower pillar LHRa has a side face LHRa_s and the upper pillar UHRa has a side face UHRa_s, and the former and the extension of the latter (indicated by the dashed-dotted lines in FIG. 11) are displaced from each other, thus not in conformity to each other, in the Y-Z cross-section. However, the upper end of the lower pillar LHRa and the lower end of the upper pillar UHRa have substantially the same length in the X direction. The side face LHRa_s of the lower pillar LHRa and the extension of the side face UHRa_s of the upper pillar UHRa are in conformity to each other in the X-Z cross-section.

The support pillar HRb includes an upper pillar UHRb and a lower pillar LHRb. The lower pillar LHRb has its lower end in contact with the P-type well region. The upper end of the lower pillar LHRb and the lower end of the upper pillar UHRb contact each other at a level between the uppermost conductive layer 23 and the lowermost conductive layer 24. The boundary between the upper end of the lower pillar LHRb and the lower end of the upper pillar UHRb is at the same level as the boundary between the upper end of the lower pillar LHRa and the lower end of the upper pillar UHRa. Each of the lower pillar LHRb and the upper pillar UHRb increases the area of the cross-section taken along the X-Y plane (X-Y sectional area), from the lower portion toward the upper portion. The X-Y sectional area of the lower pillar LHRb at its upper end is larger than the X-Y sectional area of the upper pillar UHRb at its lower end. Accordingly, the side face LHRb_s of the lower pillar LHRb is displaced from the extension of the side face UHRb_s of the upper pillar UHRb (indicated by the dashed-dotted lines in FIG. 11), and the two are not in conformity. Such a displacement between the side face LHRb_s of the lower pillar LHRb and the extension of the side face UHRb_s of the upper pillar UHRb is present not only in the Y-Z cross-section as shown in FIG. 11 but also in any cross-section based on directions that includes the Z direction.

1.2 Method for Manufacturing Semiconductor Memory Device

FIG. 13 is a flowchart showing an exemplary method for manufacturing the semiconductor memory device according to the first embodiment. FIGS. 14 to 24 each show an exemplary planar layout or an exemplary sectional structure taken during the manufacture of the semiconductor memory device according to the first embodiment. Here, the planar layouts illustrated in the figures each represent the structural part corresponding to FIG. 8. The sectional structures illustrated in the figures, except for FIG. 21, each represent the combination of the structural part corresponding to FIG. 10 and a part of the memory area MA. The sectional structures illustrated in FIG. 21 each represent the structural part corresponding to FIG. 12. As shown in FIG. 13, a process of manufacturing the semiconductor memory device 3 according to the first embodiment proceeds in an orderly manner with processing steps S101 to S112. Explained below with reference to FIG. 13 is one example of the manufacturing process for the stacked interconnect structure in the memory cell array 10 of the semiconductor memory device 3.

Figure 14:
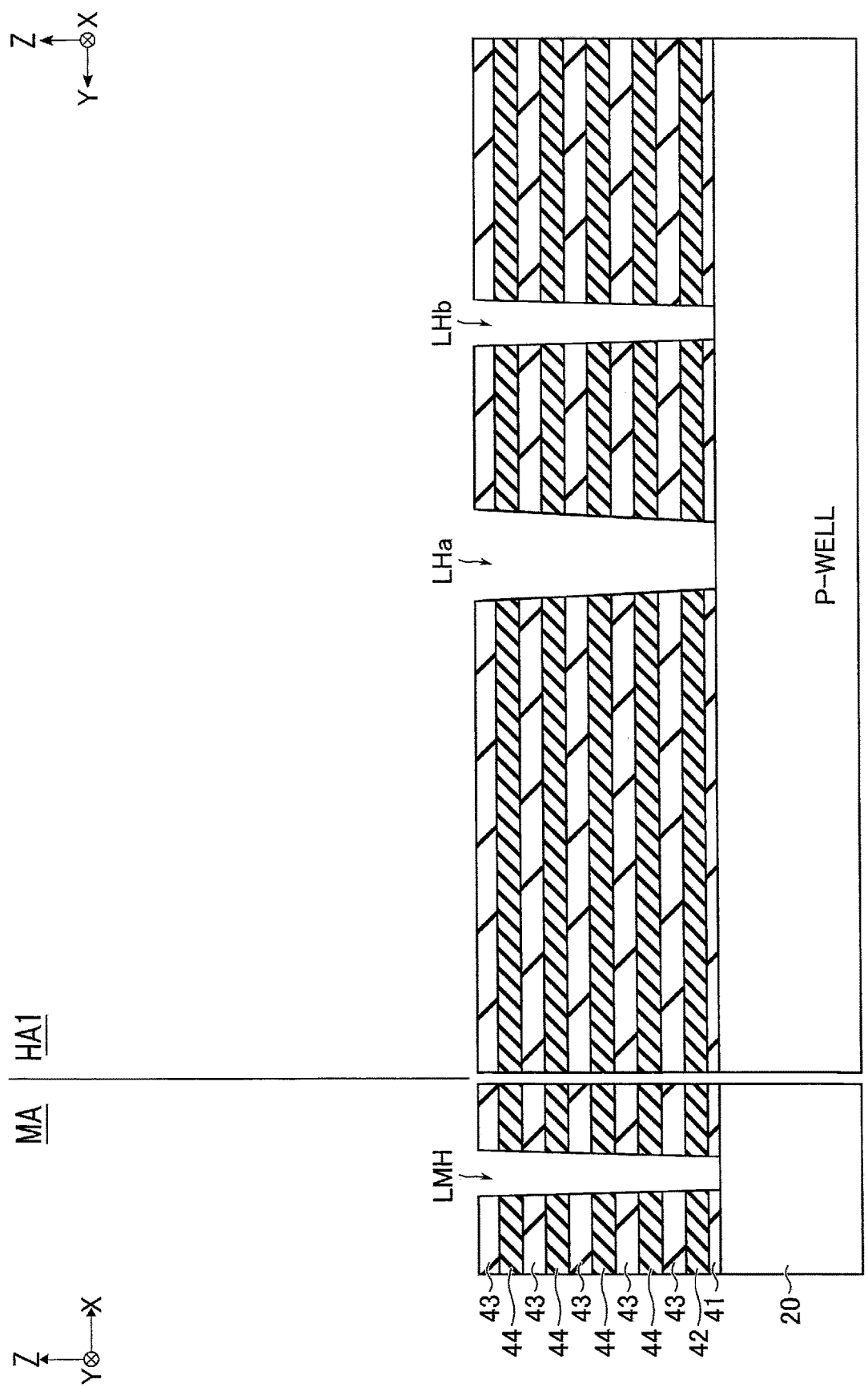
FIG. 14 is a sectional view showing an exemplary sectional structure taken during the manufacture of the semiconductor memory device according to the first embodiment.

First, processing steps S101 to S103 are sequentially conducted so that a lower stack structure including sacrificial members 42 and 44 is formed, a staircase structure of the lower stack structure is formed, and multiple holes LMH, LHa, and LHb are formed, as shown in FIG. 14.

The processing steps will be briefly explained. The processing starts with the formation of an insulation layer 41 on the semiconductor substrate 20. A sacrificial member 42 and an insulation layer 43 are formed in this order on the insulation layer 41. Sacrificial members 44 and insulation layers 43 are further alternately stacked on the formed insulation layer 43 (S101).

In each of the hookup areas HA1 and HA2, end portions of the stacked sacrificial members 42 and 44 are processed into a staircase shape. Then, the space due to the staircase portion in each of the hookup areas HA1 and HA2 is filled with an insulation layer. The upper face of the stack structure is subjected to, for example, chemical mechanical polishing (CMP) to be flattened (S102).

Subsequently, a mask that opens in portions corresponding to the lower pillars LMP, LHRa, and LHRb is formed by photolithography or the like. Then, anisotropic etching is performed with the mask so that the holes LMH, LHa, and LHb, penetrating through, for example, each of the insulation layers 41 and 43 and the sacrificial members 42 and 44, are formed. At the bottom of each of the holes LMH, LHa, and LHb, the P-type well region of the semiconductor substrate 20 is partially exposed (S103). The holes LMH, LHa, and LHb correspond to the lower pillars LMP, LHRa, and LHRb, respectively. The holes LMH, LHa, and LHb are then each filled with a sacrificial member 45, which may be seen from FIG. 15. The sacrificial member 45 formed on the upper face of the stack structure is removed by, for example, CMP so that the faces corresponding to the respective upper ends of the lower pillars LMP, LHRa, and LHRb are exposed.

Figure 15:
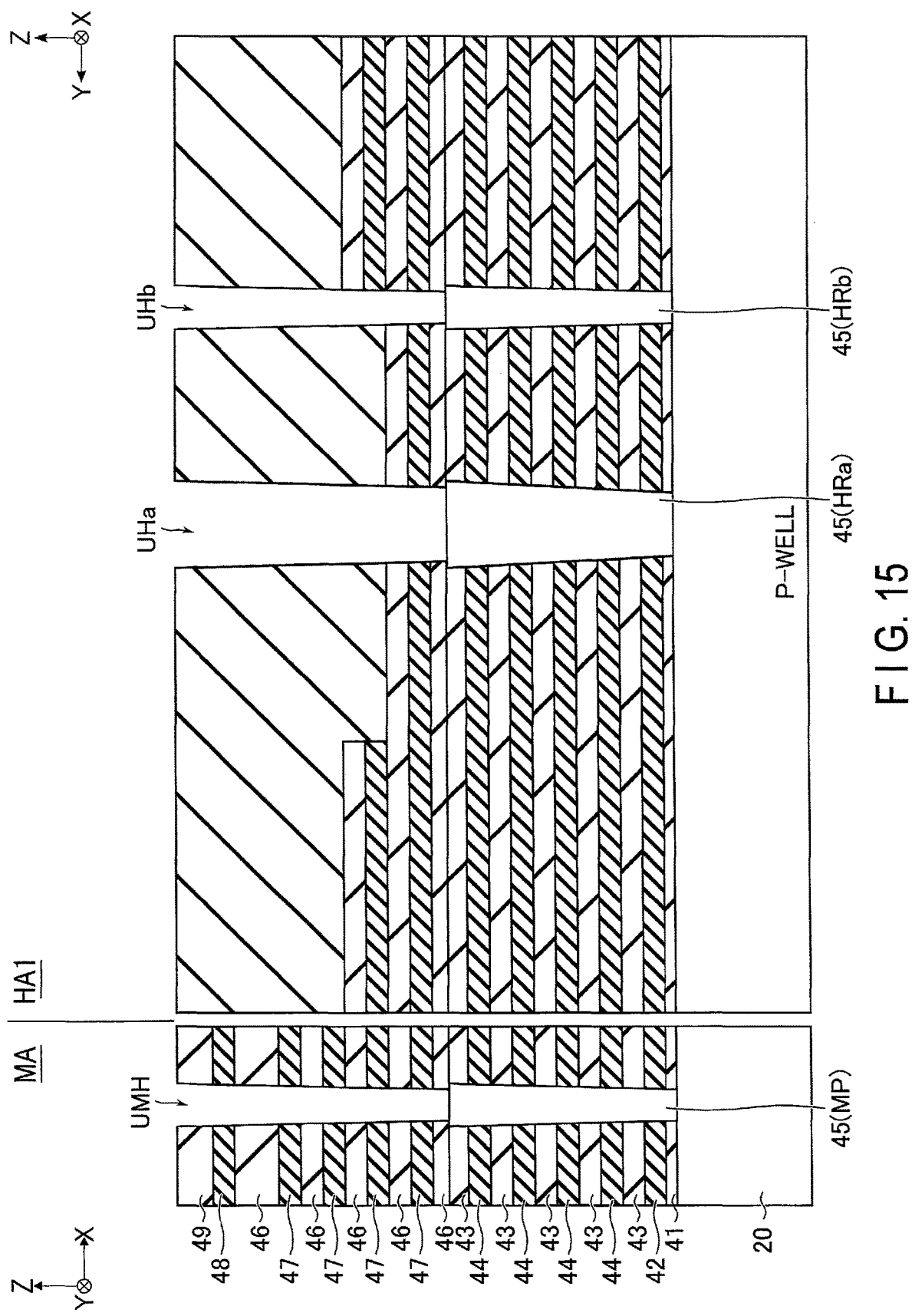
FIG. 15 is a sectional view showing an exemplary sectional structure taken during the manufacture of the semiconductor memory device according to the first embodiment.
Figure 16:
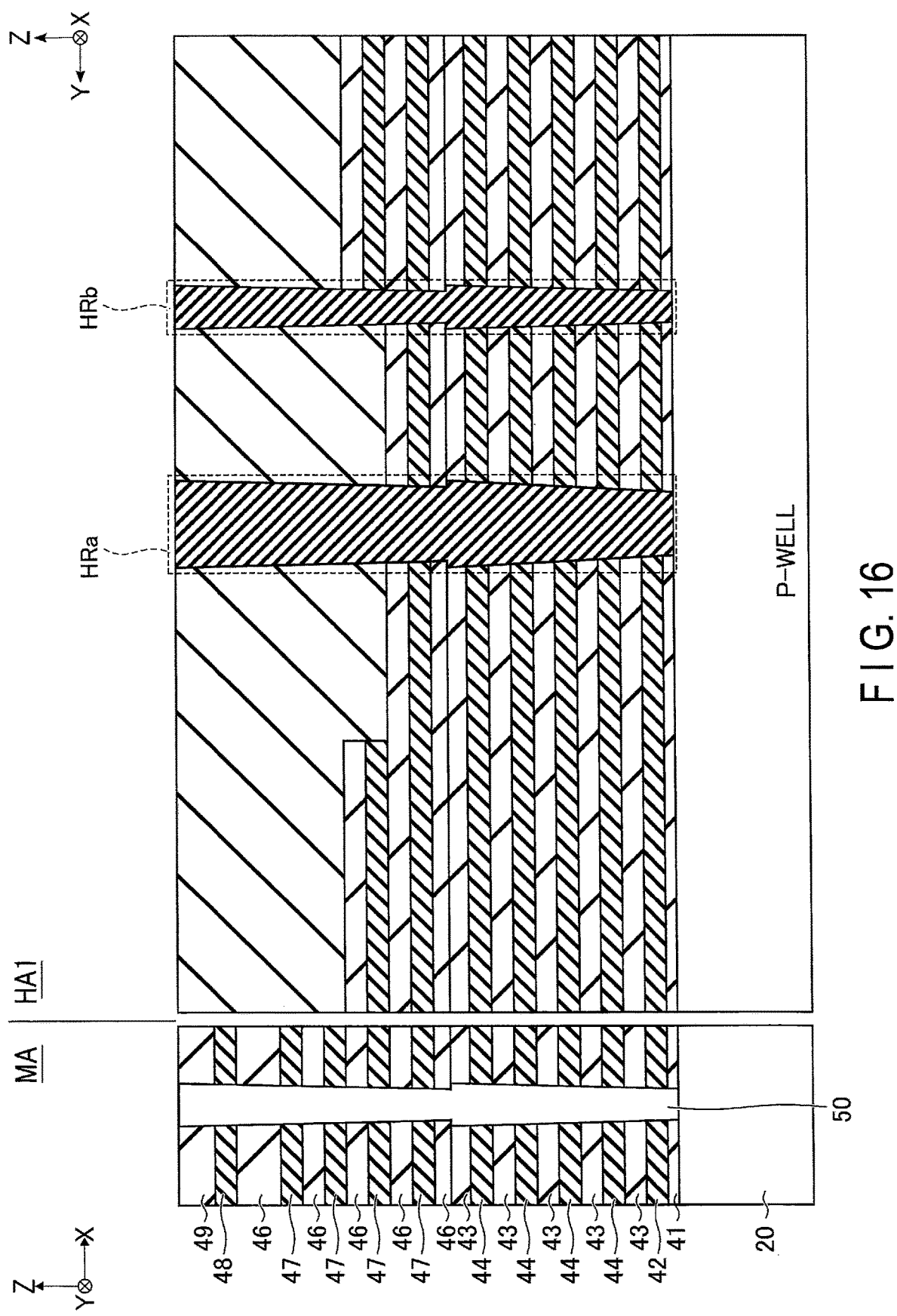
FIG. 16 is a sectional view showing an exemplary sectional structure taken during the manufacture of the semiconductor memory device according to the first embodiment.
Figure 17:
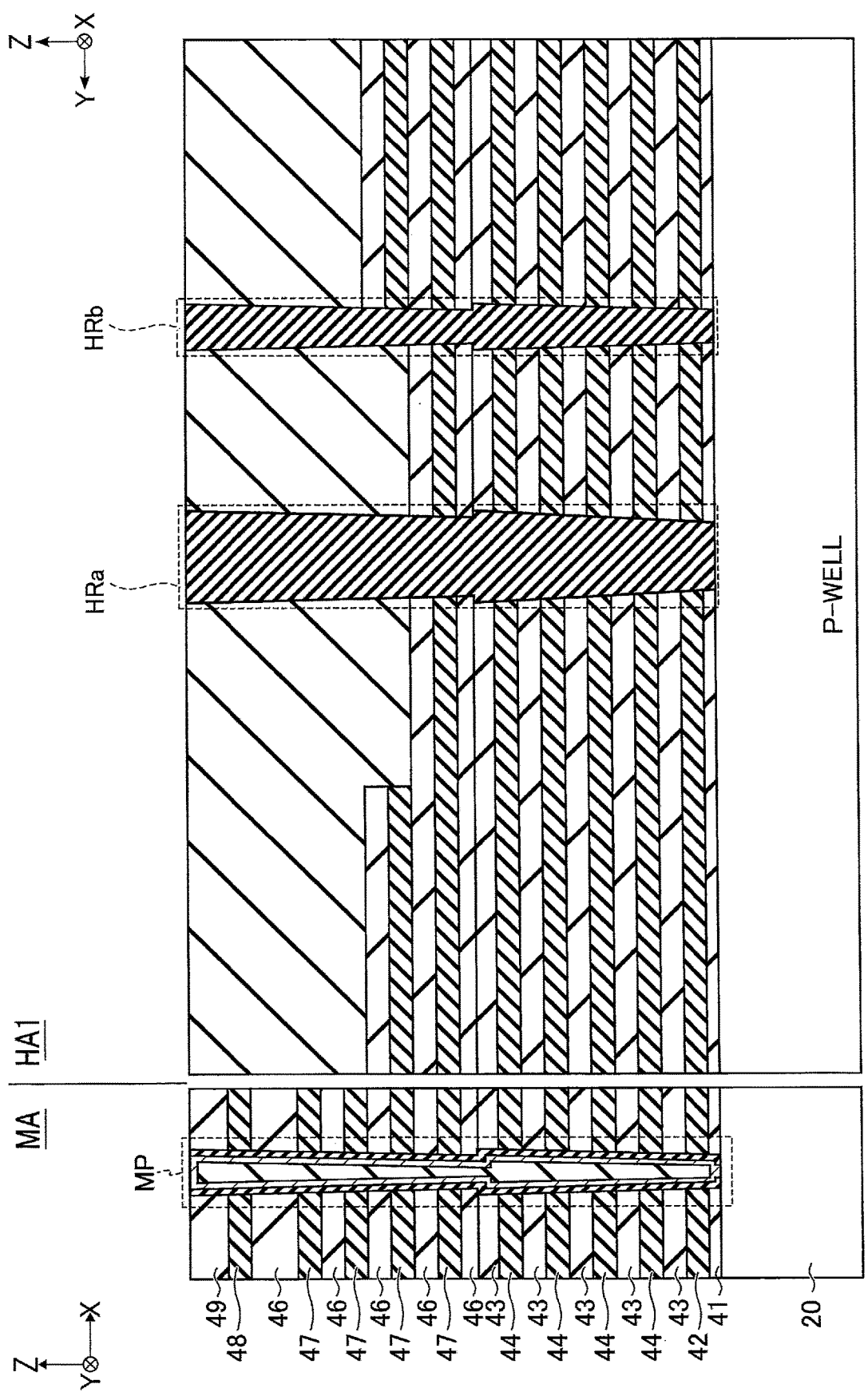
FIG. 17 is a sectional view showing an exemplary sectional structure taken during the manufacture of the semiconductor memory device according to the first embodiment.

Next, processing steps S104 to S106 are sequentially conducted so that an upper stack structure including sacrificial members 47 and 48 is formed, a staircase structure of the upper stack structure is formed, and multiple holes UMH, UHa, and UHb are formed, as shown in FIG. 15.

These processing steps will be briefly explained. First, an insulation layer 46 is formed on the stack structure. Sacrificial members 47 and insulation layers 46 are further alternately stacked on the formed insulation layer 46. A sacrificial member 48 and an insulation layer 49 are formed in this order on the uppermost insulation layer 46 (S104).

In each of the hookup areas HA1 and HA2, end portions of the stacked sacrificial members 47 and 48 are processed into a staircase shape. Then, the space due to the staircase portion in each of the hookup areas HA1 and HA2 is filled with an insulation layer. The upper face of this stack structure is subjected to, for example, CMP to be flattened (S105).

Subsequently, a mask that opens in portions corresponding to the upper pillars UMP, UHRa, and UHRb is formed by photolithography or the like. Then, anisotropic etching is performed with the mask so that the holes UMH, UHa, and UHb penetrating through, for example, each of the insulation layers 46 and 49 and the sacrificial members 47 and 48 are formed. At the bottom of the hole UMH, the sacrificial member 45(MP) filling the hole LMH is partially exposed. At the bottom of the hole UHa, the sacrificial member 45(HRa) filling the hole LHa is partially exposed. At the bottom of the hole UHb, the sacrificial member 45(HRb) filling the hole LHb is partially exposed (S106). The holes UMH, UHa, and UHb correspond to the upper pillars UMP, UHRa, and UHRb, respectively.

Next, multiple support pillars HRa and HRb are formed (S107). More specifically, as seen from FIG. 16, the sacrificial member 45 present in each of the holes LMH, LHa, and LHb is removed first by wet etching or the like. This forms a hole MH corresponding to the combination of the holes LMH and UMH, a hole Ha corresponding to the combination of the holes LHa and UHa, and a hole Hb corresponding to the combination of the holes LHb and UHb (none of which are illustrated). A mask 50 is then formed so as to fill the hole MH. Subsequently, each of the holes Ha and Hb is filled with an insulator so that the support pillars HRa and HRb are formed.

Next, multiple memory pillars MP are formed (S108). More specifically, the mask 50 is first removed as seen from FIG. 17. Then, a block insulation film 35, a charge accumulation film 34, and a tunnel insulation film 33 are formed in this order on the side and bottom faces within each hole MH. A part of the block insulation film 35, charge accumulation film 34, and tunnel insulation film 33 located at the bottom of the hole MH is then removed, and a semiconductor film 31 and a core film 30 are formed in the hole MH. A part of the core film 30 at the upper end of the hole MH is removed, and a further semiconductor film 31 is formed in the space created by the removal. A structure corresponding to the memory pillar MP is thus formed in each hole MH.

Figure 18:
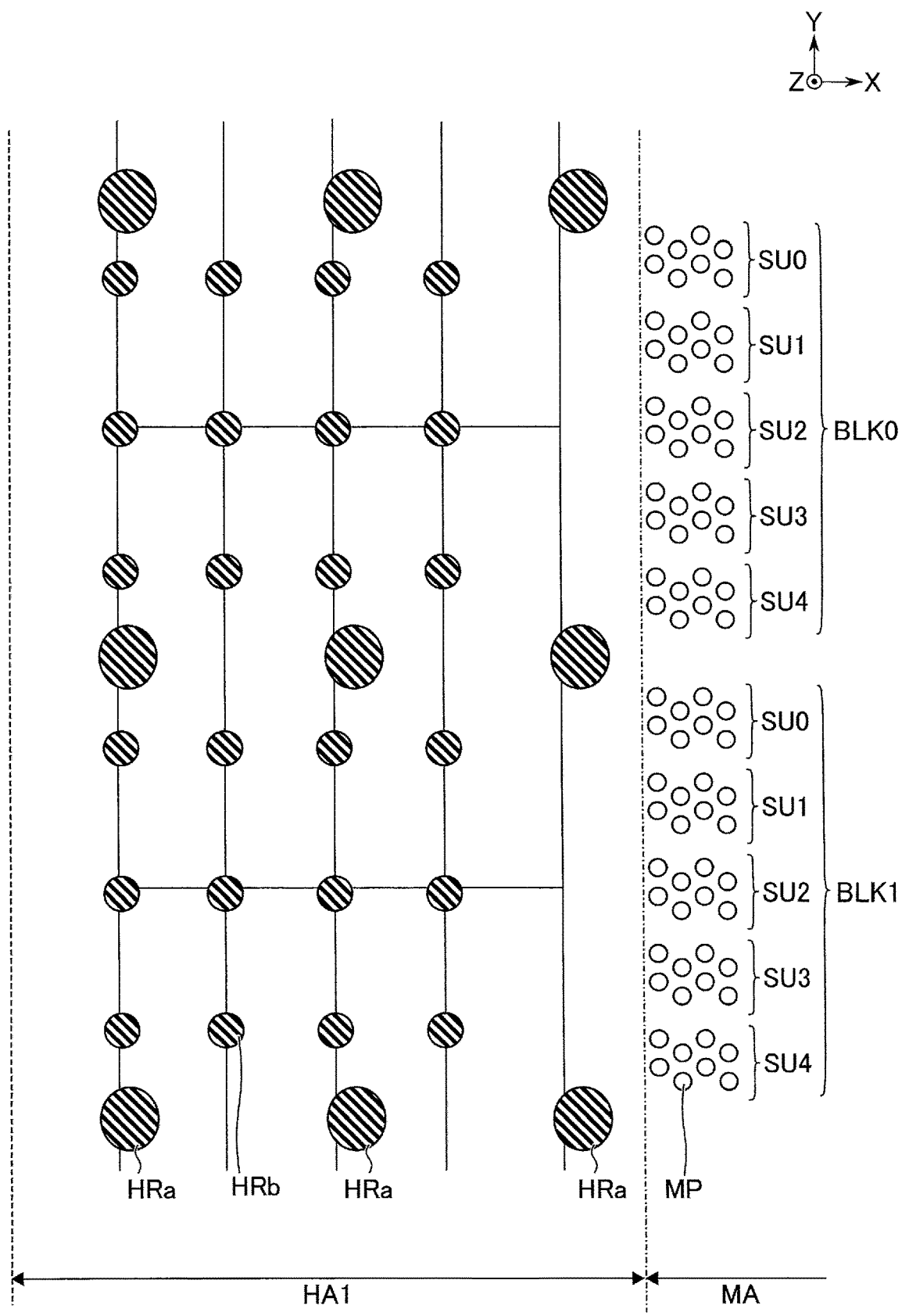
FIG. 18 is a plan view showing an exemplary planar layout taken during the manufacture of the semiconductor memory device according to the first embodiment.

As shown in FIG. 18, the processing steps up to S108 form multiple support pillars HRa and HRb in each of the hookup areas HA1 and HA2, while forming multiple memory pillars MP in the memory area MA. The multiple support pillars HRa are arranged in each region where a member SLT will be formed. The multiple support pillars HRb are arranged in the regions of the hookup areas HA1 and HA2, excluding the regions where the members SLT and the contacts CC will be formed.

Figure 19:
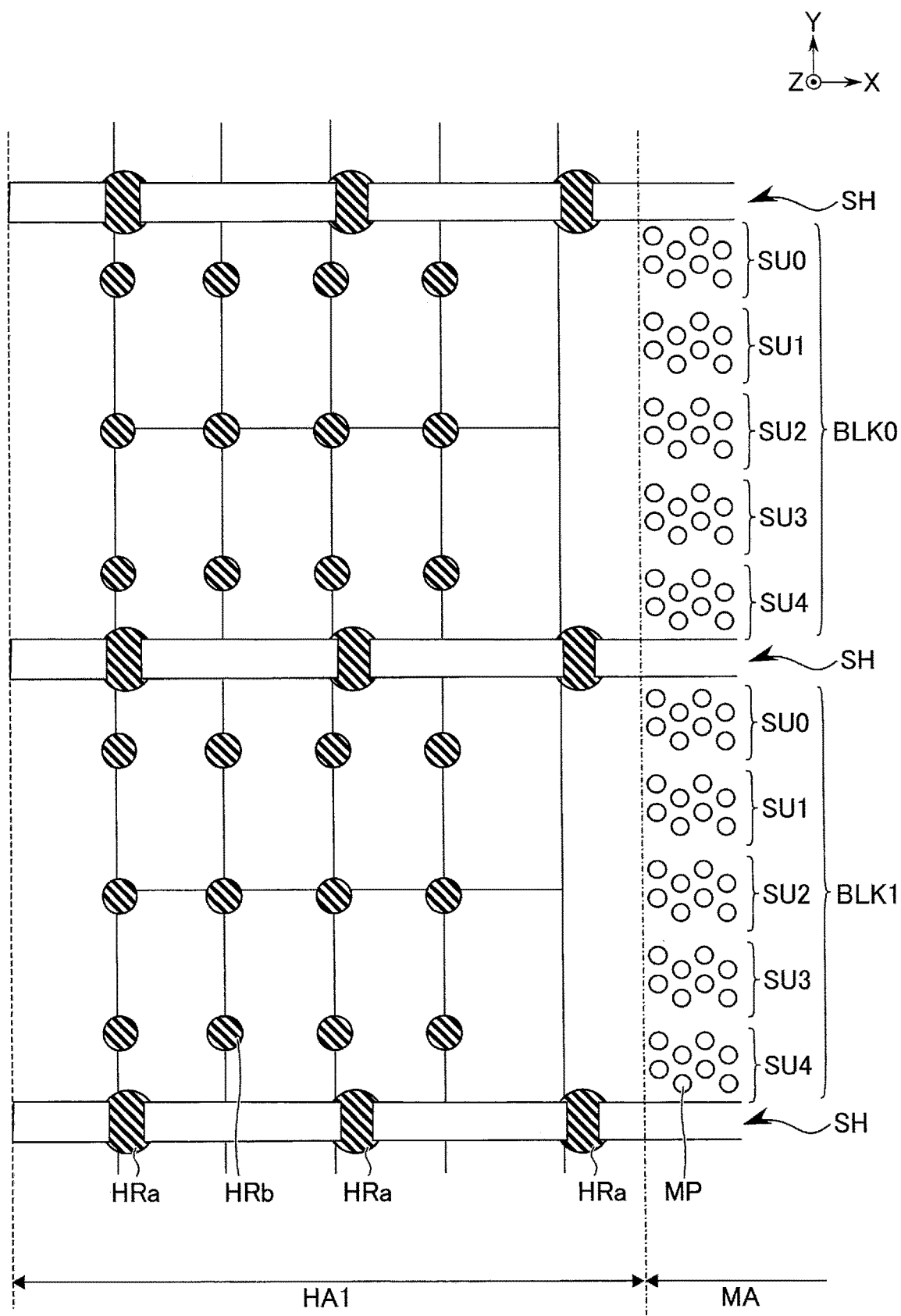
FIG. 19 is a plan view showing an exemplary planar layout taken during the manufacture of the semiconductor memory device according to the first embodiment.
Figure 20:
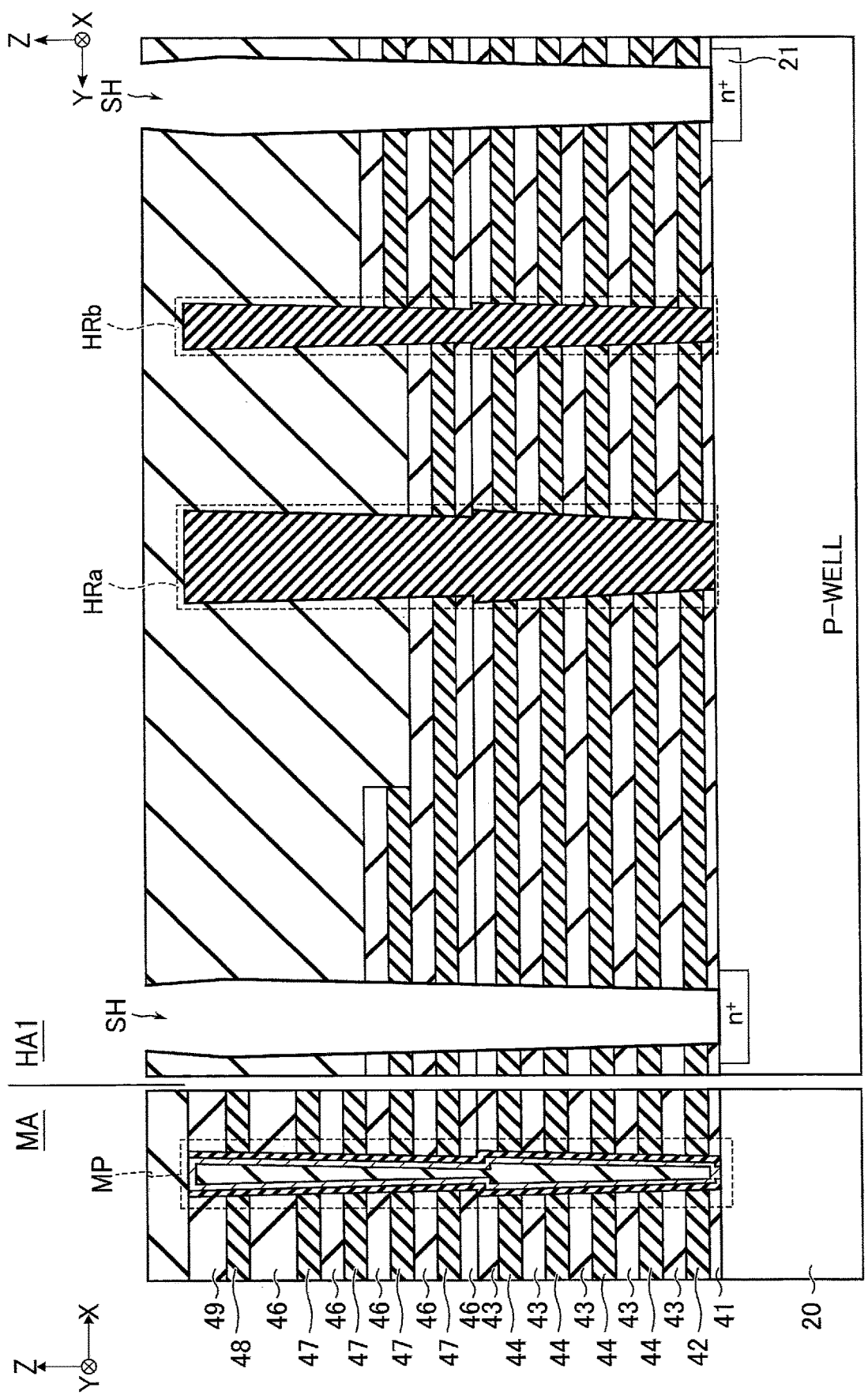
FIG. 20 is a sectional view showing an exemplary sectional structure taken during the manufacture of the semiconductor memory device according to the first embodiment.

Next, multiple slits SH are formed as shown in FIGS. 19 and 20 (S109). More specifically, a mask opening in portions corresponding to the respective members SLT is first formed by photolithography or the like. Then, anisotropic etching is performed with that mask so that the slits SH each penetrating through, for example, each of the insulation layers 41, 43, 46, and 49 and the sacrificial members 42, 44, 47, and 48 are formed. Portions of the P-type well region of the semiconductor substrate 20, exposed due to the respective slits SH, are subjected to ion implantation so that one or more N-type impurities (e.g., phosphorus) are injected into these portions. The corresponding N-type semiconductor regions 21 are thus formed.

Figure 21:
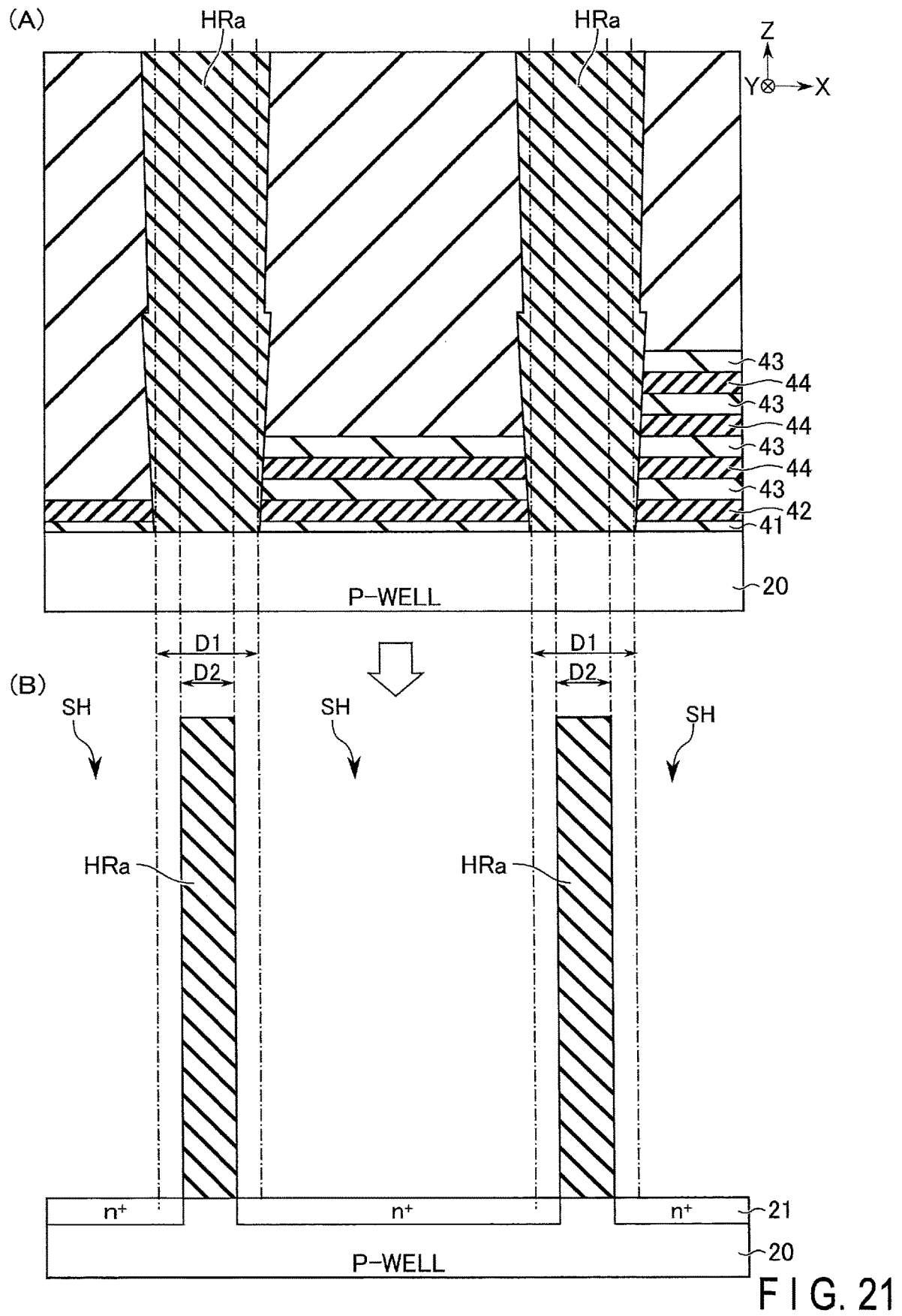
FIG. 21 includes sectional views showing, as an example, how a slit-forming process proceeds during the manufacture of the semiconductor memory device according to the first embodiment.

Note that each slit SH is formed in such a shape in plan view that it is divided into multiple portions that split the stack structure while leaving a portion of each support pillar HRa. More specifically, as shown in FIG. 21, the end faces along the Y-Z plane ("Y-Z end faces") of the respective two slit SH portions, which face each other with an intervening support pillar HRa, each overlap with this support pillar HRa throughout from the upper end to the lower end thereof. Accordingly, the X-direction length of the support pillar HRa changes from D1, which is the length in processing step S107 before the formation of the slit SH, to D2, which conforms to the interval between the two portions of the slit SH that sandwich the support pillar HRa (D2<D1). That is, the upper end of the lower pillar LHRa and the lower end of the upper pillar UHRa have substantially the same length in the X direction.

Figure 22:
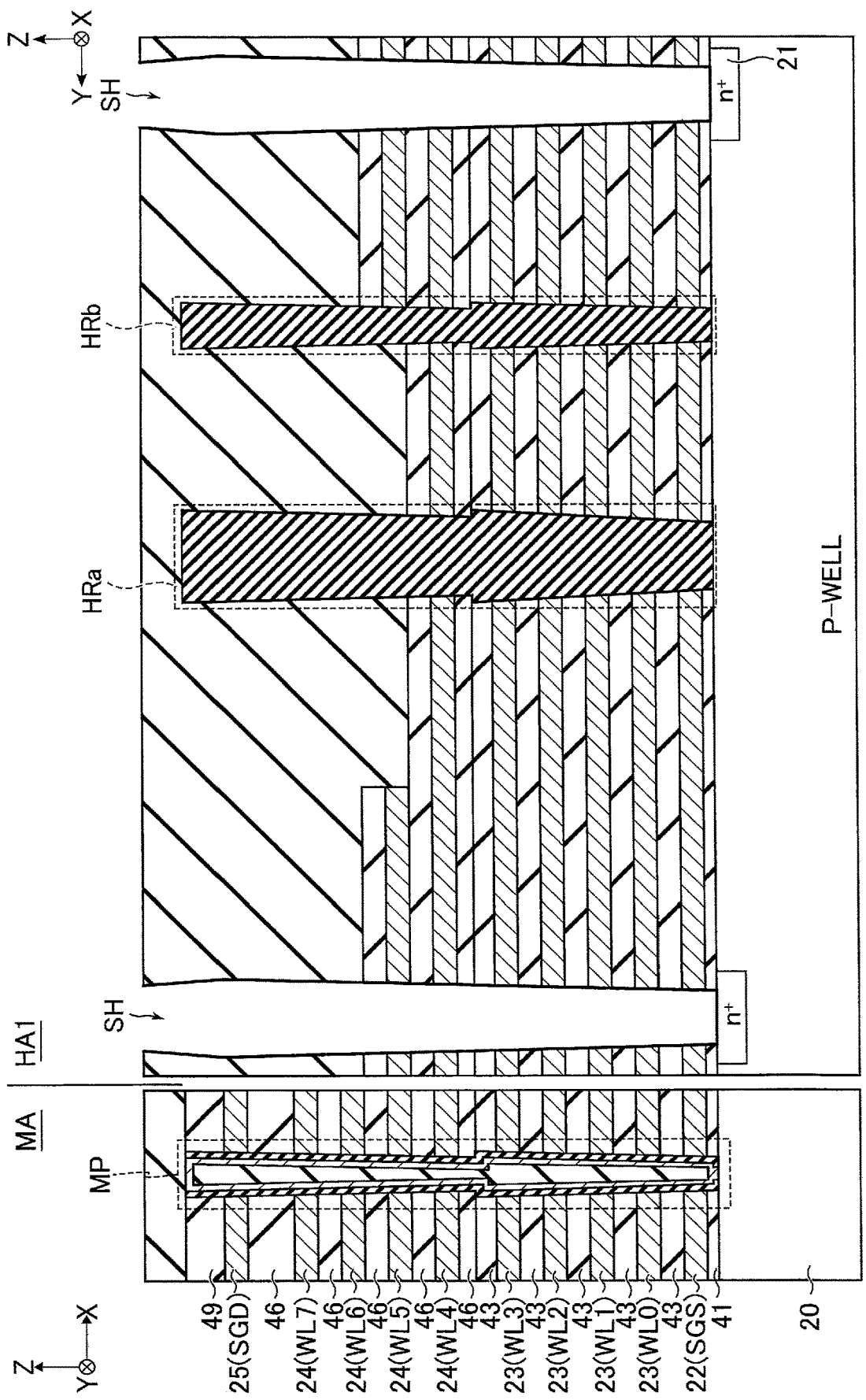
FIG. 22 is a sectional view showing an exemplary sectional structure taken during the manufacture of the semiconductor memory device according to the first embodiment.

Next, a substituting step for the sacrificial members in the stack structure is conducted so that a stacked interconnect structure as shown in FIG. 22 is formed (S110). More specifically, wet etching with thermal phosphoric acids, etc. is first performed to selectively remove the sacrificial members 42, 44, 47, and 48 via the slits SH. The three-dimensional structure of the stack structure after the removal of the sacrificial members 42, 44, 47, and 48 is retained by the multiple memory pillars MP and the multiple support pillars HRa and HRb. Then, a conductor is placed to fill each space created by the removal of the sacrificial members 42, 44, 47, and 48 via the slits SH. For example, chemical vapor deposition (CVD) is employed for the formation of the conductor in this step.

Thereafter, the conductor formed inside each slit SH is removed by etch-back processing so that the conductors formed in the respective interconnect layers are separated from each other. This forms a conductive layer 22 functioning as the select gate line SGS, multiple conductive layers 23 functioning as the respective word lines WL0 to WL3, multiple conductive layers 24 functioning as the respective word lines WL4 to WL7, and a conductive layer 25 functioning as the select gate line SGD. Note that the conductive layers 22 to 25 formed in this step may include barrier metal. In this case, the formation of the conductors after the removal of the sacrificial members 42, 44, 47, and 48 may involve formation of films using titanium nitride as the barrier metal, followed by the tungsten formation.

Figure 23:
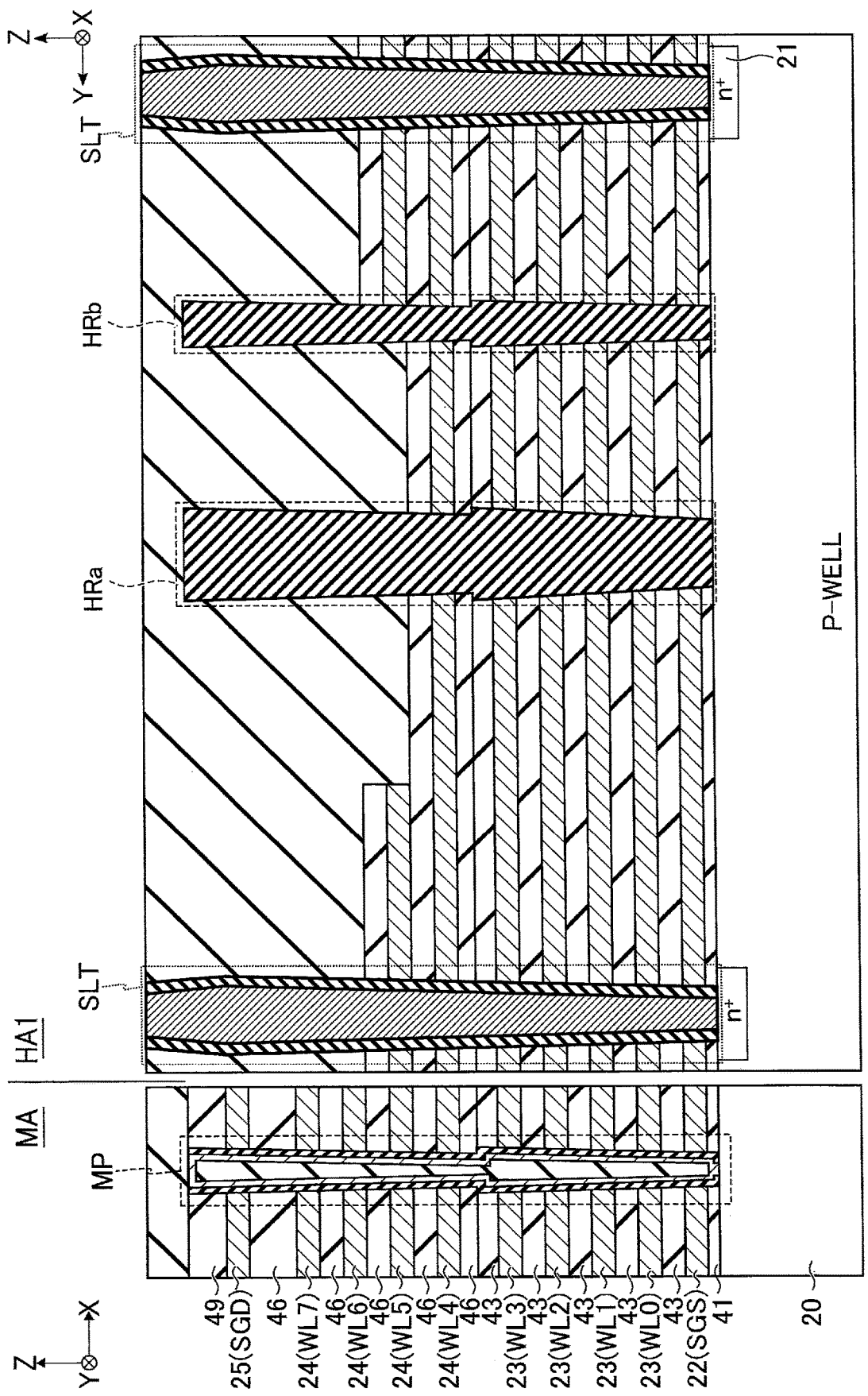
FIG. 23 is a sectional view showing an exemplary sectional structure taken during the manufacture of the semiconductor memory device according to the first embodiment.

Next, as shown in FIG. 23, a member SLT is formed in each slit SH (S111). More specifically, insulators (spacers SP) are formed to cover the side and bottom faces in the slit SH. A portion of the spacer SP provided at the bottom of the slit SH is then removed so that the N-type semiconductor region 21 is partially exposed at the bottom of the slit SH. Subsequently, a conductor (contact LI) is formed within the slit SLT, and the conductor formed outside the slit SLT is removed by, for example, CMP. Meanwhile, in the area not shown in the figure, members SHE for further splitting, among the stacked interconnect structure, the conductive layer 25 into multiple portions are formed.

Figure 24:
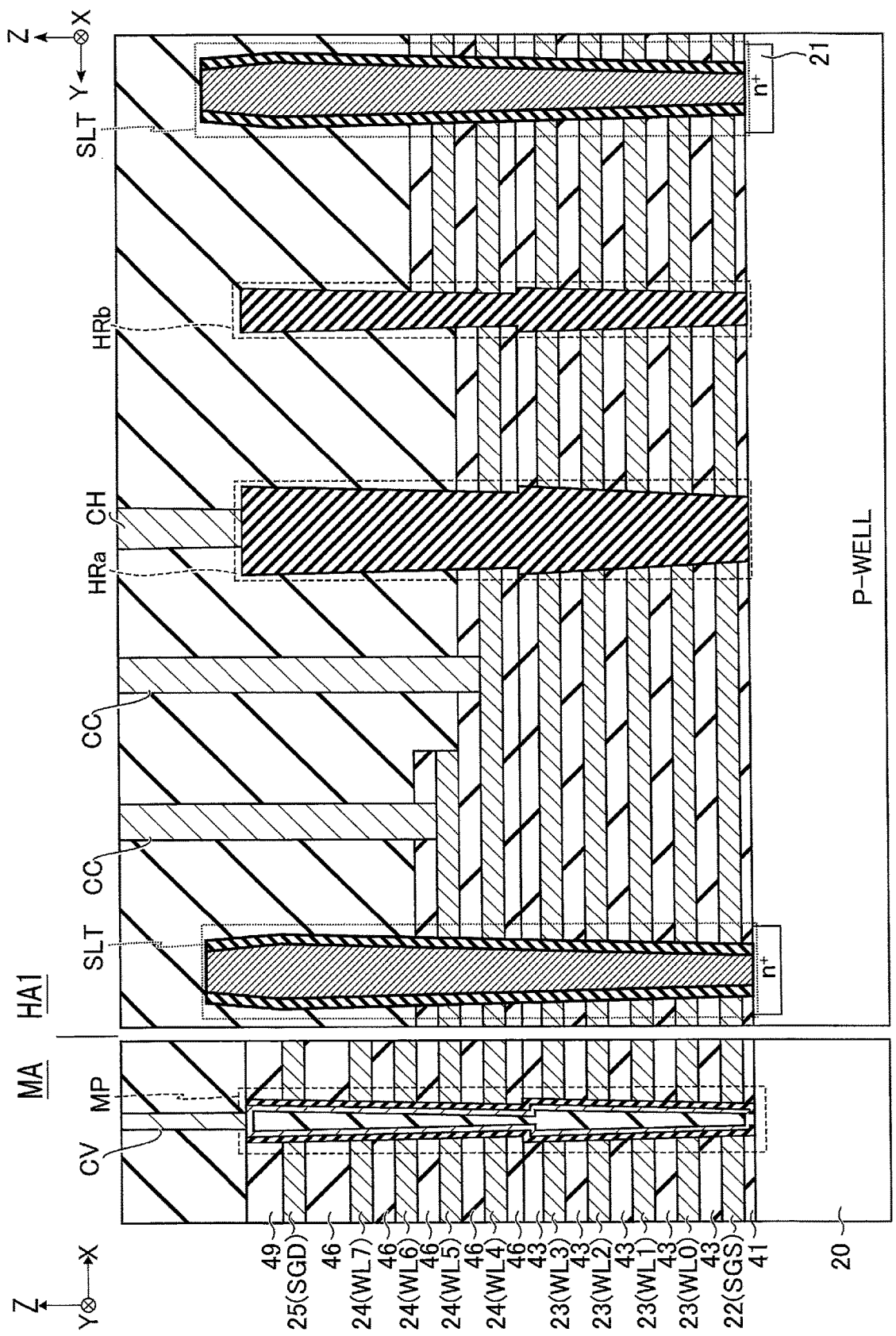
FIG. 24 is a sectional view showing an exemplary sectional structure taken during the manufacture of the semiconductor memory device according to the first embodiment.

Lastly, multiple contacts CC and multiple bridging interconnect layers CH are formed as shown in FIG. 24 (S112). More specifically, a mask that opens in portions corresponding to the contacts CC is formed by photolithography or the like. Then, anisotropic etching is performed with the mask so that holes penetrating through, for example, the insulator disposed on the terrace portions are formed. At the bottom of each hole, the corresponding conductive layer is exposed. The holes are then each filled with a conductor. The conductor formed on the upper face of the stack structure is removed by, for example, CMP so that the faces corresponding to the respective upper ends of the multiple contacts CC are exposed.

Then, a mask that opens in portions corresponding to the bridging interconnect layers CH is formed by photolithography or the like. Anisotropic etching is performed with the mask so that holes are formed above, for example, the respective, corresponding support pillars HRa. At the bottom of each hole, the contacts LI disposed in the respective portions of the member SLT that sandwich the corresponding support pillar HRa are exposed. The holes are then each filled with a conductor. The conductor formed on the upper face of the stack structure is removed by, for example, CMP so that the faces corresponding to the respective upper ends of the multiple bridging interconnect layers CH are exposed.

The stacked interconnect structure in the memory cell array 10 is thus formed by the manufacturing process described above. However, the manufacturing process is only an example and does not pose a limitation. For example, other processing steps may be inserted in the course of the manufacturing process, or some of the processing steps may be omitted or integrated together. Also, wherever possible, changes in the order of the processing steps are tolerated. As one example, the step of forming memory pillars MP and the step of forming support pillars HRa and HRb are interchangeable.

1.3 Effects of Embodiment

The first embodiment can provide effects including improvement in the yield of a semiconductor memory device. The effects will be described.

The support pillars HRa are formed in the boundary part between two neighboring blocks BLK. The slit SH is formed in such a shape as to be divided into multiple portions that split the stack structure while leaving a portion of each support pillar HRa. As such, during the formation of the conductive layers 22 to 25, two stack structures formed due to the splitting by the slit SH and the support pillars HRa are in physical contact with each other via the support pillars HRa. Accordingly, the stack structures can be prevented from inclining during the formation of the conductive layers 22 to 25.

In addition to the above, the stack structure for each block BLK has a Y-Z cross-section asymmetric with respect to the central axis extending along the Z direction. Especially in the hookup areas HA1 and HA2, where one or more differences in level may be formed in the Y direction, asymmetry tends to be more prominent. Such asymmetry would result in a stress in the Y direction occurring in the stack structure during the formation of the conductive layers 22 to 25. The stack structure formed due to the splitting by the slit SH does not have its upper portion supported. As such, the stack structure has a risk of inclining under this Y-direction stress and thereby closing the slit SH, which is undesirable.

According to the first embodiment, the support pillars HRa in the hookup areas HA1 and HA2 physically connect between the neighboring stack structures formed due to the splitting by the slit SH. This allows one neighboring stack structure to share the Y-direction stress with the other neighboring stack structure via the support pillars HRa. Thus, the inclination of the stack structures can be suppressed, and consequently, yields of the semiconductor memory device can be improved.

Also, each support pillar HRa has a double-decker structure constituted by the lower pillar LHRa and the upper pillar UHRa, in which the side face LHRa_s of the lower pillar LHRa and the extension of the side face UHRa_s of the upper pillar UHRa are displaced from each other in the Y-Z cross-section. That is, the support pillars HRa and the other support pillars HRb are formed at once. Accordingly, the embodiment does not require an additional step for forming the support pillars HRa, while realizing the suppression of inclinations of the stack structures. Therefore, increase in manufacturing load of the semiconductor memory device 3 can be reduced.

The support pillar HRa has a length in the Y direction that is greater than the width in the Y direction of the member SLT. This keeps the gap between the two stack structures after the splitting from becoming smaller than the width of the member SLT. Thus, the conductive layers 22 to 25 in the two stack structures after the splitting can avoid degradation of their withstand voltage against one another. Moreover, the embodiment can secure a margin which will reliably serve to keep the separation between the stack structures even in case the position of the slit SH is accidentally displaced in the Y direction from the support pillars HRa.

1.4 Modifications

The first embodiment is not limited to the examples discussed above. The first embodiment may adopt various modifications.

1.4.1 First Modification of First Embodiment

Figure 25:
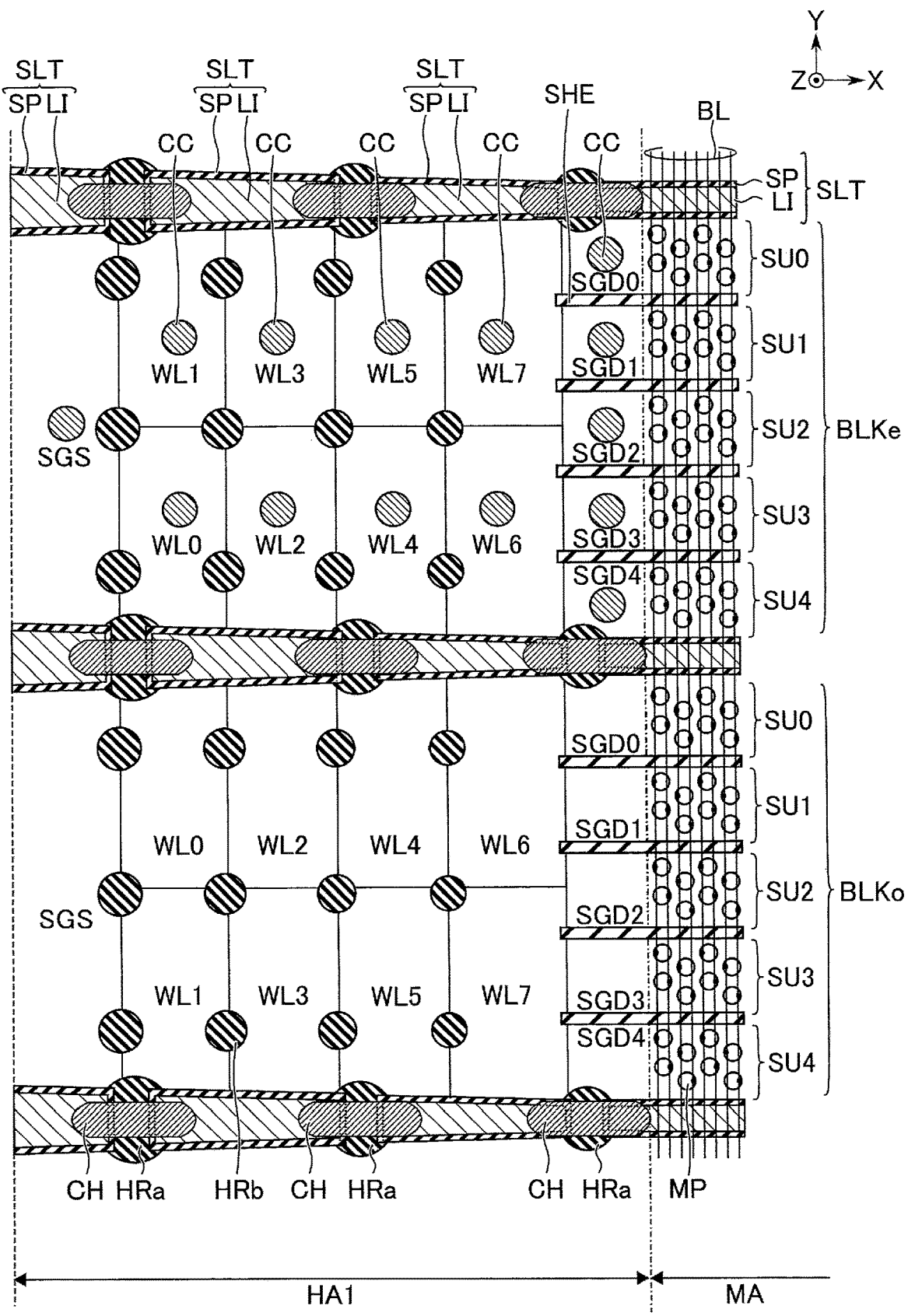
FIG. 25 is a plan view showing a detailed exemplary planar layout of a memory cell array, for its hookup area, in a semiconductor memory device according to a first modification of the first embodiment.

FIG. 25 is a plan view showing a detailed exemplary planar layout of the memory cell array, for its hookup area, in the semiconductor memory device according to a first modification of the first embodiment. FIG. 25 corresponds to FIG. 8.

As shown in FIG. 25, the members SLT in the hookup areas HA1 and HA2 each vary the Y-direction width such that it is wider at the position which contacts the terrace portion of a lower layer.

The support pillars HRa that contact a lower layer terrace portion have an X-Y sectional area larger than those of the support pillars HRa that contact an upper layer terrace portion. As a concrete structure, each support pillar HRa has a Y-direction length greater than the width of the member SLT at the same position.

The support pillars HRb that contact a lower layer terrace portion have an X-Y sectional area larger than those of the support pillars HRb that contact an upper layer terrace portion.

More specifically, when anisotropic etching is performed to create openings in a stack structure constituted by oxide films and nitride films, the openings that have involved a greater processing amount of the oxide films tend to result in a larger opening size. In the hookup areas HA1 and HA2, the proportion of the oxide films in the stack structure is larger in the region where the terrace portion corresponding to the lower interconnect layer is included. Thus, when anisotropic etching is performed to create openings in the stack structure for the hookup areas HA1 and HA2, the openings formed in the regions that include terrace portions corresponding to lower interconnect layers can have a larger opening size, even with a mask that uses an analogous shape for the multiple corresponding openings.

As described above, the support pillars HRa and the support pillars HRb are formed at once. That is, the holes Ha for the formation of the support pillars HRa are created by subjecting the stack structure constituted by the oxide films and the nitride films to anisotropic etching. Thus, the X-Y sectional area of one support pillar HRa can be larger than that of another support pillar HRa, according to the increase in width of the corresponding member SLT.

1.4.2 Second Modification of First Embodiment

The first modification of the first embodiment has assumed an instance where the support pillars HRa that contact a lower layer terrace portion have a larger X-Y sectional area, but no limitation is intended by this. In other instances, the support pillars HRa may be provided so that their respective X-Y sectional areas do not differ from one another, irrespective of their arrangement positions.

Figure 26:
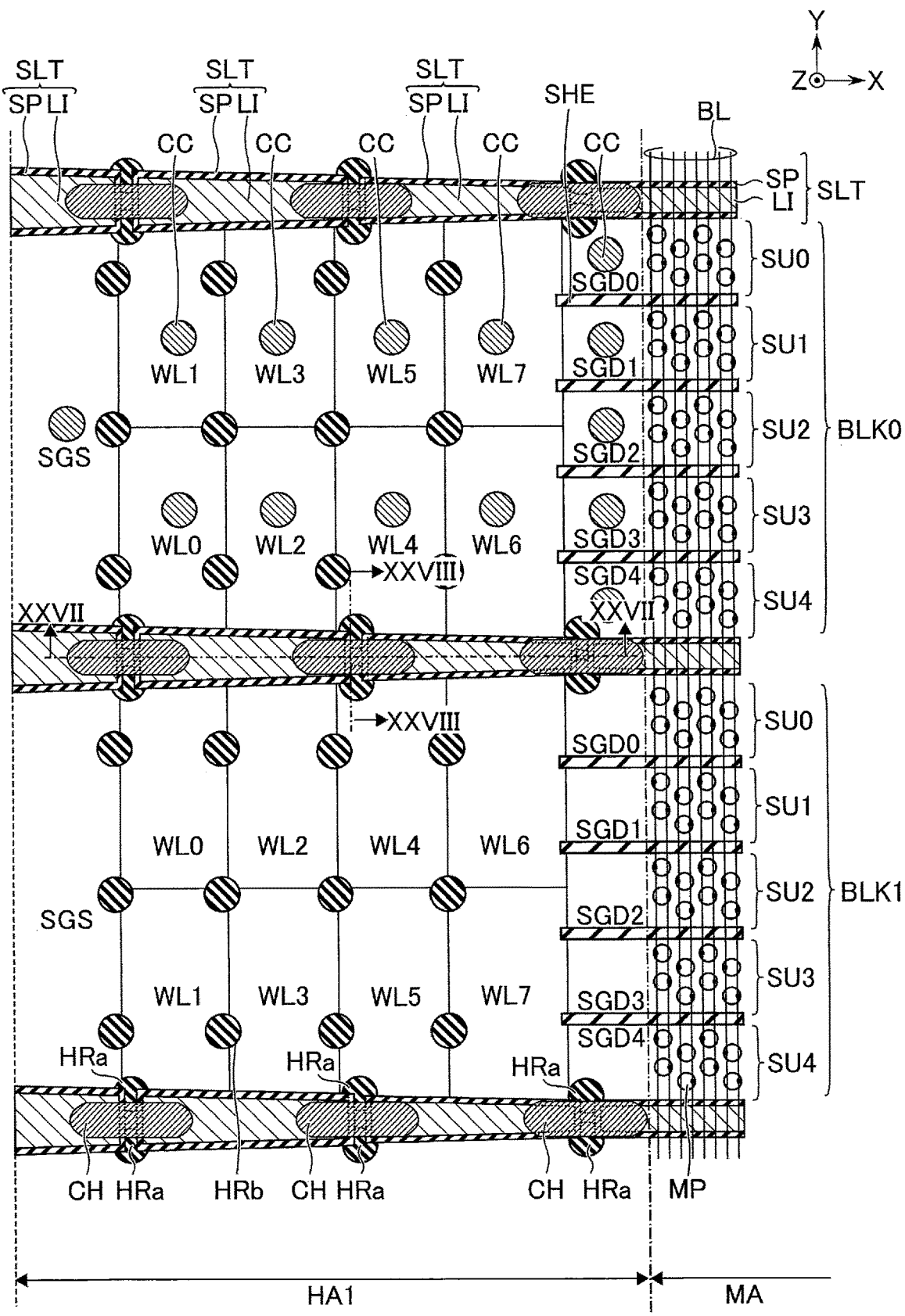
FIG. 26 is a plan view showing a detailed exemplary planar layout of a memory cell array, for its hookup area, in a semiconductor memory device according to a second modification of the first embodiment.

FIG. 26 is a plan view showing a detailed exemplary planar layout of the memory cell array, for its hookup area, in the semiconductor memory device according to a second modification of the first embodiment. FIG. 26 corresponds to FIG. 25. As shown in FIG. 26, the members SLT each increase their Y-direction width as the distance from the memory area MA increases. Meanwhile, in the hookup areas HA1 and HA2, the support pillars HRa and HRb do not show a substantial difference in X-Y sectional area from one another, irrespective of distance from the memory area MA. For example, the X-Y sectional area of one support pillar HRa may be of a size comparable to that of the X-Y sectional area of one support pillar HRb.

Here, in order to divide the member SLT into two portions, two support pillars HRa arranged in the Y direction are used. FIG. 26 shows an example where three sets of support pillars HRa, each including two support pillars HRa arranged in the Y direction, are provided along the X direction for one member SLT, so that this member SLT is divided into four portions.

Assuming that the portion of the stacked interconnect structure corresponding to the block BLK0 is a first portion and the portion of the stacked interconnect structure corresponding to the block BLK1 is a second portion, a third portion of the stacked interconnect structure that is separate from both the first and second portions is present between the two support pillars HRa arranged in the Y direction. That is, in plan view, the third portion of the stacked interconnect structure is surrounded by two portions of the member SLT and two support pillars HRa. Such a third portion of the stacked interconnect structure is formed through substitution of sacrificial members with interconnect layers in the manner similar to the formation of the first and second portions of the stacked interconnect structure.

Figure 27:
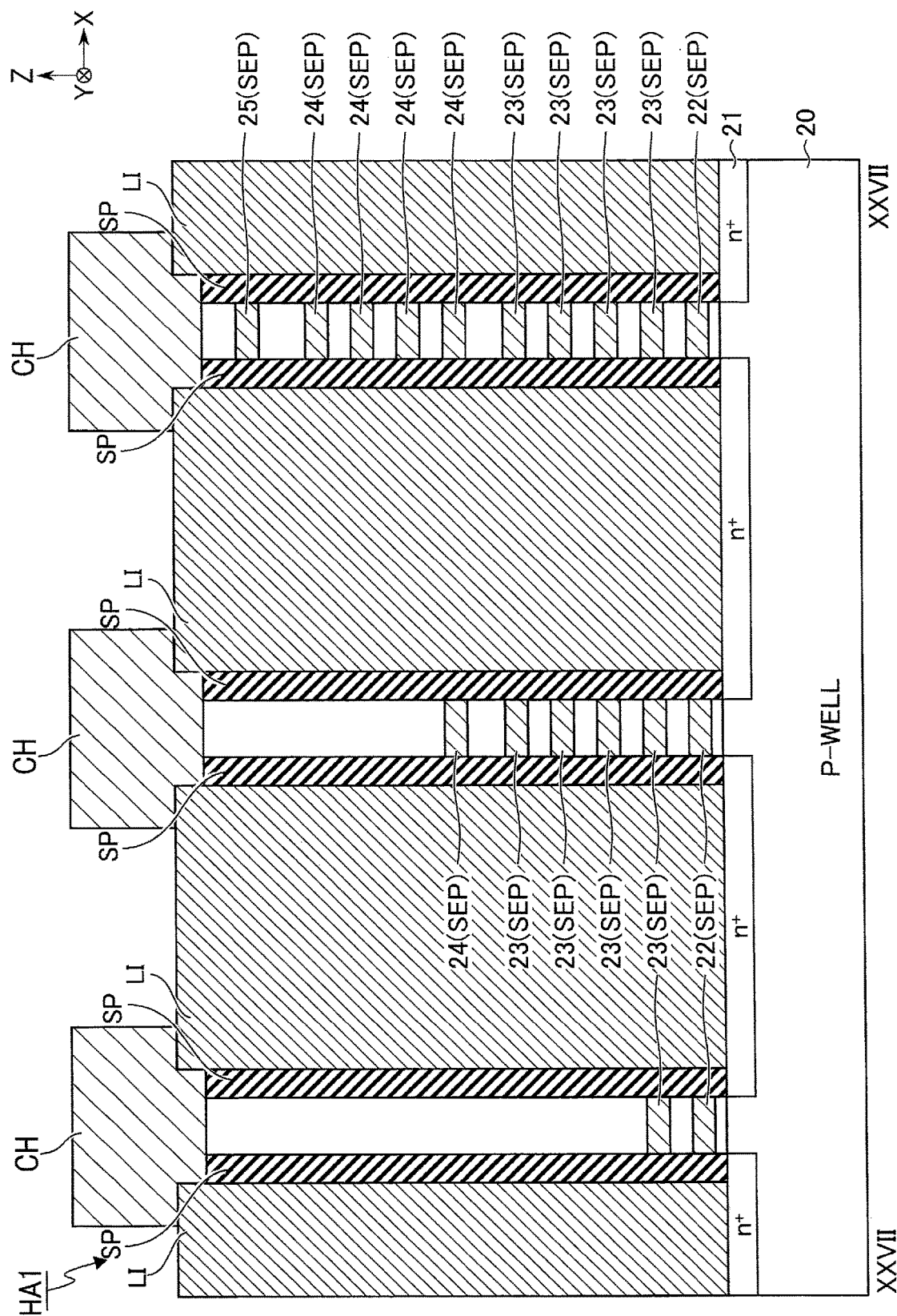
FIG. 27 is a sectional view taken along the line XXVII-XXVII indicated in FIG. 26 and shows an exemplary sectional structure of the memory cell array, for its hookup area, in the semiconductor memory device according to the second modification of the first embodiment.

FIG. 27 is a sectional view taken along the line XXVII-XXVII indicated in FIG. 26 and shows an exemplary sectional structure of the memory cell array, for its hookup area, in the semiconductor memory device according to the second modification of the first embodiment. FIG. 27 shows four portions of the member SLT, three third portions of the stacked interconnect structure, and three bridging interconnect layers CH.

As shown in FIG. 27, each third portion of the stacked interconnect structure is provided with at least part of the set of conductive layers 22(SEP) to 25(SEP) which are arranged in the Z direction while being separate from one another. In the example shown in FIG. 27, the left third portion of the stacked interconnect layer is provided with the conductive layer 22(SEP) and one conductive layer 23(SEP). The middle third portion of the stacked interconnect layer is provided with the conductive layer 22(SEP), four conductive layers 23(SEP), and one conductive layer 24(SEP). The right third portion of the stacked interconnect layer is provided with the conductive layer 22(SEP), four conductive layers 23(SEP), four conductive layers 24(SEP), and the conductive layer 25(SEP). These conductive layers 22(SEP) to 25(SEP) are formed concurrently with the conductive layers 22 to 25 in the substituting step for the sacrificial members.

The conductive layers 22(SEP) to 25(SEP) are provided at the levels lining up with the respective conductive layers 22 to 25, and electrically insulated from the conductive layers 22 to 25. The conductive layers 22(SEP) to 25(SEP) themselves are also electrically insulated from one another in each of the three third portions of the stacked interconnect structure.

Figure 28:
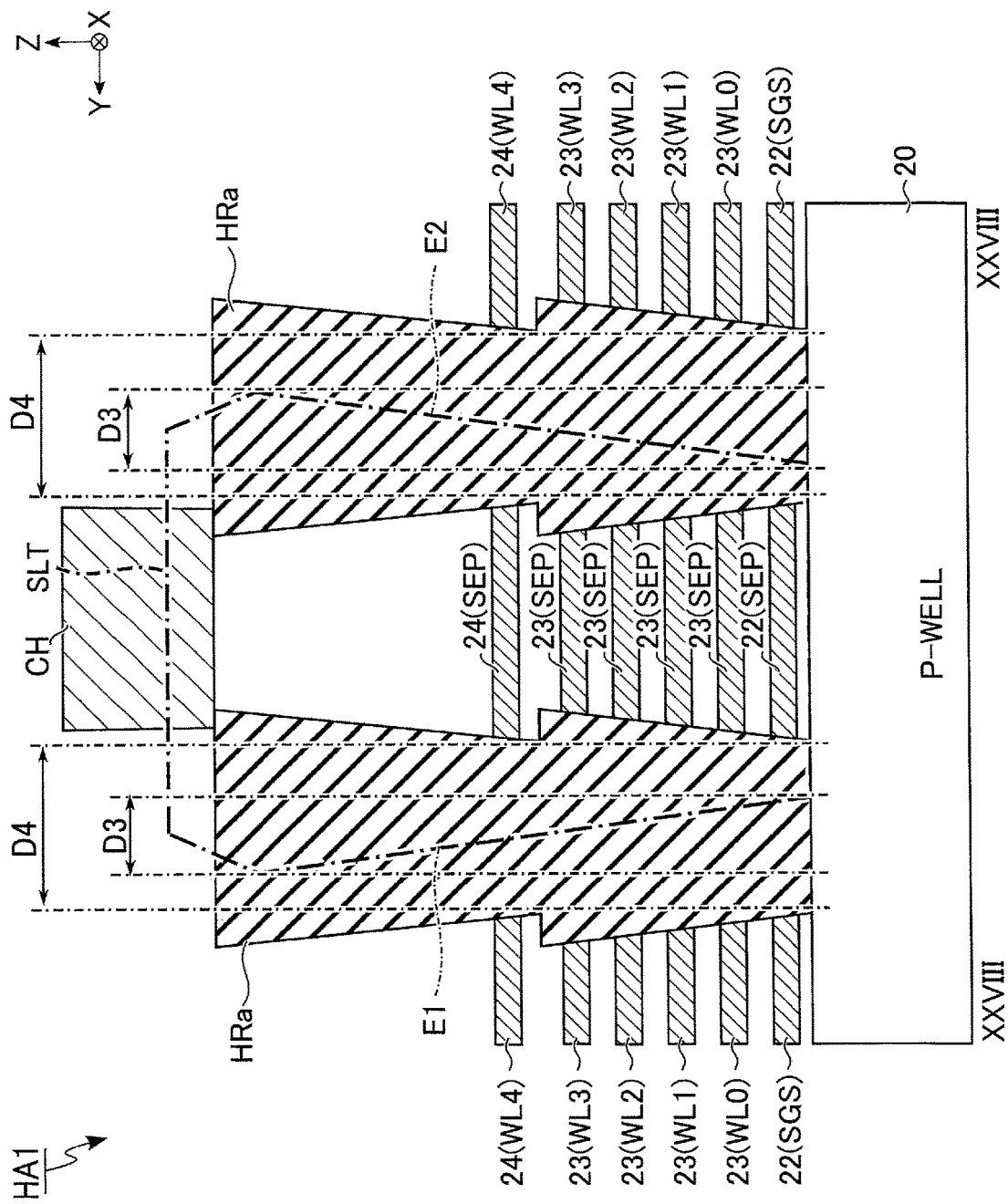
FIG. 28 is a sectional view taken along the line XXVIII-XXVIII indicated in FIG. 26 and shows an exemplary sectional structure of the memory cell array, for its hookup area, in the semiconductor memory device according to the second modification of the first embodiment.

FIG. 28 is a sectional view taken along the line XXVIII-XXVIII indicated in FIG. 26 and shows an exemplary sectional structure of the memory cell array, for its hookup area, in the semiconductor memory device according to the second modification of the first embodiment. FIG. 28 shows the Y-Z cross-sections of the respective support pillars HRa at the position where each support pillar HRa contacts the end of the member SLT in the X direction. The face of the X-direction end of the member SLT, which is a contacting face in contact with the support pillars HRa, is indicated by the thick dashed-dotted lines.

As shown in FIG. 28, the contacting face (Y-Z cross-section) of the member SLT in contact with the two support pillars HRa has two edges E1 and E2 extending in the Z direction. The edge E1 overlaps with one of the two support pillars HRa throughout, from the upper end to the lower end of this support pillar HRa. The edge E2 overlaps with the other one of the two support pillars HRa throughout, from the upper end to the lower end of this other support pillar HRa.

As described above, the Y-Z cross-section of the member SLT has a bowing shape, and as such, the edges E1 and E2 vary their positions in the Y direction within the respective ranges D3. Also, in each support pillar HRa, the Y-direction length of the lower pillar LHRa at its upper end is greater than the Y-direction length of the upper pillar UHRa at its lower end. Thus, each range D4 where the corresponding support pillar HRa uniformly exists from the upper end to the lower end has a position where the Y-direction length of this support pillar HRa is the minimum. By arranging the two support pillars HRa in such a manner that the range D3 falls within the corresponding range D4, the conditions of the edges E1 and E2 mentioned above are met.

With the above structure, the stack structure can be split into portions for the respective blocks BLK by the formation of the slits SH, and the two neighboring stack structures formed by the splitting can be physically connected to each other, without requiring the X-Y sectional areas of the support pillars HRa to be increased according to the increase in the width of the corresponding member SLT. Therefore, it is possible to suppress the inclinations of the stack structures during the formation of the conductive layers 22 to 25.

It is also possible to prevent, by adopting the same opening size for the holes Ha and Hb, the over-etching of the holes Ha as compared to the etching of the holes Hb that would otherwise occur when the opening size of the holes Ha is large and the opening size of the holes Hb is small. Accordingly, the load of the manufacture of the support pillars HRa and HRb can be reduced.

1.4.3 Third Modification of First Embodiment

The first embodiment has assumed that the support pillars HRa arranged in the respective two boundary parts sandwiching a block BLK are located at the positions equivalent to each other with respect to the X direction. However, this is not a limitation. For example, the multiple support pillars HRa may instead be arranged in a staggered pattern.

Figure 29:
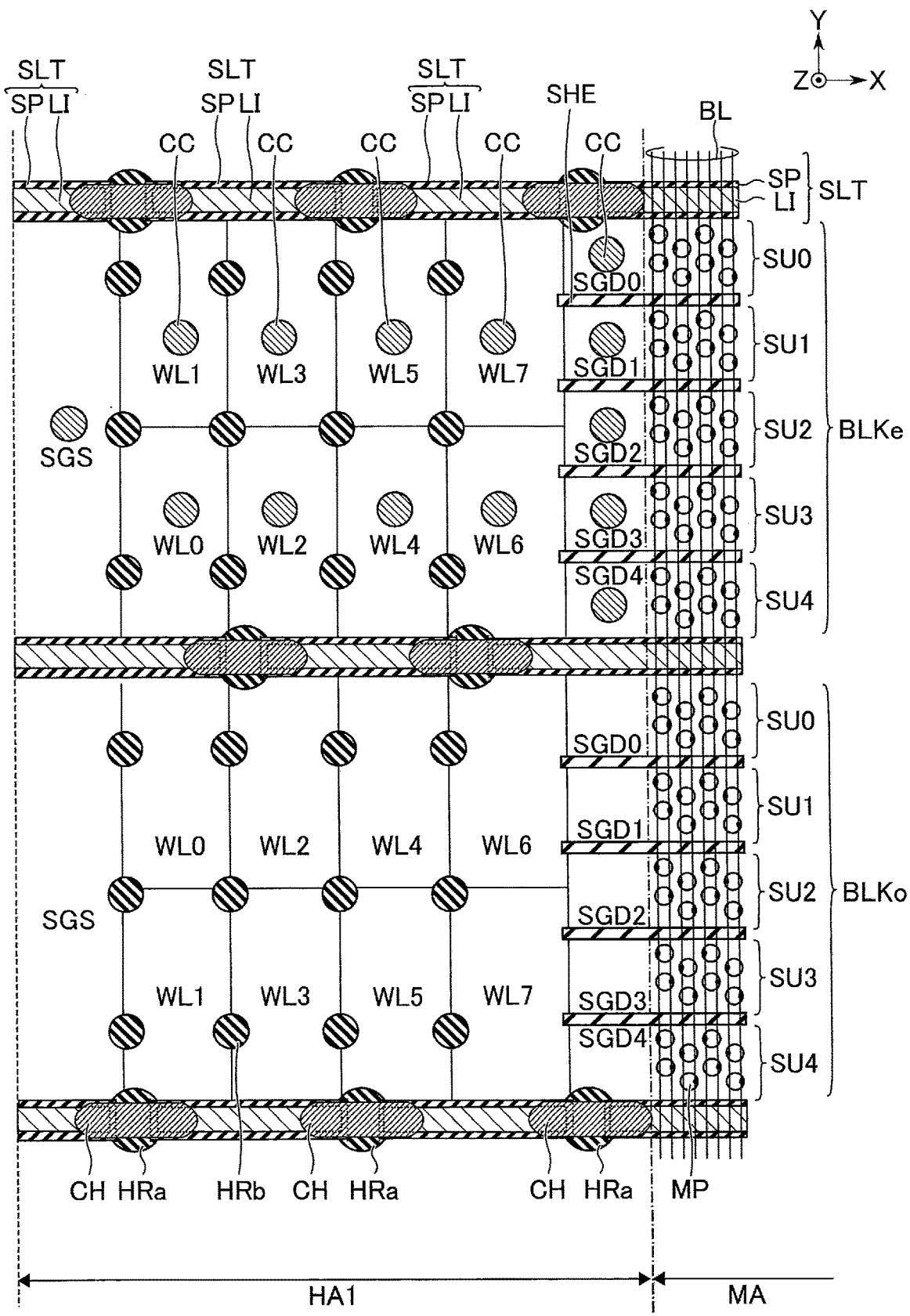
FIG. 29 is a plan view showing a detailed exemplary planar layout of a memory cell array, for its hookup area, in a semiconductor memory device according to a third modification of the first embodiment.

FIG. 29 is a plan view showing a detailed exemplary planar layout of the memory cell array, for its hookup area, in the semiconductor memory device according to a third modification of the first embodiment. FIG. 29 corresponds to FIG. 8.

As shown in FIG. 29, the support pillars HRa arranged in the respective two boundary parts sandwiching the block BLKo are located at positions different from each other with respect to the X direction. The support pillars HRa arranged in the respective two boundary parts sandwiching the block BLKe are located at positions different from each other with respect to the X direction. Meanwhile, the support pillars HRa arranged in the respective two boundary parts sandwiching the blocks BLKo and BLKe are located at the positions equivalent to each other with respect to the X direction.

Such a structure also allows one stack structure to share the Y-direction stress, which occurs therein during the substituting step for the sacrificial members, with another stack structure via the support pillars HRa. Therefore, the same effects as in the first embodiment can be attained.

2. SECOND EMBODIMENT

Next, a semiconductor memory device according to a second embodiment will be described. In the semiconductor memory device according to the second embodiment, the stacked interconnect structure is arranged above the peripheral circuitry such as the row decoder module 15. Accordingly, the semiconductor memory device according to the second embodiment differs from the semiconductor memory device according to the first embodiment in that the hookup area HA is provided at the central part between the memory areas MA. The description will basically omit the configuration and the manufacturing method substantially the same as those of the first embodiment, and concentrate on the aspects of the configuration and the manufacturing method different from those of the first embodiment.

2.1. Configuration

2.1.1 Overview of Planar Layout of Memory Cell Array

FIG. 30 is a plan view showing an exemplary planar layout of a memory cell array in the semiconductor memory device according to the second embodiment. What is shown in FIG. 30 covers a structural part corresponding to eight blocks BLK0 to BLK7. As shown in FIG. 30, the memory cell array 10 includes multiple members SLT and multiple members SHE. Also, the memory cell array 10 is, in one exemplary planar layout, divided into memory areas MA1 and MA2 and a hookup area HA in the X direction. The hookup area HA is arranged between the memory areas MA1 and MA2.

The multiple members SLT each have multiple portions (not illustrated) extending in the X direction, and are arranged in the Y direction. Each member SLT extends in the boundary part between the neighboring blocks BLK so as to traverse the memory areas MA1 and MA2 and the hookup area HA in the X direction.

In the description of the second embodiment, the member SLT that contacts the block BLKk (k=4×i, where i is an integer equal to or greater than 0) on the upper side in the figure will be denoted by reference sign "SLTa". The member SLT that contacts the block BLK(k+1) on the upper side in the figure will be denoted by reference sign "SLTb". The member SLT that contacts the block BLK(k+2) on the upper side in the figure will be denoted by reference sign "SLTc". The member SLT that contacts the block BLK(k+3) on the upper side in the figure will be denoted by reference sign "SLTd". As such, the memory cell array 10 includes multiple sets including the members SLTa, SLTb, SLTc, and SLTd, arranged in the Y direction.

The multiple members SHE are arranged in each of the memory areas MA1 and MA2. The members SHE that correspond to the memory area MA1 each traverse the memory area MA1 and are arranged in the Y direction. The members SHE that correspond to the memory area MA2 each traverse the memory area MA2 and are arranged in the Y direction.

The hookup area HA includes multiple hookup portions HP arranged in the Y direction. One hookup portion HP is provided for every two blocks BLK. In other words, in the hookup area HA, each hookup portion HP is arranged between two members SLT that sandwich two neighboring blocks BLK.

In the description below, an odd-numbered hookup portion HP may be denoted by reference sign "HPo", and an even-numbered hookup portion HP may be denoted by reference sign "HPe". For example, the hookup portions HPo are arranged for the pair of blocks BLK0 and BLK1 and the pair of blocks BLK4 and BLK5, respectively, in the hookup area HA. The hookup portions HPe are arranged for the pair of blocks BLK2 and BLK3 and the pair of blocks BLK6 and BLK7, respectively, in the hookup area HA.

Each hookup portion HP includes a contact region CCT and two contact regions C4T. The contact region CCT is a region including a staircase structure of the stacked interconnects. The contact regions C4T are insulation regions penetrating through the stacked interconnect structure. The contact region CCT and the pair of contact regions C4T are arranged in the X direction.

In each hookup portion HP, the contact region CCT is arranged so that it straddles one member SLT located between the two neighboring blocks and overlaps with a portion in the Y direction of each of these two neighboring blocks. The member SLT that crosses the contact region CCT thus splits the staircase structure of the stacked interconnects, corresponding to the two neighboring blocks BLK sharing the contact region CCT, into portions for the respective blocks BLK. In more concrete terms, the contact region CCT in the hookup portion HPo corresponding to the blocks BLK0 and BLK1 and the contact region CCT in another hookup portion HPo corresponding to the blocks BLK4 and BLK5 are split by the respective members SLTb. The contact region CCT in the hookup portion HPe corresponding to the blocks BLK2 and BLK3 and the contact region CCT in another hookup portion HPe corresponding to the blocks BLK6 and BLK7 are split by the respective members SLTd.

In each hookup portion HP, the two contact regions C4T are arranged in the respective two neighboring blocks BLK. Each contact region C4T is sandwiched by two members OST which are arranged in the Y direction while being separate from each other. The members OST each extend in the X direction and include an embedded insulator. The stacked interconnects in each block BLK bypass the contact region C4T and are electrically coupled between the memory areas MA1 and MA2. That is, the stacked interconnects have a portion located next to the contact region C4T in the Y direction.

In the hookup area HA, the contact regions CCT and C4T of the hookup portions HP are arranged in staggered patterns. More specifically, the arrangement of the contact regions CCT and C4T in one hookup portion HPe is similar to an X-direction reversed arrangement of the contact regions CCT and C4T in one hookup portion HPo. That is, for example, the contact region CCT is arranged on the side of the memory area MA1 and the contact regions C4T are arranged on the side of the memory area MA2 in the hookup portion HPo. In the hookup portion HPe, the contact regions C4T are arranged on the side of the memory area MA1 and the contact region CCT is arranged on the side of the memory area MA2.

2.1.2 Hookup Area (Planar Layout)

Figure 31:
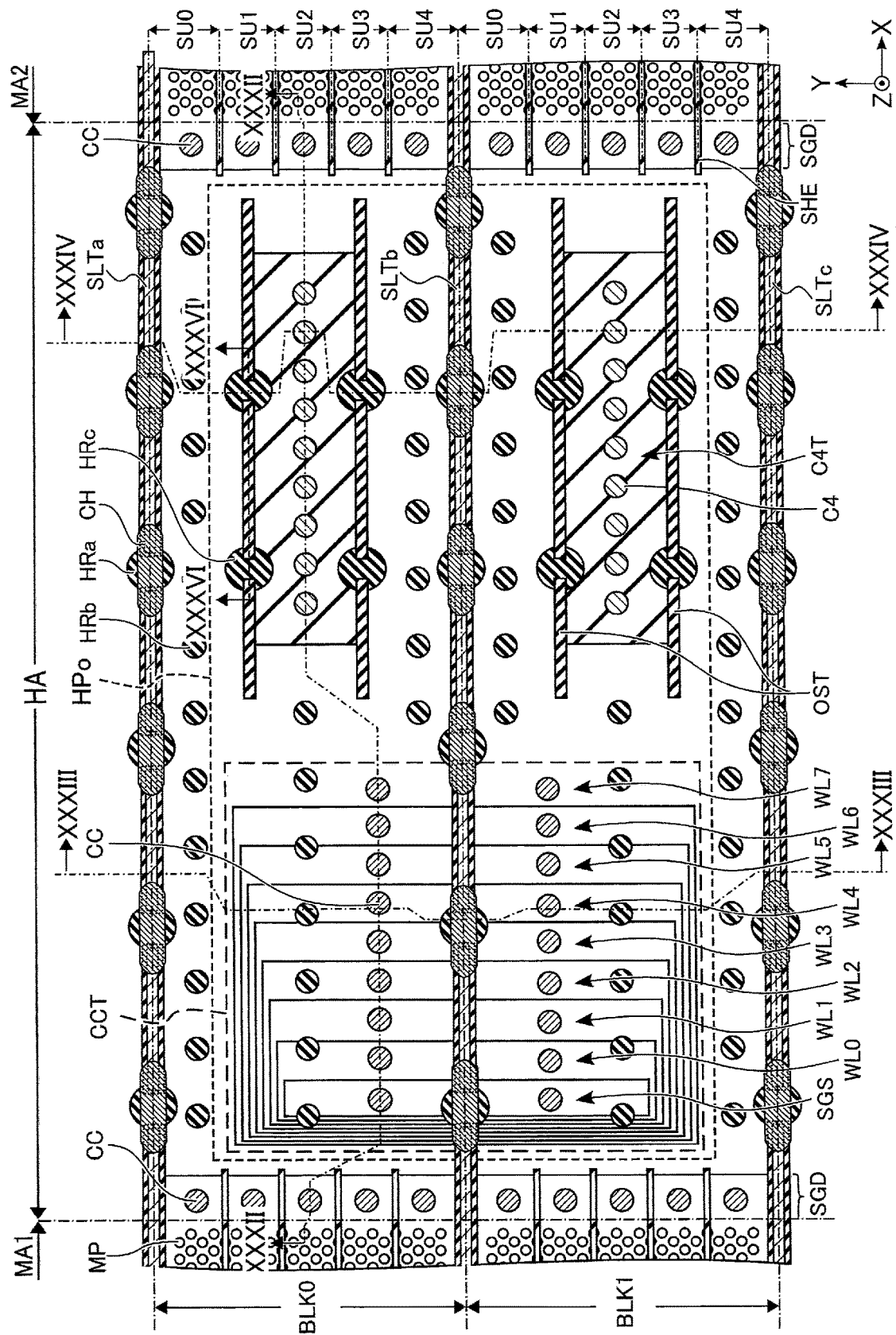
FIG. 31 is a plan view showing a detailed exemplary planar layout of the memory cell array, for its hookup area, in the semiconductor memory device according to the second embodiment.

FIG. 31 is a plan view showing a detailed exemplary planar layout of the memory cell array, for its hookup area, in the semiconductor memory device according to the second embodiment. What is shown in FIG. 31 covers structural portions corresponding to the two blocks BLK0 and BLK1 corresponding to the hookup portion HPo, and also parts of the respective nearby memory areas MA1 and MA2.

As shown in FIG. 31, the memory cell array 10 in its hookup area HA includes multiple contacts CC and C4, multiple bridging interconnect layers CH, multiple members OST, and multiple support pillars HRa, HRb, and HRc.

In the hookup area HA, the select gate lines SGD each have a terrace portion not overlapping with the upper conductive layers. In the contact region CCT, the select gate lines SGS and the word lines WL0 to WL7 each have a terrace portion not overlapping with the upper conductive layers. Each contact region C4T has none of the select gate lines SGS and SGD and the word lines WL0 to WL7.

The terrace portions in the hookup area HA each have a shape that resembles a step, a terrace, rimstone, or the like. More specifically, there is a difference in level between the select gate line SGS and the word line WL0, between the word line WL0 and the word line WL1, . . . , between the word line WL6 and the word line WL7, and between the word line WL7 and the select gate line SGD. FIG. 31 shows an example where the portions of the respective word lines WL0 to WL7 are together formed in a staircase shape having one difference in level in the X direction.

The multiple contacts CC in each of the blocks BLK are provided on the respective terrace portions of the select gate line SGS, the word lines WL0 to WL7, and the select gate lines SGD0 to SGD4. The multiple contacts C4 are provided in each contact region C4T, in association with the select gate line SGS and the word lines WL0 to WL7. The multiple contacts CC and the multiple contacts C4 provided in one of the blocks BLK in the hookup portion HP are, for example, linearly arranged in the X direction. However, these contacts are not required to be arranged linearly in the X direction. For example, these contacts may arranged by shifting in the Y direction.

The stacked interconnects coupled to the NAND strings each have an electrical connection to the row decoder module 15 via, for example, a combination of the corresponding contacts CC and C4. In this example, the select gate line SGS and the word lines WL0 to WL7 are each coupled to the row decoder module 15 via a combination of the corresponding contacts CC and C4 arranged in the hookup area HA. The select gate lines SGD may each be coupled to the row decoder module 15 through a route similar to those of the word lines WL, or through a route outside the hookup area HA.

In the hookup area HA, each member SLT is divided into multiple portions by at least one support pillar HRa. In the example shown in FIG. 31, six support pillars HRa are provided for one member SLT so that this member SLT is divided into seven portions. These six support pillars HRa are arranged in the portions of the member SLT, including the portion facing the contact region CCT and the portion facing the contact region C4T.

In the hookup area HA, the multiple support pillars HRc are arranged along the corresponding contact region C4T. Each member OST is divided into multiple portions by at least one support pillar HRc. In the example shown in FIG. 31, two support pillars HRc are provided for one member OST so that this member OST is divided into three portions. The support pillars HRc sandwiching the associated contact region C4T in the Y direction are located at the positions equivalent to each other with respect to the X direction. By virtue of the presence of the members OST and the support pillars HRc, the contact regions C4T are separated from the stacked interconnects in the Y direction. In other words, each member OST and the corresponding support pillars HRc are arranged in the boundary part between a portion of the stacked interconnects that is located next to the applicable contact region C4T in the Y direction and this contact region C4T.

In the hookup area HA, the multiple support pillars HRb are suitably arranged in the regions excluding the positions where the members SLT and the support pillars HRa are formed, the positions where the members OST and the support pillars HRc are formed, and the positions where the contacts CC and C4 are formed.

(Sectional Structure)

Figure 32:
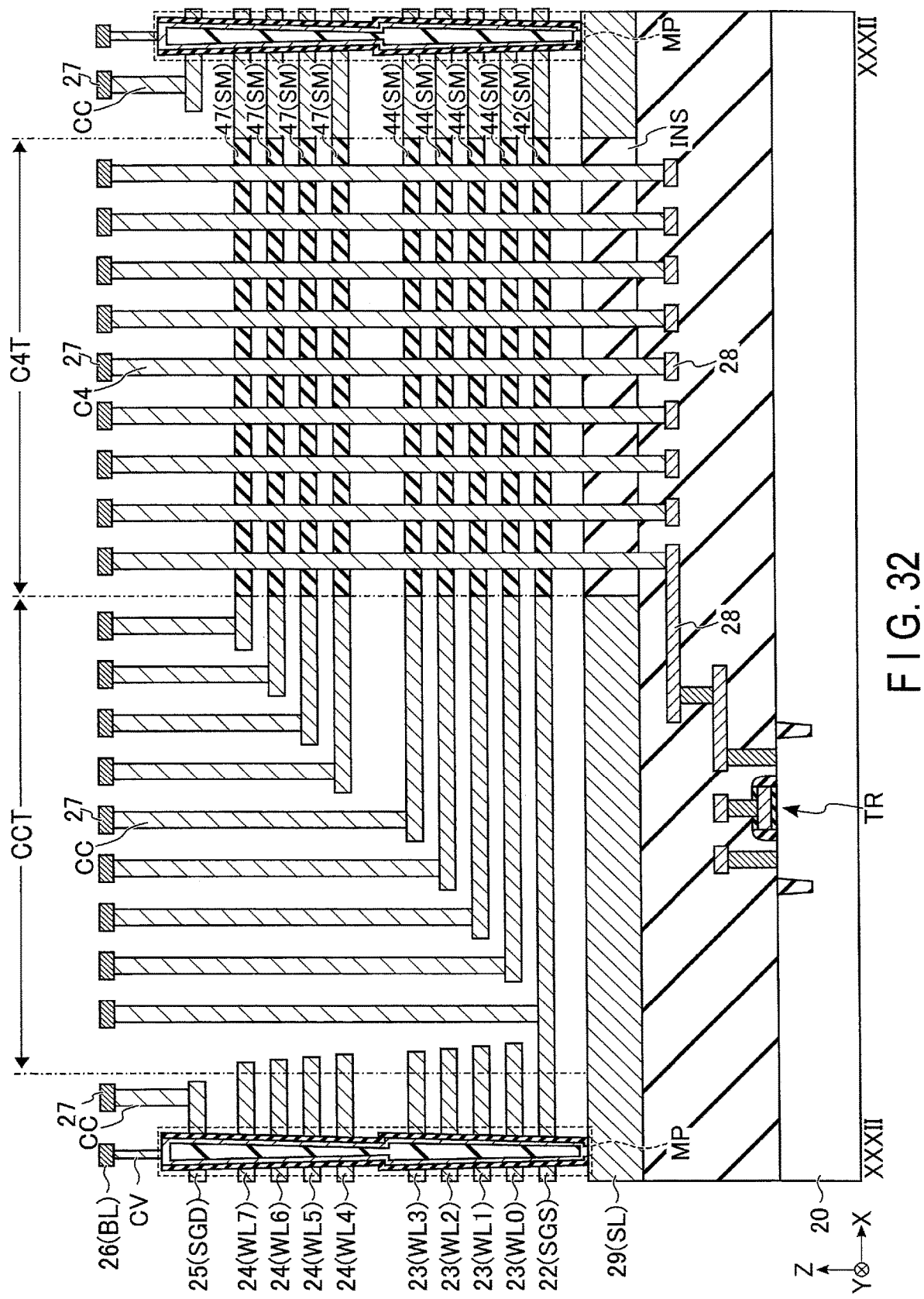
FIG. 32 is a sectional view taken along the line XXXII-XXXII indicated in FIG. 31 and shows an exemplary sectional structure of the memory cell array, for its hookup area, in the semiconductor memory device according to the second embodiment.

FIG. 32 is a sectional view taken along the line XXXII-XXXII indicated in FIG. 31 and shows an exemplary sectional structure of the memory cell array, for its hookup area, in the semiconductor memory device according to the second embodiment. What is shown in FIG. 32 covers the hookup area HA and parts of the respective memory areas MA1 and MA2.

As shown in FIG. 32, the memory cell array 10 further includes a conductive layer 29 between the semiconductor substrate 20 and the conductive layer 22. Each memory pillar MP is formed so that its lower end contacts the conductive layer 29. In one example, the conductive layer 29 is formed in a plate shape extending along the X-Y plane, and serves as the source line SL. The conductive layer 29 contains, for example, silicon doped with phosphorous.

In the hookup area HA, portions of the respective conductive layers 22 to 25 are formed in a staircase shape. The staircase shape constituted by the portions of the respective conductive layers 22 to 24 is included in the contact region CCT.

In the contact region C4T, a part of the conductive layers 29 is replaced by an insulation layer INS. Also in the contact region C4T, multiple sacrificial members SM (42, 44, and 47) remain without being substituted with the respective conductive layers 22 to 24. These sacrificial members SM, as well as the insulation layer INS, are penetrated by the multiple contacts C4. In other words, the contacts C4 are each separated and electrically insulated from the multiple conductive layers 22 to 24 and 29.

The memory cell array 10 also includes multiple conductive layers 28 in an insulation layer between the semiconductor substrate 20 and the conductive layer 29. Here, in the contact region C4T, multiple conductive layers 27 are formed to correspond to the respective conductive layers 28 and the multiple contacts C4 are each arranged between the corresponding conductive layers 27 and 28. The conductive layers 28 are each coupled to a transistor TR. While not illustrated, circuitry components are present in the semiconductor substrate 20 and in the insulation layer between the semiconductor substrate 20 and the conductive layer 29, as circuits corresponding to, for example, the row decoder module 15, the sense amplifier module 16, etc., and including the transistor TR.

FIG. 33 is a sectional view taken along the line XXXIII-XXXIII indicated in FIG. 31 and shows an exemplary sectional structure of the memory cell array, for its hookup area, in the semiconductor memory device according to the second embodiment. FIG. 33 shows, each in Y-Z cross-section, the interconnect layers, the bridging interconnect layer CH, two contacts CC, the members SLTa and SLTc, the support pillar HRa that divides the member SLTb, and two support pillars HRb within and near the contact regions CCT for the respective blocks BLK0 and BLK1.

As shown in FIG. 33, in each of the structural portions of the contact region CCT corresponding to the respective blocks BLK, a region forming the terrace portion of the interconnect layer and a region not forming the terrace portion of any of the conductive layers 22 to 24 are arranged in the Y direction. As such, in the contact region CCT, the stacked interconnect structure for each block BLK has a Y-Z cross-section asymmetric with respect to the central axis extending along the Z direction.

Figure 34:
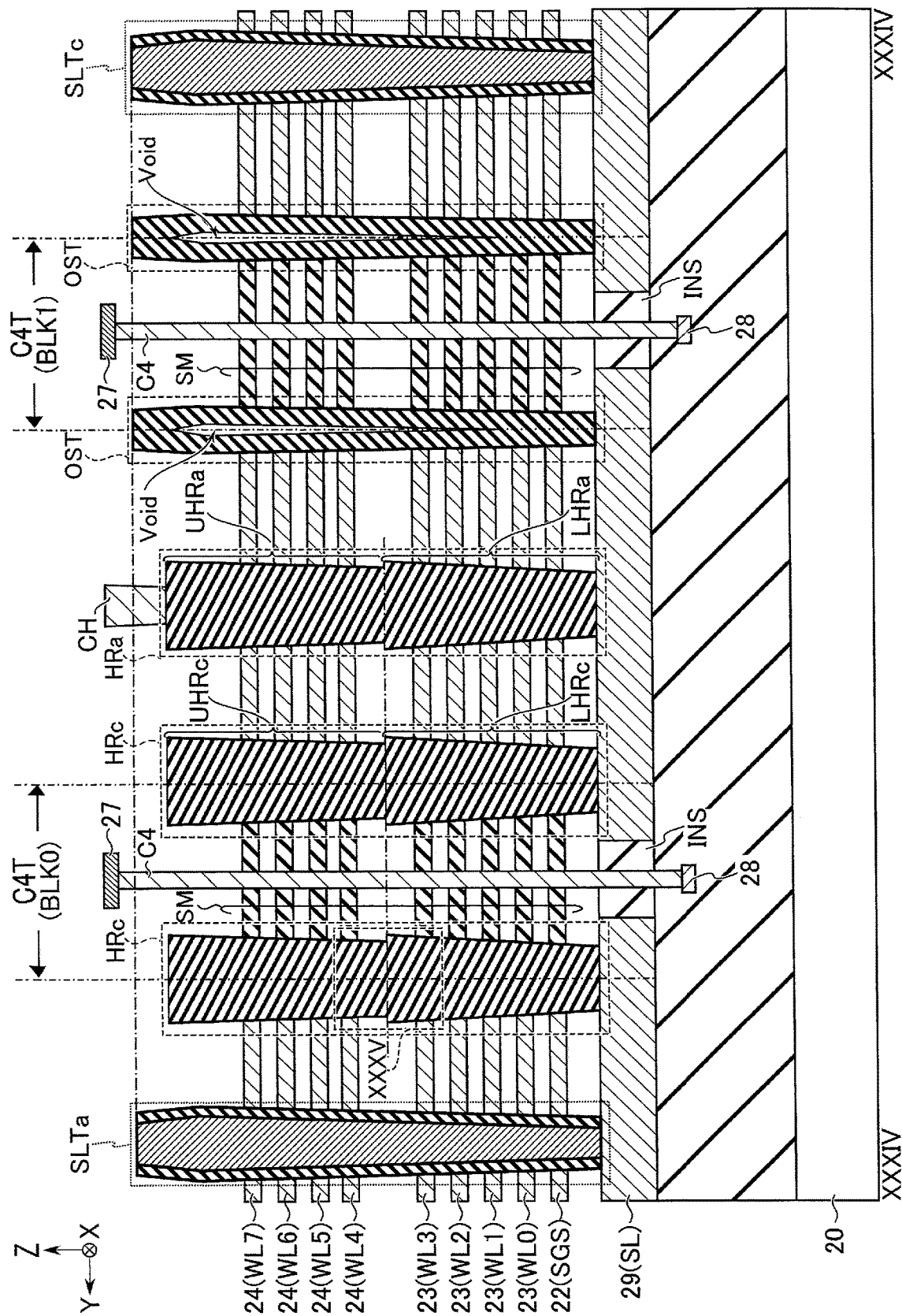
FIG. 34 is a sectional view taken along the line XXXIV-XXXIV indicated in FIG. 31 and shows an exemplary sectional structure of the memory cell array, for its hookup area, in the semiconductor memory device according to the second embodiment.
Figure 35:
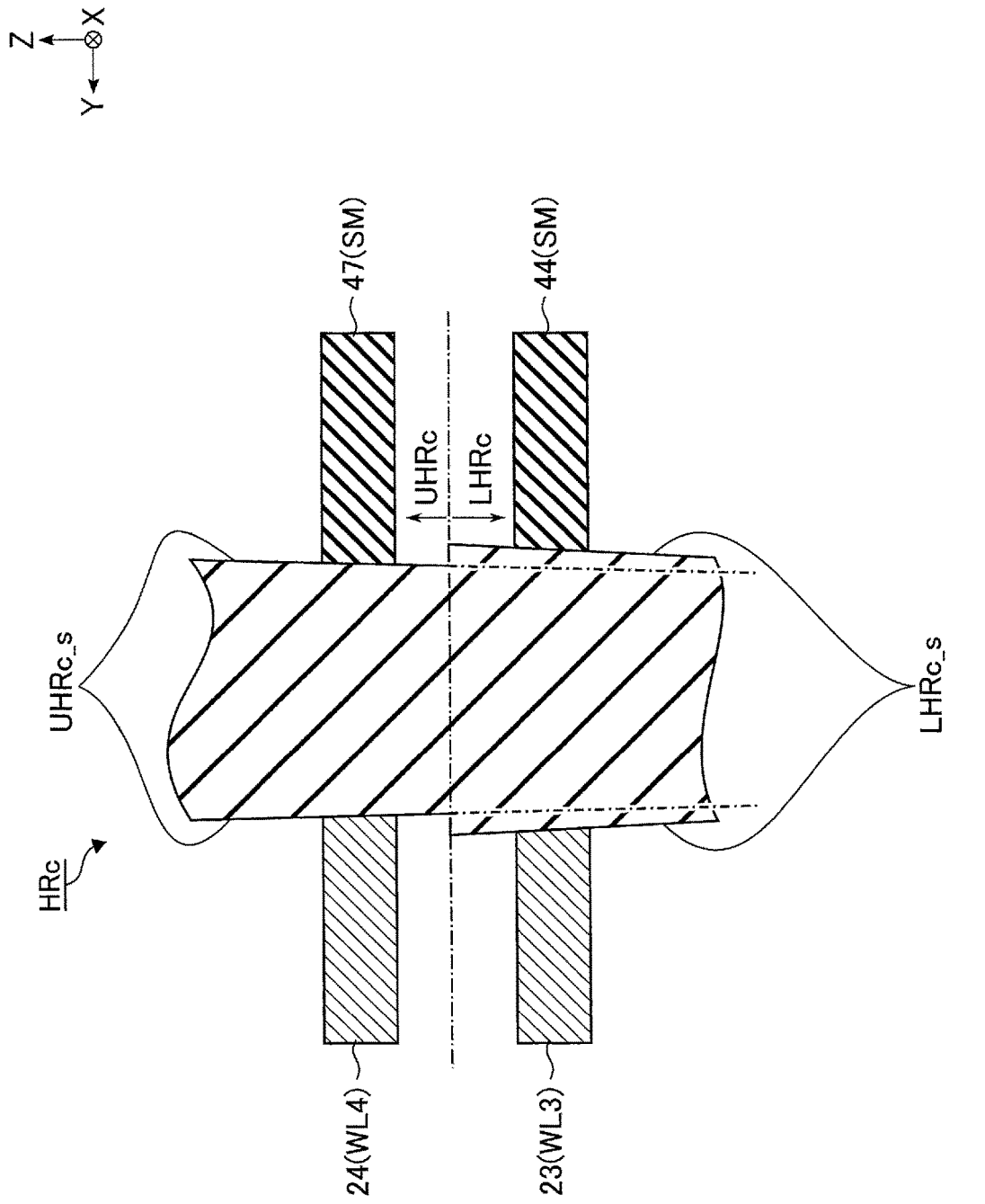
FIG. 35 is an enlarged view of the region XXXV indicated in FIG. 34 and shows an exemplary sectional structure of the memory cell array, for its hookup area, in the semiconductor memory device according to the second embodiment.

FIGS. 34, 35, and 36 show exemplary sectional structures of the memory cell array, for its hookup area, in the semiconductor memory device according to the second embodiment. FIG. 34 is a sectional view taken along the line XXXIV-XXXIV indicated in FIG. 31. FIG. 34 shows, each in Y-Z cross-section, the interconnect layers, the bridging interconnect layer CH, the members SLTa and SLTc, two members OST for the block BLK1, the support pillar HRa that divides the member SLTb, and two support pillars HRc dividing the respective two members OST for the block BLK0 within and near the contact regions C4T for the respective blocks BLK0 and BLK1. FIG. 35 is an enlarged view of the region XXXV indicated in FIG. 34. FIG. 36 is a sectional view taken along the line XXXVI-XXXVI indicated in FIG. 31. FIG. 36 shows, each in X-Z cross-section, three portions of the divided member OST and two support pillars HRc.

As shown in FIGS. 34 to 36, each member OST includes multiple portions extending in the X direction and is arranged between the set including conductive layers 22 to 24 and the set including sacrificial members SM. The Y-Z cross-section of the member OST has, for example, a bowing shape. More specifically, the member OST has different Y-direction lengths, with the minimum length at the upper or the lower end and the maximum length at the given part between the upper and the lower ends. Also, each member OST may have internal voids. In one example, such a void is formed in each of the portions of the member OST formed due to the division by the support pillars HRc. Naturally, each void has an X-direction length shorter than the interval between the two support pillars HRc arranged in the X direction.

The support pillars HRc each have a structure in which an insulator fills the hole extending in the Z direction. The support pillars HRc each penetrate through the stack structure. Each support pillar HRc includes an upper pillar UHRc and a lower pillar LHRc. The lower pillar LHRc has its lower end in contact with the conductive layer 29. The upper end of the lower pillar LHRc and the lower end of the upper pillar UHRc contact each other at a level between the uppermost conductive layer 23 and the lowermost conductive layer 24. The boundary between the upper end of the lower pillar LHRc and the lower end of the upper pillar UHRc is at the same level as the boundary between the upper end of the lower pillar LHRa and the lower end of the upper pillar UHRa. The lower pillar LHRc and the upper pillar UHRc increase their respective X-Y sectional areas from the lower portion toward the upper portion.

Also, the X-Y sectional area of the lower pillar LHRc at its upper end is larger than the X-Y sectional area of the upper pillar UHRc at its lower end. More specifically, the upper end of the lower pillar LHRc is longer in the Y direction than the lower end of the upper pillar UHRc. The lower pillar LHRc has a side face LHRc_s and the upper pillar UHRc has a side face UHRc_s, and the former and the extension of the latter (indicated by the dashed-dotted lines in FIG. 35) are displaced from each other and not in conformity to each other in the Y-Z cross-section. However, the upper end of the lower pillar LHRc and the lower end of the upper pillar UHRc have substantially the same length in the X direction. The side face LHRc_s of the lower pillar LHRc and the extension of the side face UHRc_s of the upper pillar UHRc are in conformity to each other in the X-Z cross-section.

Note that the members SLT and the support pillars HRa and HRb here are of substantially the same structure as those discussed for the first embodiment, except that their lower ends are in contact with the conductive layer 29. Thus, their description will be omitted.

2.2 Method for Manufacturing Semiconductor Memory Device

Figure 37:
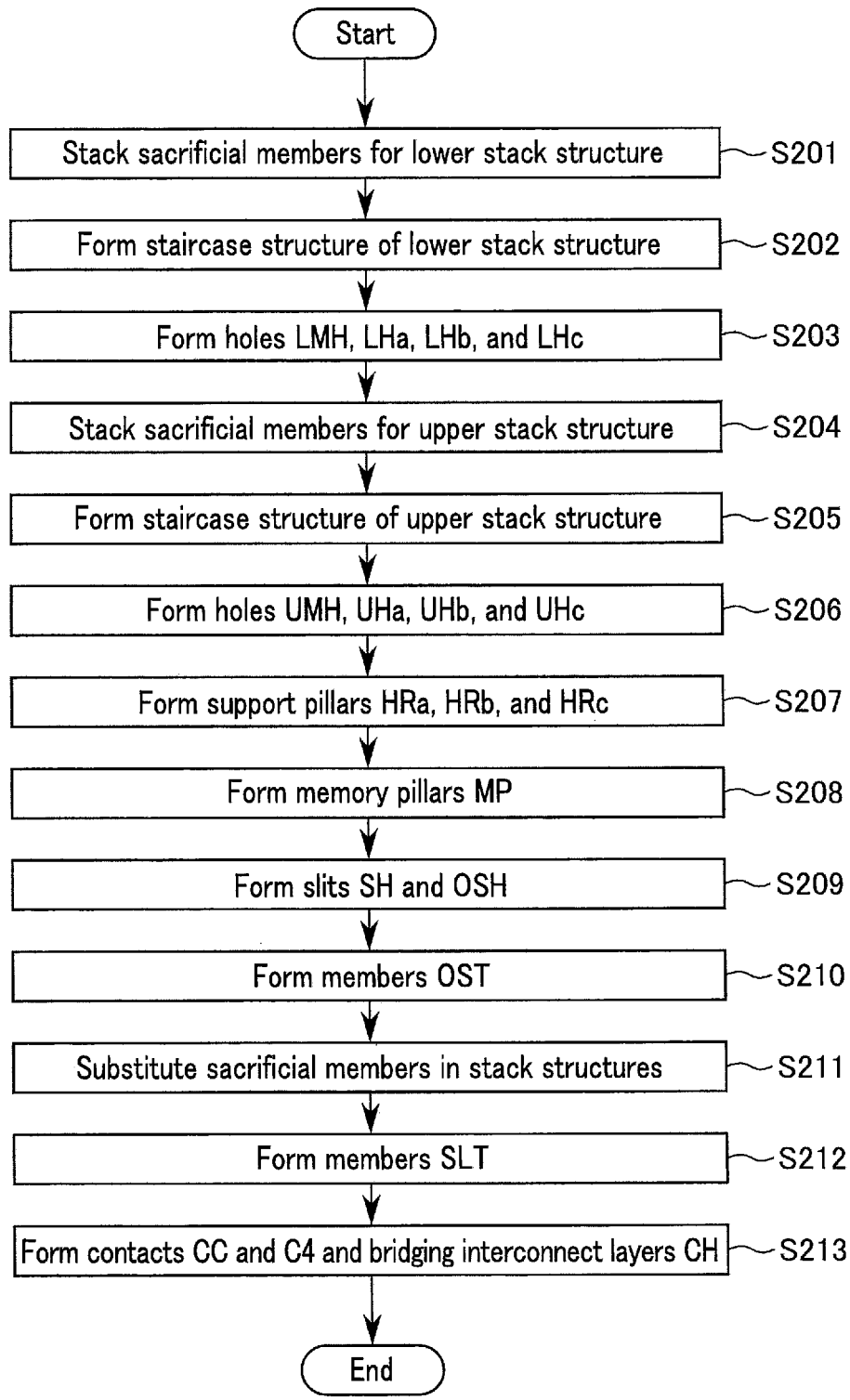
FIG. 37 is a flowchart showing an exemplary method for manufacturing the semiconductor memory device according to the second embodiment.

FIG. 37 is a flowchart showing an exemplary method for manufacturing the semiconductor memory device according to the second embodiment. FIGS. 38 to 48 each show an exemplary planar layout or an exemplary sectional structure, taken during the manufacture of the semiconductor memory device according to the second embodiment. Here, the planar layouts illustrated in the figures each represent the structural part corresponding to FIG. 31. The sectional structures illustrated in the figures each represent the combination of the structural part corresponding to FIG. 34 and a part of the memory area or areas MA. As shown in FIG. 37, a process of manufacturing the semiconductor memory device 3 according to the second embodiment proceeds in an orderly manner with processing steps S201 to S213. Explained below with reference to FIG. 37 is one example of the manufacturing process for the stacked interconnect structure in the memory cell array 10 of the semiconductor memory device 3.

Figure 38:
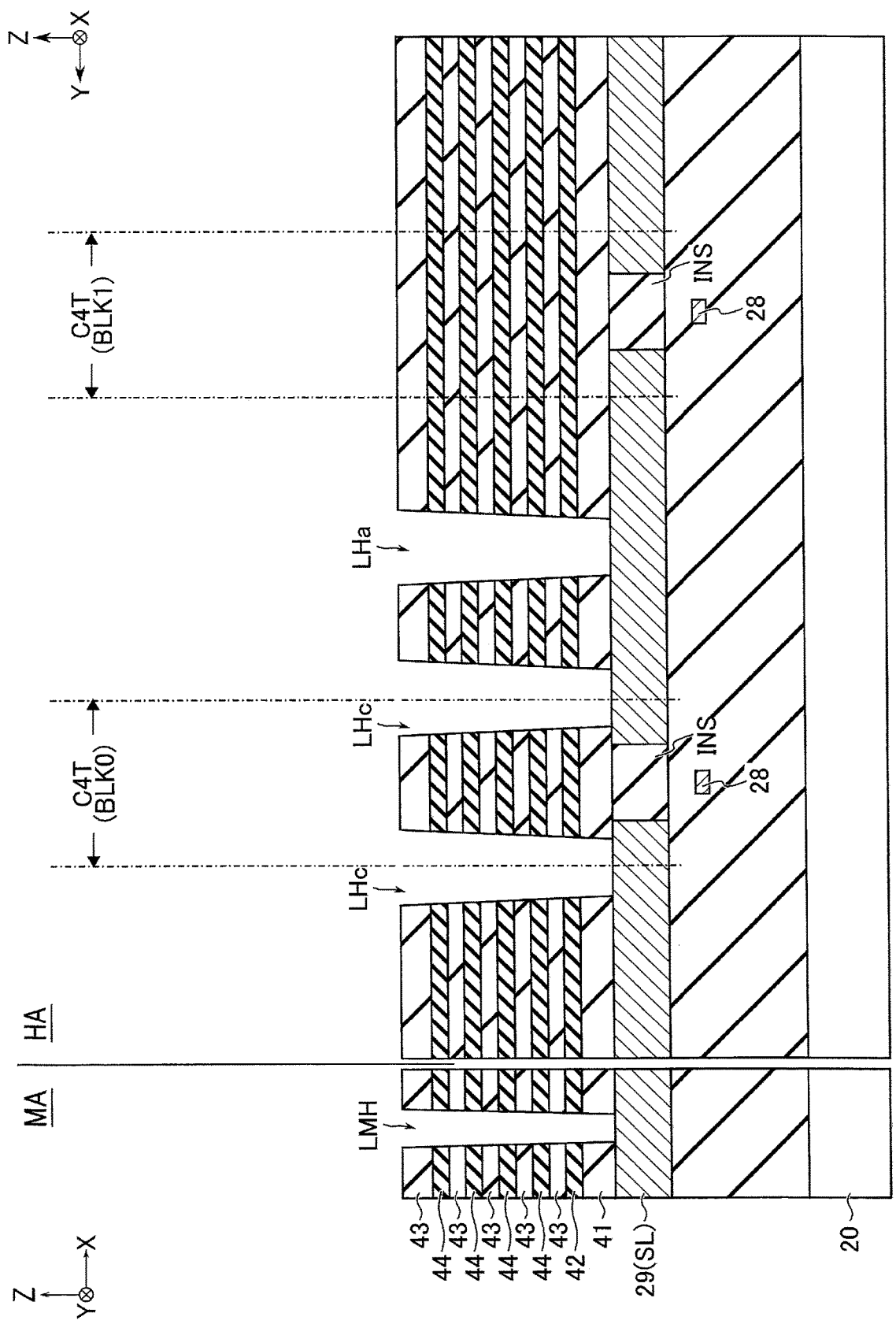
FIG. 38 is a sectional view showing an exemplary sectional structure taken during the manufacture of the semiconductor memory device according to the second embodiment.

First, processing steps S201 to S203 are sequentially conducted so that a lower stack structure including sacrificial members 42 and 44 is formed, a staircase structure of the lower stack structure is formed, and multiple holes LMH, LHa, LHb, and LHc are formed, as shown in FIG. 38. Note that the multiple holes LHb are not illustrated.

The processing steps will be briefly explained. The processing starts with the formation of peripheral circuitry components, such as the row decoder module 15, on the semiconductor substrate 20. A layer constituted by a conductive layer 29 and an insulation layer INS is formed over the peripheral circuitry components. An insulation layer 41 is formed on this layer. A sacrificial member 42 and an insulation layer 43 are formed in this order on the insulation layer 41. Sacrificial members 44 and insulation layers 43 are further alternately stacked on the formed insulation layer 43 (S201).

In the hookup area HA, end portions of the stacked sacrificial members 42 and 44 are processed into a staircase shape. Then, the space due to the staircase portion in the hookup area HA is filled with an insulation layer. To achieve flattening, the upper face of this stack structure is subjected to, for example, CMP (S202).

Subsequently, a mask that opens in portions corresponding to the lower pillars LMP, LHRa, LHRb, and LHRc is formed by photolithography or the like. Then, anisotropic etching is performed with the mask so that the holes LMH, LHa, LHb, and LHc penetrating through, for example, each of the insulation layers 41 and 43 and the sacrificial members 42 and 44 are formed. At the bottom of each of the holes LMH, LHa, LHb, and LHc, the conductive layer 29 is partially exposed (S203). The holes LMH, LHa, LHb, and LHc correspond to the lower pillars LMP, LHRa, LHRb, and LHRc, respectively. The holes LMH, LHa, LHb, and LHc are then each filled with a sacrificial member 45, which may be seen from FIG. 39. The sacrificial member 45 formed on the upper face of the stack structure is removed by, for example, CMP so that the faces corresponding to the respective upper ends of the lower pillars LMP, LHRa, LHRb, and LHRc are exposed.

Figure 39:
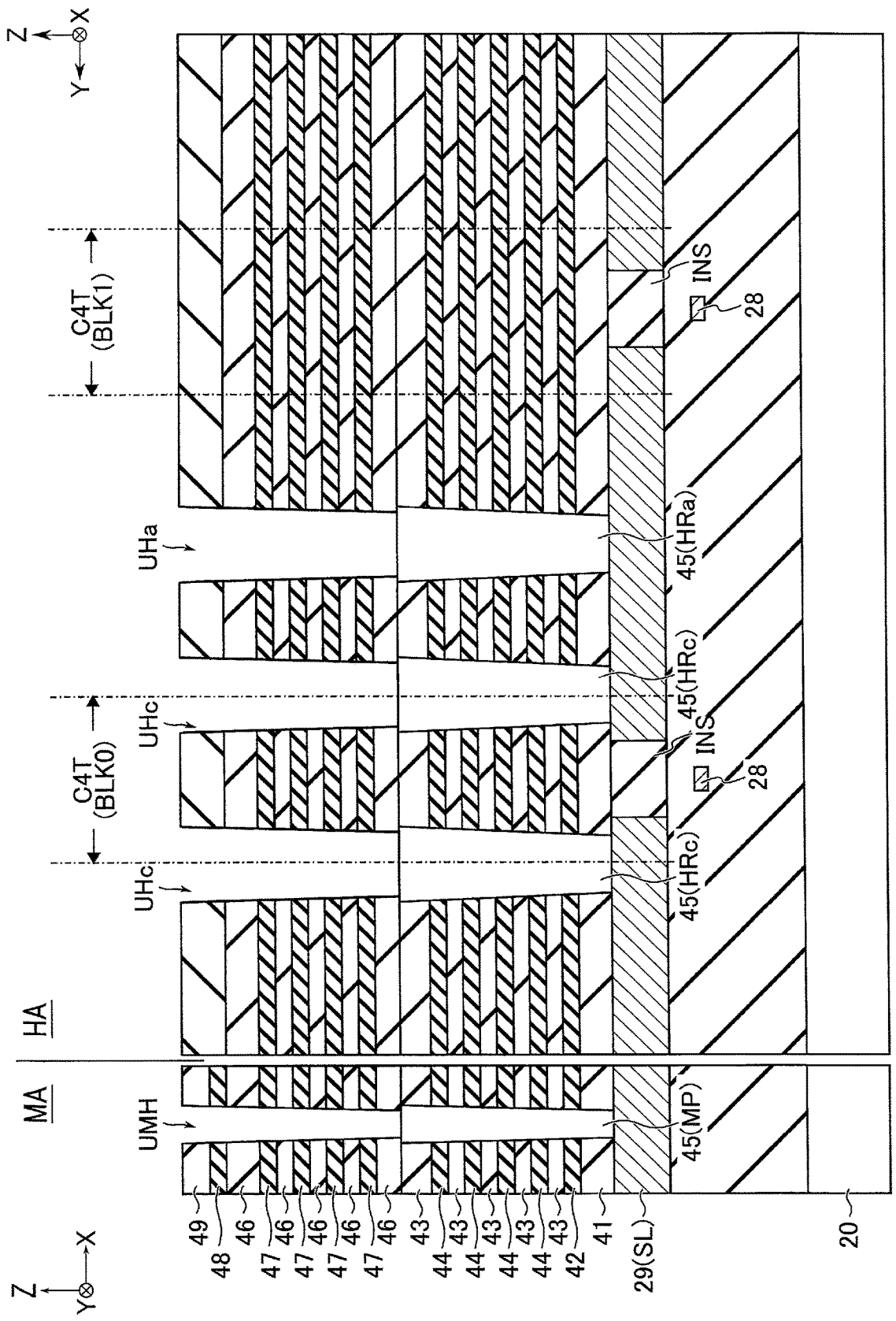
FIG. 39 is a sectional view showing an exemplary sectional structure taken during the manufacture of the semiconductor memory device according to the second embodiment.
Figure 40:
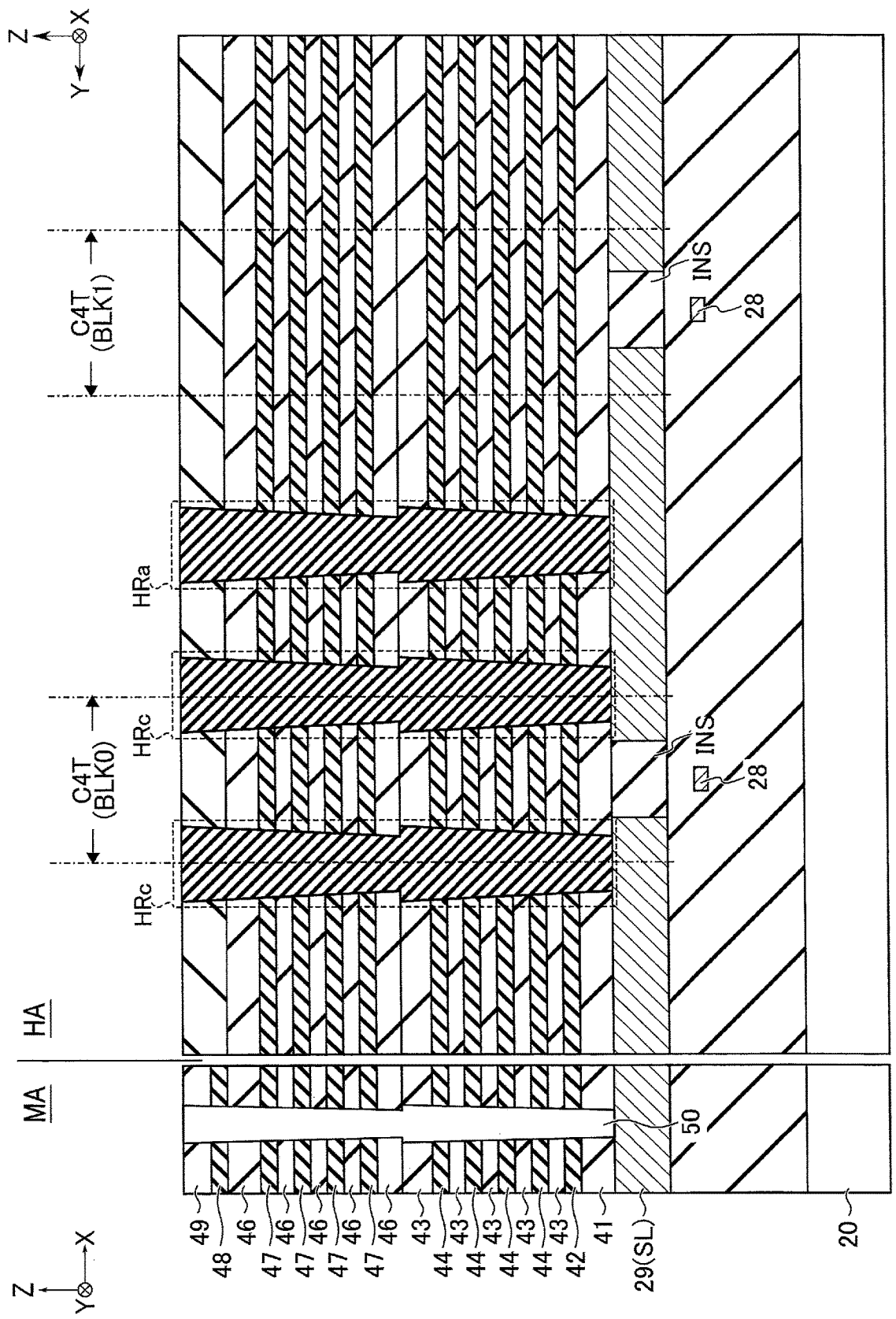
FIG. 40 is a sectional view showing an exemplary sectional structure taken during the manufacture of the semiconductor memory device according to the second embodiment.

Next, processing steps S204 to S206 are sequentially conducted so that an upper stack structure including sacrificial members 47 and 48 is formed, a staircase structure of the upper stack structure is formed, and multiple holes UMH, UHa, UHb, and UHc are formed, as shown in FIG. 39.

These processing steps will be briefly explained. First, an insulation layer 46 is formed on the stack structure. Sacrificial members 47 and insulation layers 46 are further alternately stacked on the formed insulation layer 46. A sacrificial member 48 and an insulation layer 49 are formed in this order on the uppermost insulation layer 46 (S204).

In the hookup area HA, end portions of the stacked sacrificial members 47 and 48 are processed into a staircase shape. Then, the space due to the staircase portion in the hookup area HA is filled with an insulation layer. To achieve flattening, the upper face of this stack structure is subjected to, for example, CMP (S205).

Subsequently, a mask that opens in portions corresponding to the upper pillars UMP, UHRa, UHRb, and UHRc is formed by photolithography or the like. Then, anisotropic etching is performed with the mask so that the holes UMH, UHa, UHb, and UHc are formed. The hole UMH penetrates through, for example, each of the insulation layers 46 and 49 and the sacrificial members 47 and 48. The holes UHa, UHb, and UHc penetrate through, for example, each of the insulation layers 46 and the sacrificial members 47. At the bottom of the hole UMH, the sacrificial member 45(MP) filling the hole LMH is partially exposed. At the bottom of the hole UHa, the sacrificial member 45(HRa) filling the hole LHa is partially exposed. At the bottom of the hole UHb, the sacrificial member 45(HRb) filling the hole LHb is partially exposed. At the bottom of the hole UHc, the sacrificial member 45(HRc) filing the hole LHc is partially exposed (S206). The holes UMH, UHa, UHb, and UHc correspond to the upper pillars UMP, UHRa, UHRb, and UHRc, respectively.

Next, multiple support pillars HRa, HRb, and HRc are formed (S207). More specifically, as seen from FIG. 40, the sacrificial member 45 present in each of the holes LMH, LHa, LHb, and LHc is removed first by wet etching or the like. This forms a hole MH corresponding to the combination of the holes LMH and UMH, a hole Ha corresponding to the combination of the holes LHa and UHa, a hole Hb corresponding to the combination of the holes LHb and UHb, and a hole Hc corresponding to the combination of the holes LHc and UHc (none of which are illustrated). A mask 50 is then formed so as to fill the hole MH. Subsequently, each of the holes Ha, Hb, and Hc is filled with an insulator so that the support pillars HRa, HRb, and HRc are formed.

Figure 41:
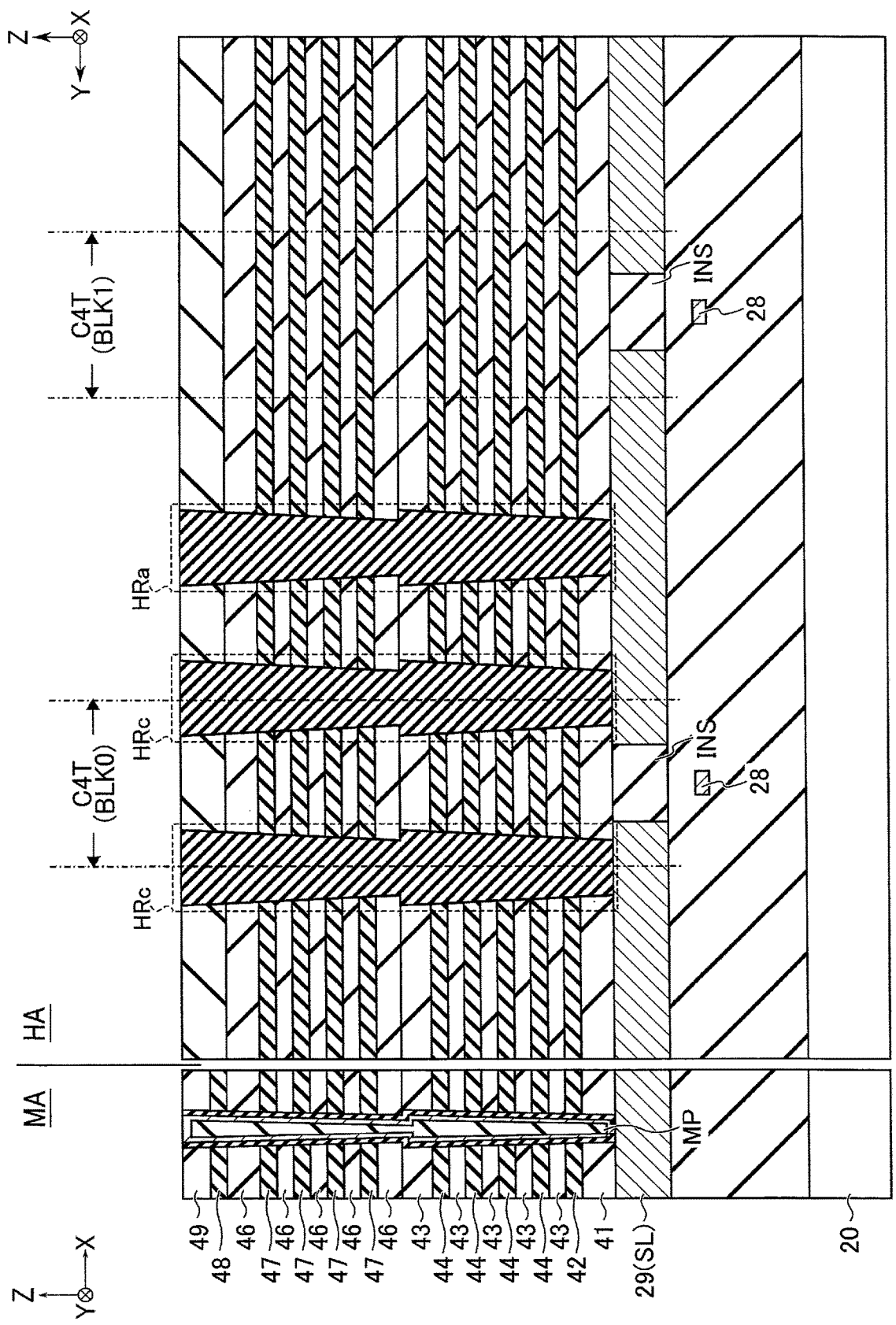
FIG. 41 is a sectional view showing an exemplary sectional structure taken during the manufacture of the semiconductor memory device according to the second embodiment.

Next, multiple memory pillars MP are formed, as seen from FIG. 41 (S208). The formation of the memory pillars MP proceeds in a manner similar to the first embodiment, and its description will thus be omitted.

Figure 42:
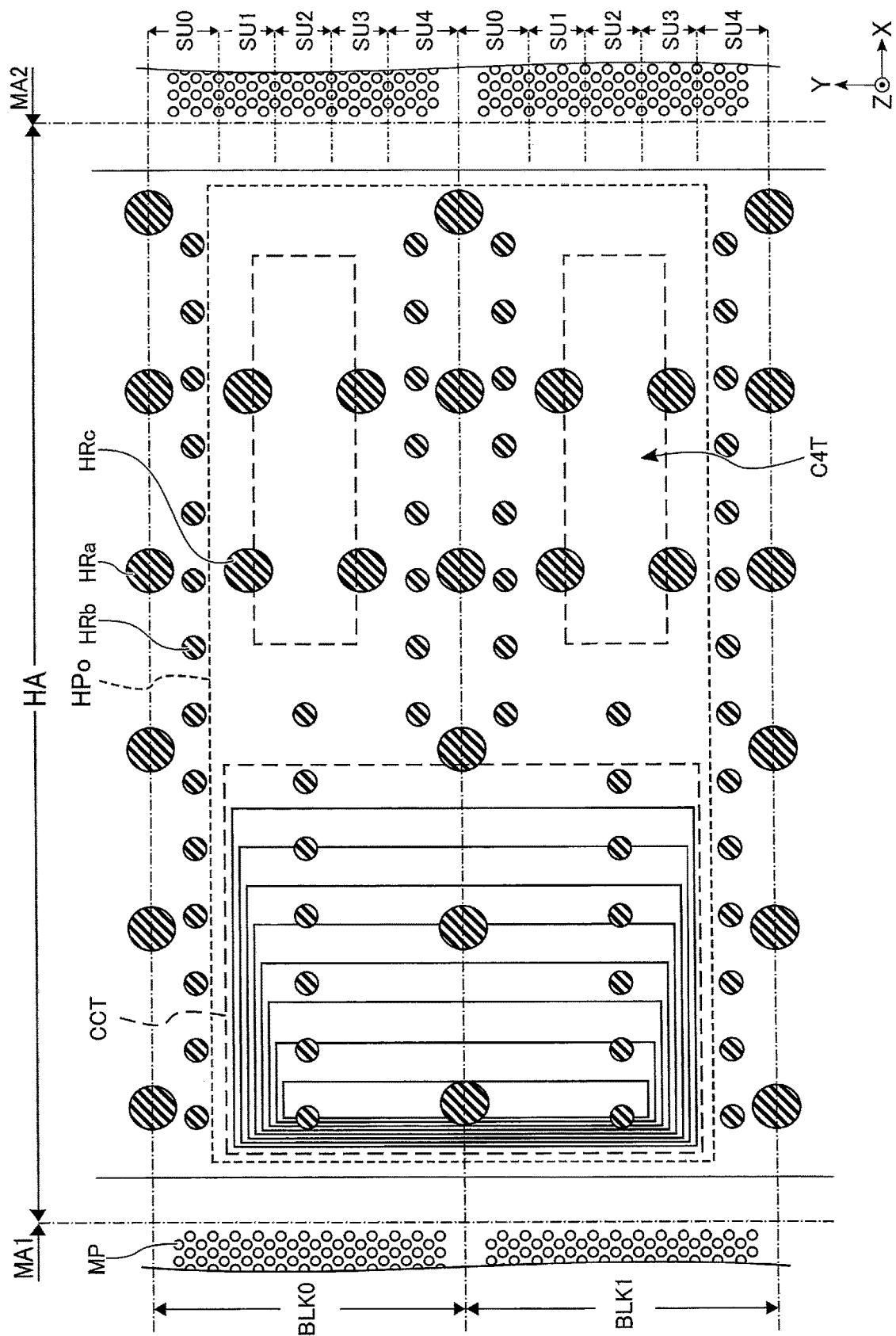
FIG. 42 is a plan view showing an exemplary planar layout taken during the manufacture of the semiconductor memory device according to the second embodiment.

As shown in FIG. 42, the processing steps up to S208 form multiple support pillars HRa, HRb, and HRc in the hookup area HA, while forming multiple memory pillars MP in each of the memory areas MA1 and MA2. The multiple support pillars HRa are arranged in each region where a member SLT will be formed. The multiple support pillars HRc are arranged in each region where a member OST will be formed. The multiple support pillars HRb are suitably arranged in the regions excluding the regions where the members SLT and the support pillars HRa will be formed, where the members OST and the support pillars HRc will be formed, and where the contacts CC and C4 will be formed.

Figure 43:
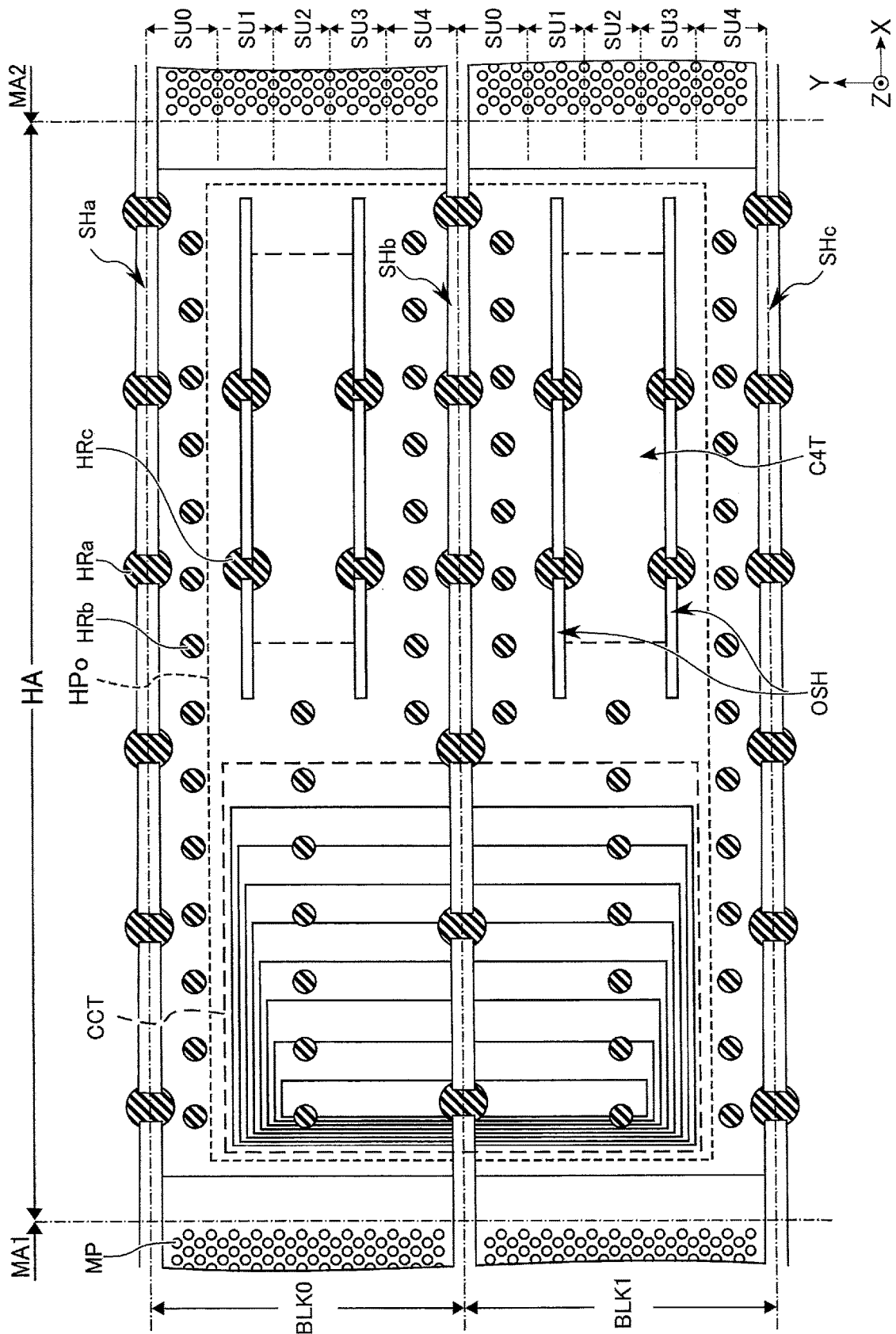
FIG. 43 is a plan view showing an exemplary planar layout taken during the manufacture of the semiconductor memory device according to the second embodiment.
Figure 44:
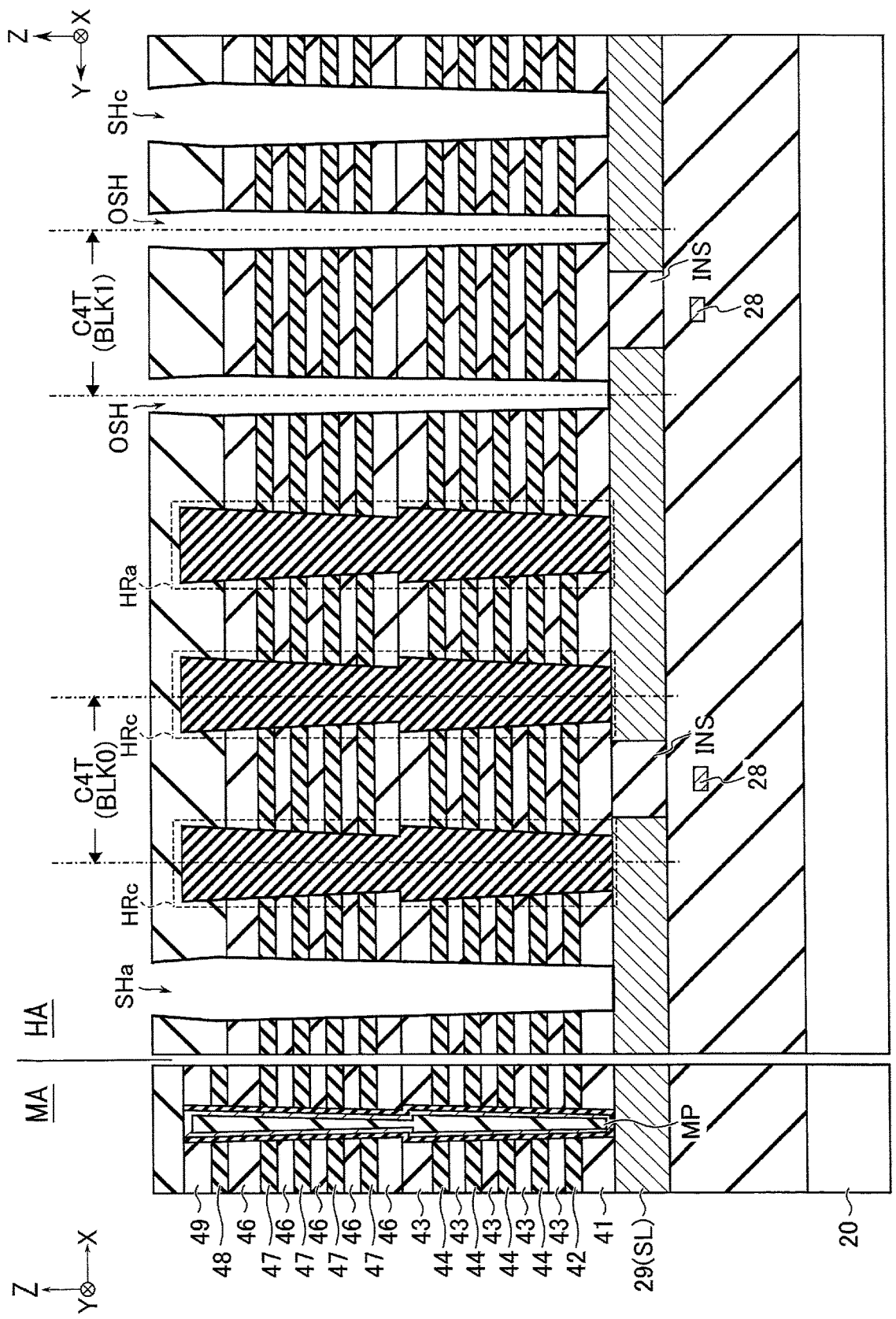
FIG. 44 is a sectional view showing an exemplary sectional structure taken during the manufacture of the semiconductor memory device according to the second embodiment.

Next, multiple slits SH including slits SHa to SHc and multiple slits OSH are formed as shown in FIGS. 43 and 44 (S209). More specifically, a mask that opens in portions corresponding to the respective members SLT and OST is first formed by photolithography or the like. Then, anisotropic etching is performed with the mask so that the slits SH each penetrating through, for example, each of the insulation layers 41, 43, 46, and 49 and the sacrificial members 42, 44, 47, and 48 are formed. The slits OSH each penetrating through, for example, each of the insulation layers 41, 43, and 46 and the sacrificial members 42, 44, and 47 are also formed.

Note that each slit OSH is formed in such a shape in plan view that it is divided into multiple portions while leaving a portion of each support pillar HRc. More specifically, similar to the relationship between the slit SH and one support pillar HRa, the Y-Z end faces of the respective two slit OSH portions, which face each other with an intervening support pillar HRc, each overlap with this support pillar HRc throughout from the upper end to the lower end thereof. Accordingly, the X-direction length of the support pillar HRc equals to the interval between the two portions of the slit OSH that sandwich the support pillar HRc. That is, the upper end of the lower pillar LHRc and the lower end of the upper pillar UHRc have substantially the same length in the X direction.

Figure 45:
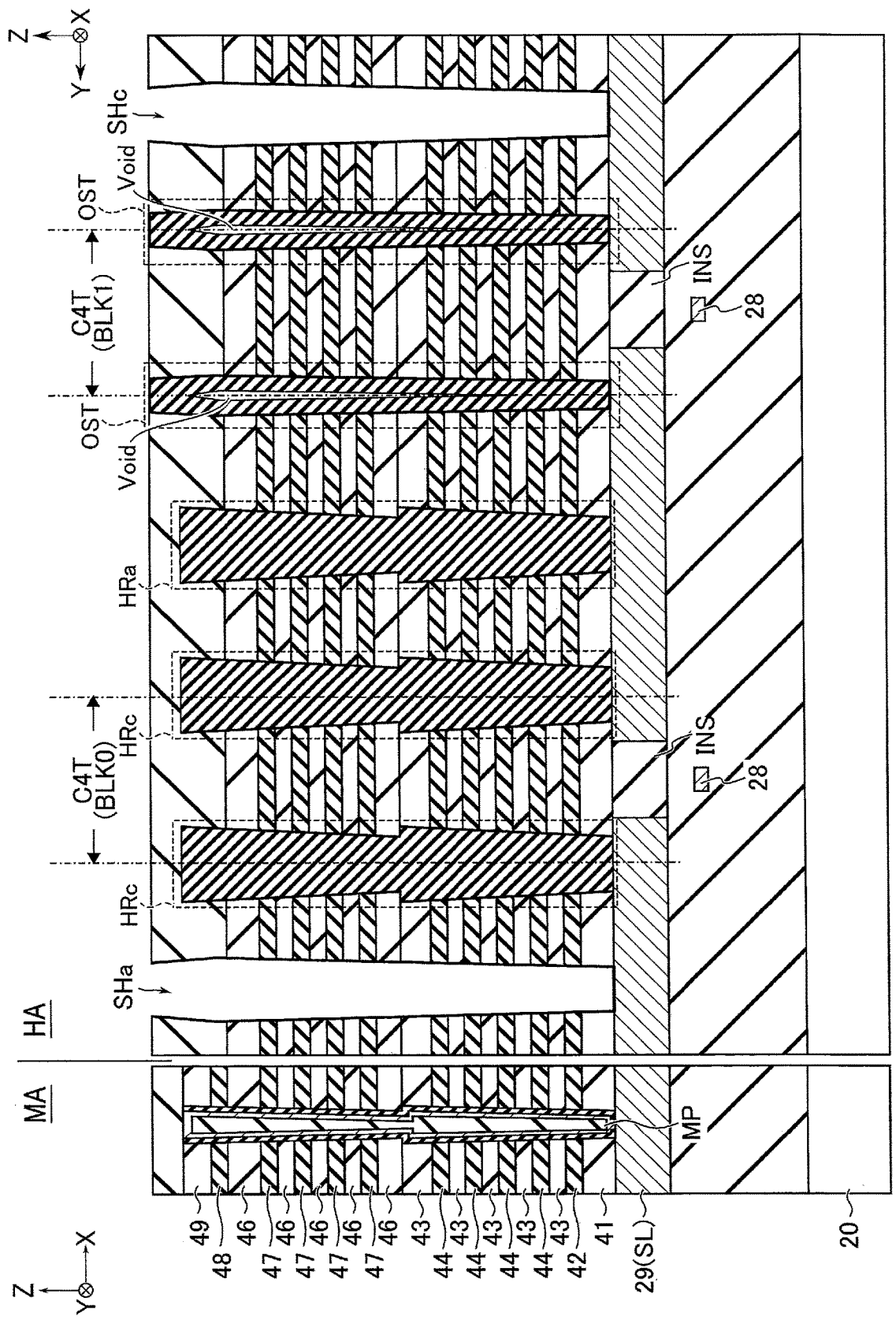
FIG. 45 is a sectional view showing an exemplary sectional structure taken during the manufacture of the semiconductor memory device according to the second embodiment.

Next, as shown in FIG. 45, a member OST is formed in each slit OSH (S210). More specifically, insulators are first formed to cover the side and bottom faces in the slit OSH. Subsequently, the insulator formed outside the slit OSH is removed by, for example, CMP. Here, a void is formed within each member OST. Note that, similar to the member OST, the void is formed in such a shape as to be divided by the support pillars HRc.

Figure 46:
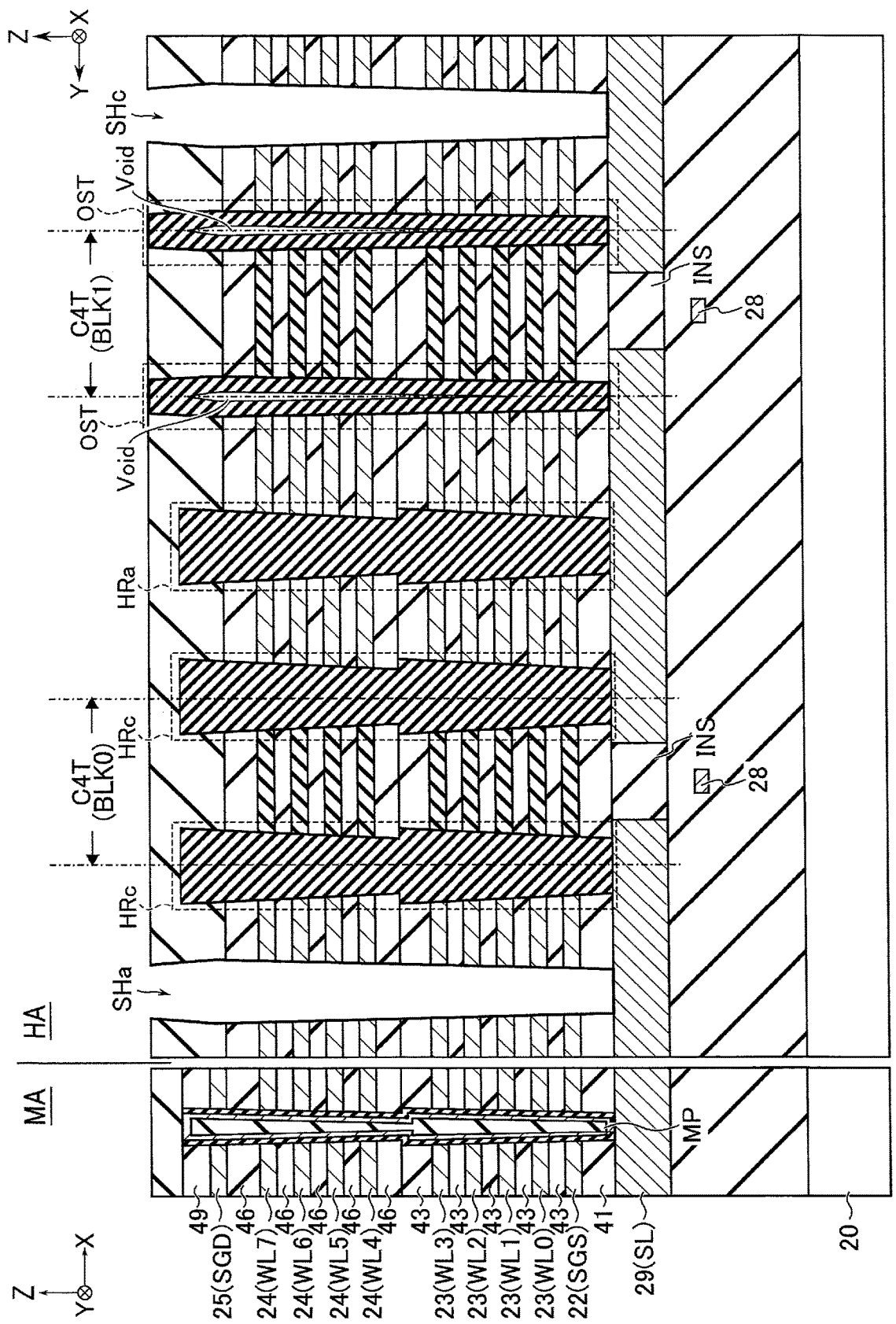
FIG. 46 is a sectional view showing an exemplary sectional structure taken during the manufacture of the semiconductor memory device according to the second embodiment.

Next, a substituting step for the sacrificial members in the stack structure is conducted so that a stacked interconnect structure as shown in FIG. 46 is formed (S211). The sacrificial members are substituted in a manner similar to the first embodiment, and the description of this step will thus be omitted. Note that the sacrificial members SM located in each contact region C4T are not substituted but remain there, as they are not reached by thermal phosphoric acids, etc., due to the shielding by the members OST and the support pillars HRc. As such, among the stacked interconnect structure, the regions overlapping with the respective contact regions C4T serve as insulation regions.

Figure 47:
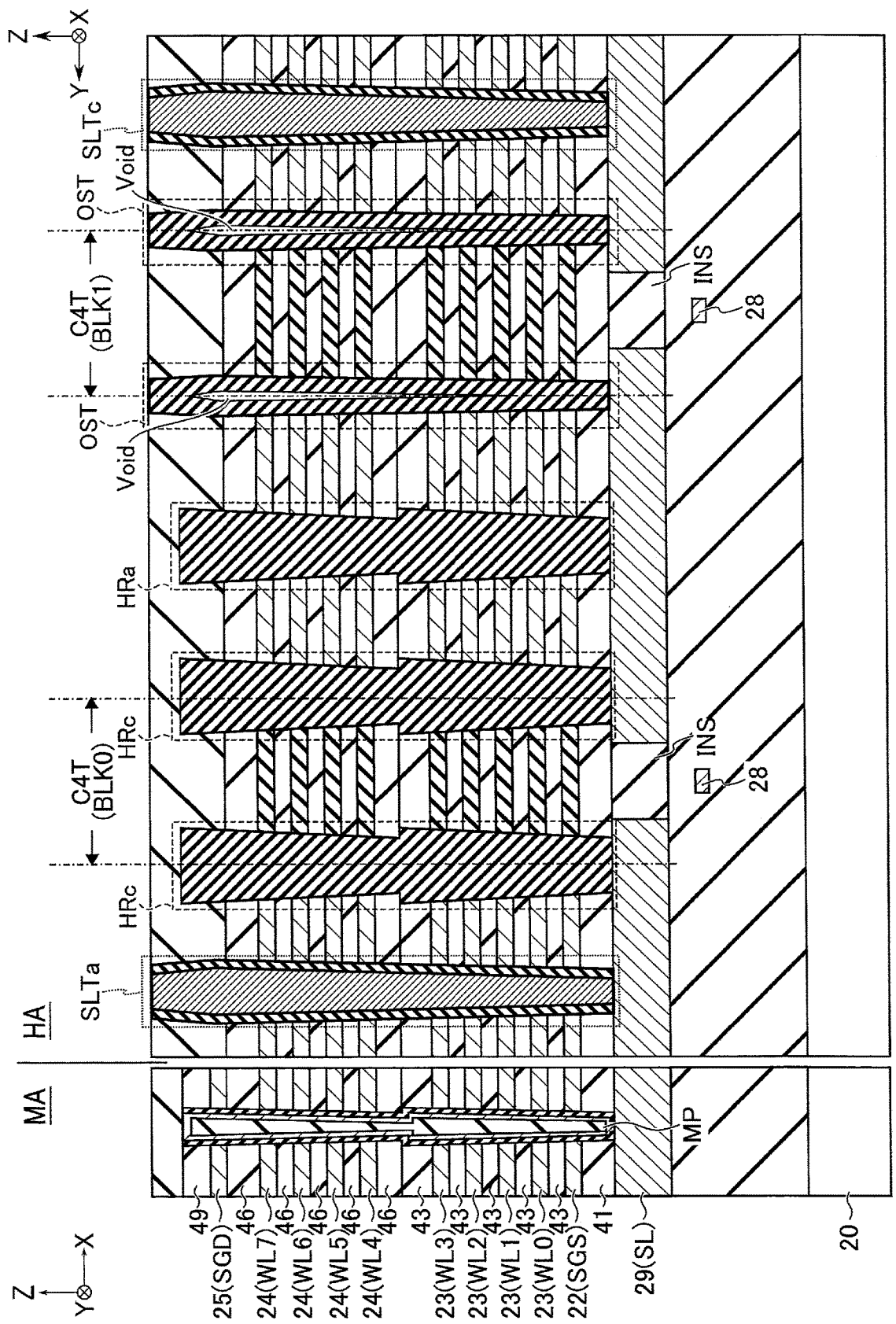
FIG. 47 is a sectional view showing an exemplary sectional structure taken during the manufacture of the semiconductor memory device according to the second embodiment.

Next, as shown in FIG. 47, a member SLT is formed in each slit SH (S212). The formation of the members SLT proceeds in a manner similar to the first embodiment, and its description will thus be omitted.

Figure 48:
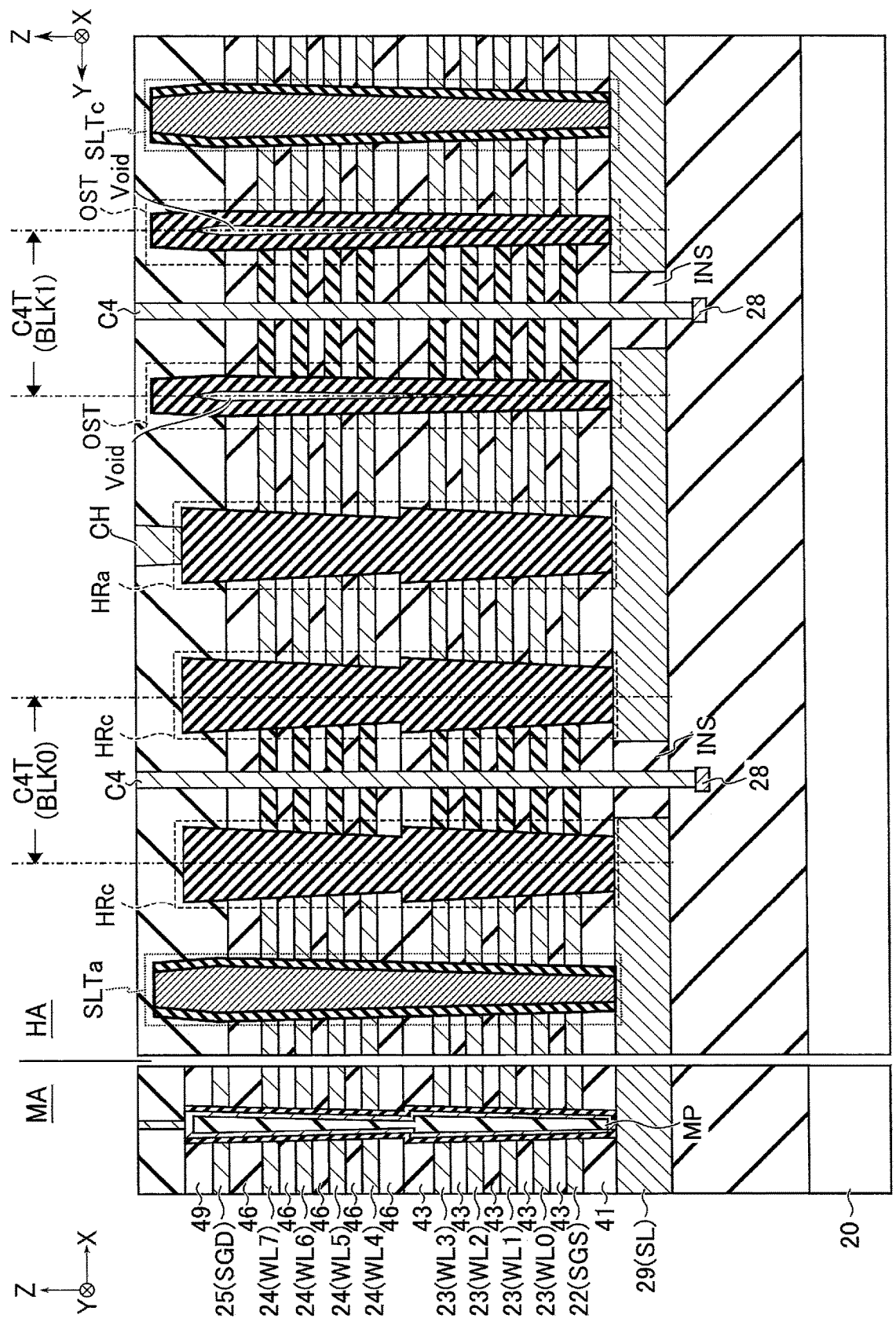
FIG. 48 is a sectional view showing an exemplary sectional structure taken during the manufacture of the semiconductor memory device according to the second embodiment.

Lastly, multiple contacts CC and C4, and multiple bridging interconnect layers CH are formed as shown in FIG. 48 (S213). More specifically, a mask that opens in portions corresponding to the contacts C4 is formed by photolithography or the like. Then, anisotropic etching is performed with the mask so that holes penetrating through, for example, the corresponding contact region C4T are formed. At the bottom of each hole, the corresponding conductive layer 28 is exposed. The holes are then each filled with a conductor. The conductor formed on the upper face of the stack structure is removed by, for example, CMP so that the faces corresponding to the respective upper ends of the multiple contacts C4 are exposed.

The formation of the contacts CC and the bridging interconnect layers CH proceeds in a manner similar to the first embodiment, and its description will thus be omitted.

The stacked interconnect structure in the memory cell array 10 is thus formed by the manufacturing process described above. However, the manufacturing process is only an example and does not pose a limitation. For example, other processing steps may be inserted in the course of the manufacturing process, or some of the processing steps may be omitted or integrated together. The manufacturing steps may be interchanged where possible. As one example, the step of forming memory pillars MP and the step of forming support pillars HRa, HRb, and HRc are interchangeable.

2.3 Effects of Embodiment

The contact region CCT is arranged so that it straddles the member SLT located between two blocks and overlaps with a Y-direction portion of each of these two blocks. As such, in the region including the contact region CCT, the stack structure for each block BLK has a Y-Z cross-section asymmetric with respect to the central axis extending along the Z direction, as in the case of the first embodiment. Due to this, the stack structures in the region including the contact region CCT could experience an occurrence of a stress that could incline the stack structures in the Y direction during the formation of the conductive layers 22 to 25.

In the hookup area HA, two members OST extending in the X direction are arranged in the Y direction so as to sandwich each contact region C4T. Due to this, during the formation of the conductive layers 22 to 25, a portion of the stack structure which is located between one slit SH and one member OST is placed in a state where its one side is supported by the member OST while the other side is free from restrictions. Further, the presence of the void in each member OST would even reduce the restrictive force in the Y direction for the stack structures. As a result, the stack structures in regions including the contact regions C4T could experience inclination during the formation of the conductive layers 22 to 25.

According to the second embodiment, in the regions including the respective contact regions CCT and C4T in the hookup area HA, the support pillars HRa physically connect between the stack structures formed due to the splitting by the slit SH. This allows one neighboring stack structure to share the Y-direction stress with the other neighboring stack structure via the support pillars HRa. Therefore, it is possible to suppress the inclinations of the stack structures in the regions including the respective contact regions CCT and C4T.

Also, the support pillars HRc are arranged at positions to divide the corresponding member OST extending in the X direction. The slit OSH is formed in such a shape as to be divided into multiple portions while leaving a portion of each support pillar HRc. Accordingly, the void in the member OST can be formed in such a shape that it is divided into multiple portions by the support pillars HRc. This provides an effect of causing the stack structures on the respective sides of the member OST to restrict each other. Thus, the inclinations of the stack structures in the regions including the contact regions C4T can be further suppressed.

Also, each support pillar HRc has a double-decker structure constituted by the lower pillar LHRc and the upper pillar UHRc, in which the side face LHRc_s of the lower pillar LHRc and the extension of the side face UHRc_s of the upper pillar UHRc are displaced from each other in the Y-Z cross-section. That is, the support pillars HRc and the other support pillars HRa and HRb are formed at once. Accordingly, the embodiment does not require an additional step for forming the support pillars HRc, while realizing the suppression of inclinations of the stack structures. Therefore, an increase in manufacturing load of the semiconductor memory device 3 can be reduced.

2.4 Modifications

The second embodiment is not limited to the examples discussed above. The second embodiment may adopt various modifications which may be similar in the cases of the first embodiment.

2.4.1 First Modification of Second Embodiment

Figure 49:
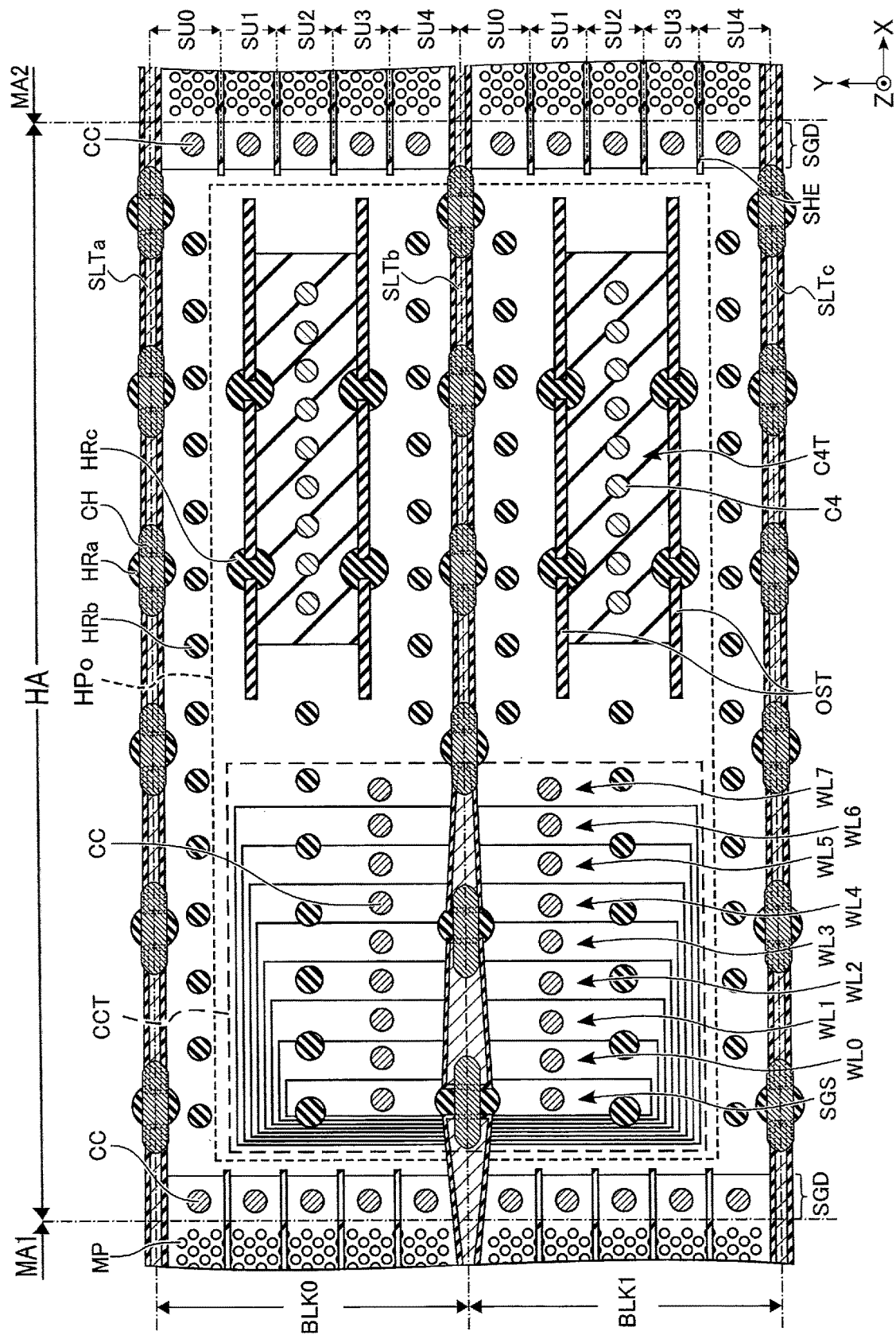
FIG. 49 is a plan view showing a detailed exemplary planar layout of a memory cell array, for its hookup area, in a semiconductor memory device according to a first modification of the second embodiment.

FIG. 49 is a plan view showing a detailed exemplary planar layout of the memory cell array, for its hookup area, in the semiconductor memory device according to a first modification of the second embodiment. FIG. 49 corresponds to FIG. 31.

As shown in FIG. 49, the member SLTb for the portion overlapping with the contact region CCT varies the Y-direction width such that it is wider at the position which contacts the terrace portion of a lower layer. While illustration is omitted from the figure, the member SLTd for the portion overlapping with the corresponding contact region CCT likewise varies the Y-direction width such that it is wider at the position which contacts the terrace portion of a lower layer. For the portions not overlapping with the respective contact regions CCT, the members SLTb and SLTd do not show a substantial change in Y-direction width. Meanwhile, the members SLTa and SLTc do not overlap with the contact regions CCT and therefore do not show a substantial change in Y-direction width, irrespective of the positions in the X direction.

In the contact region CCT, the support pillars HRa that contact a lower layer terrace portion can have an X-Y sectional area larger than that of the support pillars HRa that contact an upper layer terrace portion. As a concrete structure, each support pillar HRa arranged in the contact region CCT has a Y-direction length greater than the width of the member SLTb (or SLTd) at the same position. Meanwhile, outside the contact region CCT, the support pillars HRa do not substantially differ from one another in X-Y sectional area, irrespective of the arrangement positions in the X-direction.

In the contact region CCT, the support pillars HRb that contact a lower layer terrace portion can have an X-Y sectional area larger than that of the support pillars HRb that contact an upper layer terrace portion. Meanwhile, outside the contact region CCT, the support pillars HRb do not substantially differ from one another in X-Y sectional area, irrespective of the arrangement positions in the X-direction.

The support pillars HRc are not arranged in the contact region CCT. Thus, the support pillars HRc do not substantially differ from one another in X-Y sectional area, irrespective of the arrangement positions in the X-direction.

As described above, the support pillars HRa and the support pillars HRb are formed at once. That is, the holes Ha for the formation of the support pillars HRa are created by subjecting the stack structure constituted by the oxide films and the nitride films to anisotropic etching. Thus, as in the first modification of the first embodiment, the X-Y sectional area of one support pillar HRa can be larger than that of another support pillar HRa, according to the increase in width of the corresponding member SLT.

2.4.2 Second Modification of Second Embodiment

The first modification of the second embodiment has assumed an instance where the support pillars HRa that contact a lower layer terrace portion have a larger X-Y sectional area, but no limitation is intended by this. In other instances, the support pillars HRa may be provided so that their respective X-Y sectional areas do not differ from one another, irrespective of their arrangement positions.

FIG. 50 is a plan view showing a detailed exemplary planar layout of the memory cell array, for its hookup area, in the semiconductor memory device according to a second modification of the second embodiment. FIG. 50 corresponds to FIG. 49. As shown in FIG. 50, the member SLTb for the portion overlapping with the contact region CCT varies the Y-direction width such that it is wider at the position which contacts the terrace portion of a lower layer. Turning to the support pillars HRa and HRb in the contact region CCT, they do not show a substantial difference in X-Y sectional area from one another, irrespective of the depths of layers of the contacting terrace portions. For example, the X-Y sectional area of each of the support pillars HRa and HRc may be of a size comparable to that of the X-Y sectional area of one support pillar HRb.

In the example shown in FIG. 50, two support pillars HRa arranged in the Y direction are used for dividing the member SLT into two portions, as in the second modification of the first embodiment. Assuming that the portion of the stacked interconnect structure corresponding to the block BLK0 is a first portion and the portion of the stacked interconnect structure corresponding to the block BLK1 is a second portion, a third portion of the stacked interconnect structure that is separate from both the first and second portions is present between the two support pillars HRa arranged in the Y direction. That is, in plan view, the third portion of the stacked interconnect structure is surrounded by two portions of the member SLT and two support pillars HRa.

Also, in order to divide the member OST into two portions, two support pillars HRc arranged in the Y direction are used. Between the two support pillars HRc arranged in the Y direction, there is a portion of the stack structure constituted by the sacrificial members SM, namely, a second portion of the stack structure, which is separate from both the stacked interconnect structure constituted by the conductive layers 22 to 24 and a first portion of the stack structure constituted by the sacrificial members SM. That is, in plan view, the second portion of the stack structure is surrounded by two portions of the member OST and two support pillars HRc.

In the second modification of the second embodiment, the relationship between the support pillars HRa and the member SLT, and the relationship between the support pillars HRc and the member OST are each similar to the relationship between the support pillars HRa and the member SLT, discussed for the second modification of the first embodiment.

With the above structure, the stack structure can be split into portions for the respective blocks BLK by the formation of the slits SH, and the two neighboring stack structures formed by the splitting can be physically connected to each other, without requiring the X-Y sectional areas of the support pillars HRa to be increased according to the increase in the width of the corresponding member SLT. Therefore, it is possible to suppress the inclinations of the stack structures during the formation of the conductive layers 22 to 25.

It is also possible to prevent, by adopting the same opening size for the holes Ha to Hc, the over-etching of the holes Ha and Hc as compared to the etching of the holes Hb that would otherwise occur when the opening size of the holes Ha and Hc is large and the opening size of the holes Hb is small. Accordingly, the manufacturing load of the support pillars HRa to HRc can be reduced.

2.4.3 Third Modification of Second Embodiment

The second embodiment has assumed that the support pillars HRa arranged in the respective two boundary parts sandwiching a block BLK are located at the positions equivalent to each other with respect to the X direction. It has been also assumed that the support pillars HRc sandwiching a contact region C4T are located at the positions equivalent to each other with respect to the X direction. However, no limitation is intended by these. For example, the multiple support pillars HRa and the multiple support pillars HRc may instead be arranged in a staggered pattern.

Figure 51:
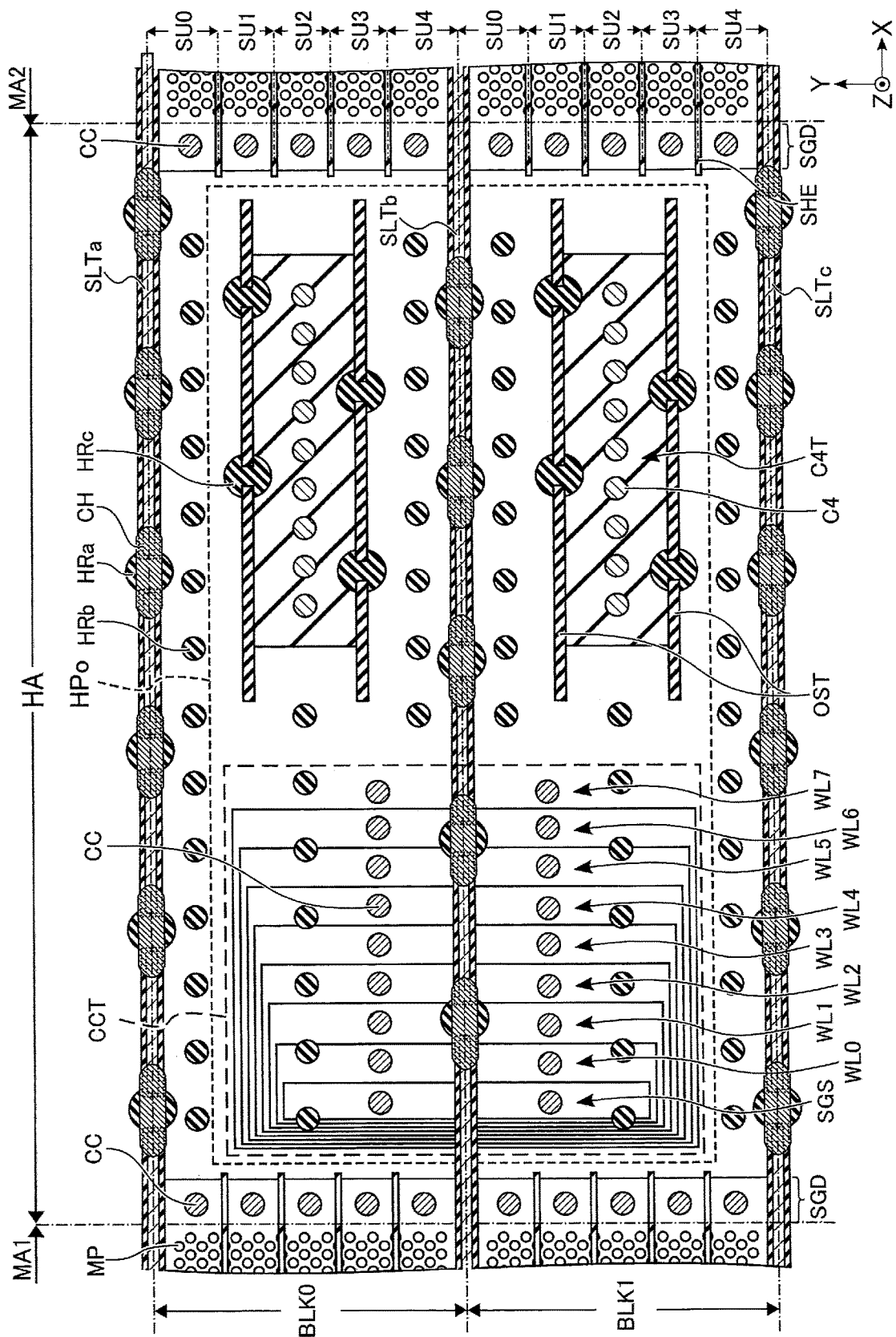
FIG. 51 is a plan view showing a detailed exemplary planar layout of a memory cell array, for its hookup area, in a semiconductor memory device according to a third modification of the second embodiment.

FIG. 51 is a plan view showing a detailed exemplary planar layout of the memory cell array, for its hookup area, in the semiconductor memory device according to a third modification of the second embodiment. FIG. 51 corresponds to FIG. 31.

As shown in FIG. 51, the support pillars HRa arranged in the respective two boundary parts sandwiching the block BLK0 are located at positions different from each other with respect to the X direction. The support pillars HRa arranged in the respective two boundary parts sandwiching the block. BLK1 are located at positions different from each other with respect to the X direction. Meanwhile, the support pillars HRa arranged in the respective two boundary parts sandwiching the blocks BLK0 and BLK1 are located at positions equivalent to each other with respect to the X direction. The support pillars HRc sandwiching the associated contact region C4T are located at positions different from each other with respect to the X direction.

Such a structure also allows one stack structure to share the Y-direction stress, which occurs therein during the substituting step for the sacrificial members, with another stack structure via the support pillars HRa. Also, the void in each member OST can be formed in such a shape as to be divided by the support pillars HRc. Therefore, the same effects as in the second embodiment can be attained.

3. OTHER MODIFICATIONS

The foregoing embodiments, etc. have assumed the instances where the support pillars HRa are arranged in the hookup areas HA, but this is not a limitation.

Figure 52:
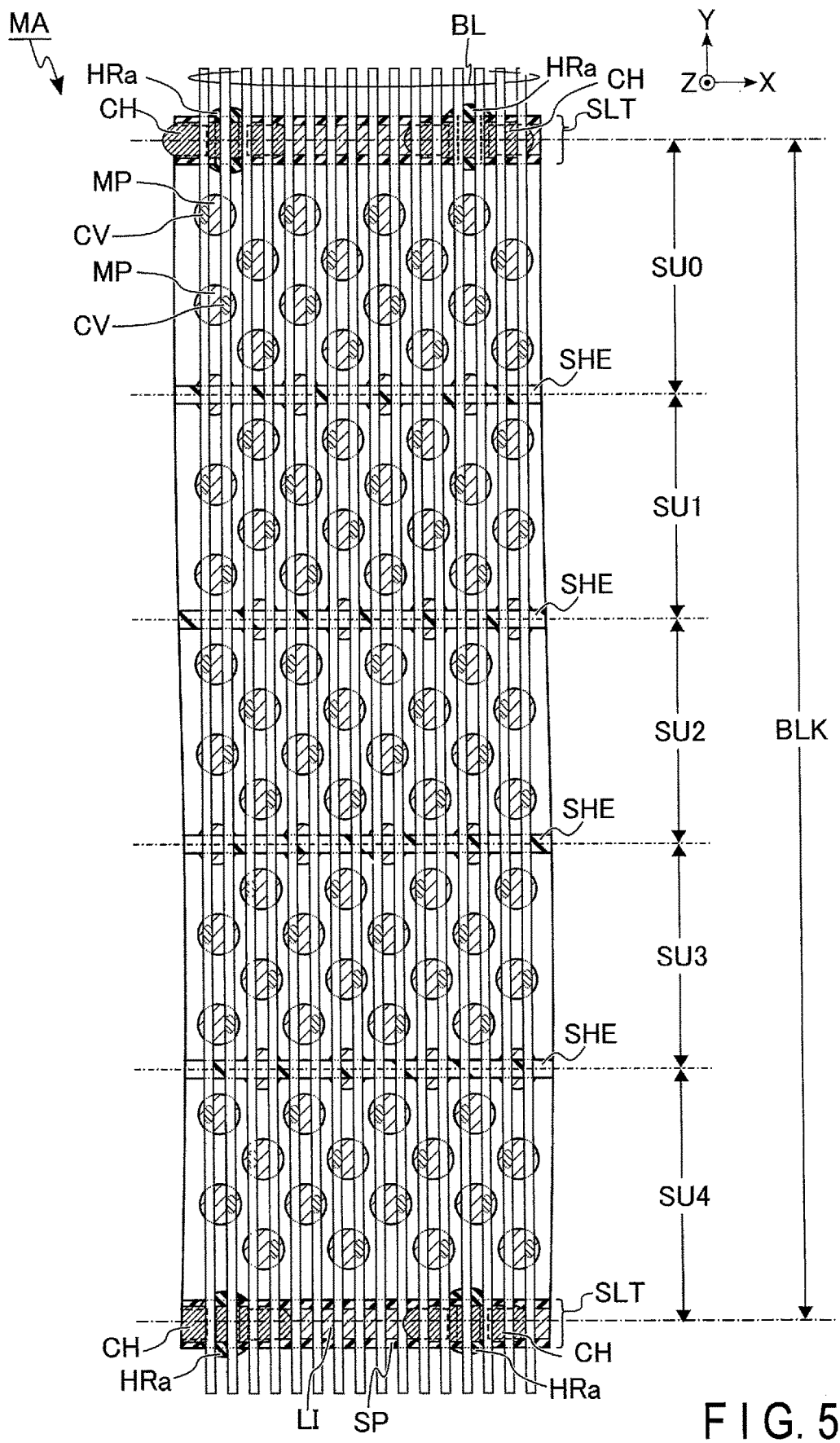
FIG. 52 is a plan view showing a detailed exemplary planar layout of a memory cell array, for its memory area, in a semiconductor memory device according to a first common modification.

FIG. 52 is a plan view showing a detailed exemplary planar layout of the memory cell array, for its memory area, in the semiconductor memory device according to a first common modification. FIG. 52 corresponds to FIG. 4. As shown in FIG. 52, the support pillars HRa may be arranged in the regions where the boundary part between two neighboring blocks BLK and the memory area MA overlap with each other.

In the memory area MA, the stacked interconnect structures each have a Y-Z cross-section which, as compared to the Y-Z cross-sections of the stacked interconnect structures in the hookup areas HA1 and HA2, is more symmetrical with respect to the central axis extending along the Z direction. Despite this, the Y-Z cross-section could become asymmetric when the locations for forming memory pillars MP are biased with respect to the region for forming the slit SH. As such, the stacked interconnect structures in the memory area MA also carry the risk of inclination occurrence.

According to the first common modification, the support pillars HRa are arranged in the region where the memory area MA and the boundary part overlap with each other, and the support pillars HRa divide the corresponding member SLT into portions. Accordingly, in the memory area MA also, the neighboring stack structures are physically connected to each other via the support pillars HRa during the substituting step for the sacrificial members. This allows one stack structure to share the Y-direction stress with another stack structure via the support pillars HRa in the memory area MA. Thus, the inclinations of the stacked interconnect structures in the memory area MA can be suppressed.

Also, the foregoing embodiments, etc. have assumed the instances where the X-Y sectional area of the lower pillar LHRa at its upper end is larger than the X-Y sectional area of the upper pillar UHRa at its lower end, and the X-Y sectional area of the lower pillar LHRc at its upper end is larger than the X-Y sectional area of the upper pillar UHRc at its lower end. However, the embodiments, etc. are not limited to such instances.

Figure 53:
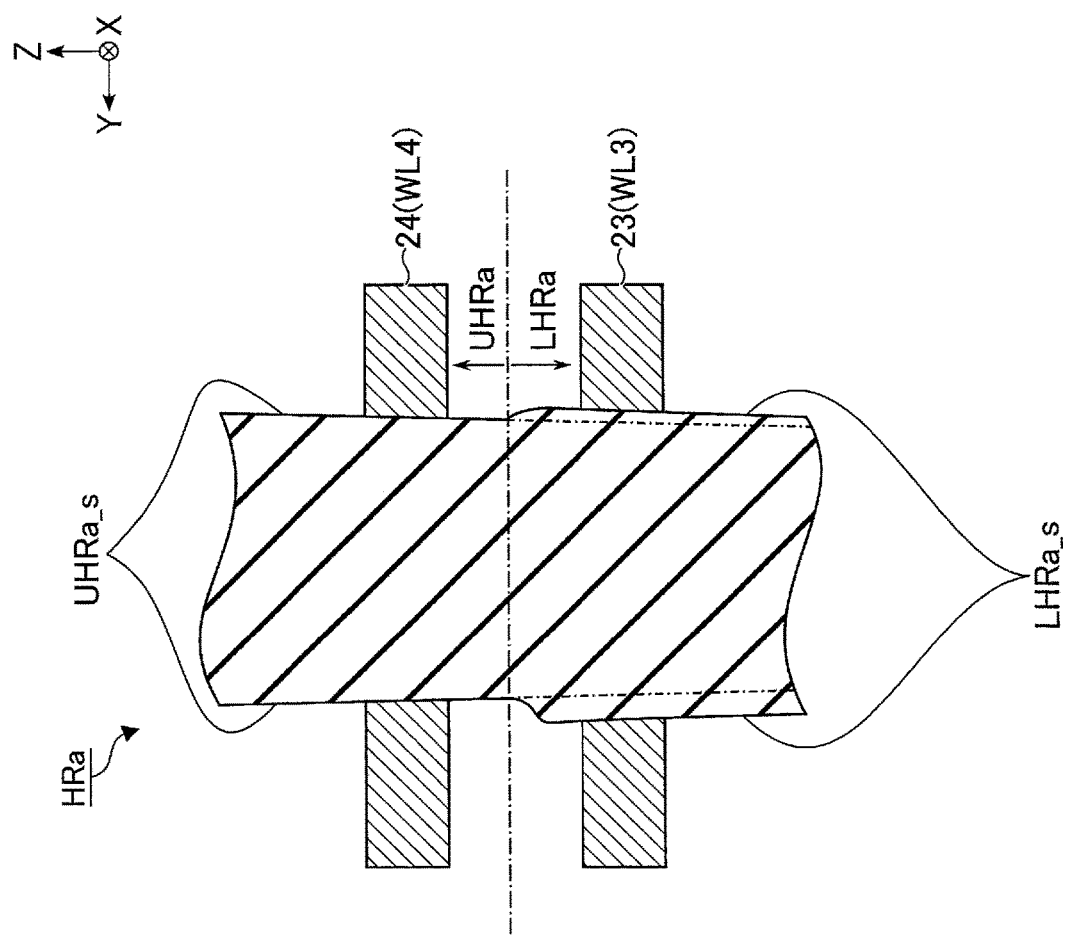
FIG. 53 is a sectional view showing an exemplary sectional structure of a support pillar according to a second common modification.

FIG. 53 is a sectional view showing an exemplary sectional structure of the support pillar according to a second common modification. FIG. 53 corresponds to FIG. 11. As shown in FIG. 53, the upper end of the lower pillar LHRa is not angular but has a rounded profile. As such, it is not apparent in FIG. 53 whether the X-Y sectional area of the lower pillar LHRa at its upper end is larger than the X-Y sectional area of the upper pillar UHRa at its lower end or not.

However, the support pillar HRa in the example shown in FIG. 53 is also formed to have a double-decker structure, and therefore, its side face in the Y direction is discontinuous at the portion of the boundary between the upper and lower pillars. Thus, in the Y-Z cross-section, the side face LHRa_s of the lower pillar LHRa is displaced from the extension of the side face UHRa_s of the upper pillar UHRa (indicated by the dashed-dotted lines in FIG. 53). That is, the X-Y sectional area of the lower pillar LHRa at its upper end is not required to be larger than the X-Y sectional area of the upper pillar UHRa at its lower end.

Note that the features described above for the support pillars HRa are also seen in the support pillars HRb and HRc, as well as in the memory pillars MP. The exception is that, in the support pillars HRb and the memory pillars MP, the displacement between the two side surfaces is present not only in the Y-Z cross-section but also in any cross-section based on directions that includes the Z direction, e.g., the X-Z cross-section.

The foregoing embodiments, etc. have assumed the instances where the members SLT each have a structure including the contact LI, but this is not a limitation. For example, each member SLT may be formed by filling the corresponding slit SH with an insulator. In this case, no bridging interconnect layer CH is formed.

The foregoing embodiments, etc. have assumed the instances where the contacts LI of the respective, neighboring two portions of the member SLT are electrically coupled with each other by the corresponding bridging interconnect layer CH, but this is not a limitation. When, for example, the source line SL has a sufficiently small resistance, the bridging interconnect layers CH may be omitted.

The foregoing embodiments, etc. have assumed the instances where the semiconductor memory device 3 is fabricated on a single chip, but this is not a limitation. For example, the semiconductor memory device 3 may be of a structure constituted by a chip with the sense amplifier module 16, etc. and another chip with the memory cell array 10, which are bonded together.

The foregoing embodiments, etc. have assumed the instances of adopting a structure in which a set including word lines WL and the select gate line SGS are provided next to each other, and the set including word lines WL and the select gate line SGD are provided next to each other. However, no limitation is intended by this. For example, a dummy word line may be provided between the uppermost word line WL and the select gate line SGD. Similarly, a dummy word line may be provided between the lowermost word line WL and the select gate line SGS. Also, in the structure having the multiple double-decker pillars, the conductive layer in the portion of the boundary between the upper and lower pillars of each double-decker pillar may be used as a dummy word line.

The foregoing second embodiment, etc. have assumed the instances where each semiconductor film 31 and the conductive layer 29 are electrically coupled with each other via the bottom of the corresponding memory pillar MP, but this is not a limitation. The electrical connection between the semiconductor film 31 and the conductive layer 29 may be routed through the side face of the corresponding memory pillar MP. In this case, the lamination film formed as the side face of the memory pillar MP is partially removed, and a structural member that makes a connection between the semiconductor film 31 and the conductive layer 29 through the space created by the removal is formed.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

The invention claimed is:

1. A semiconductor memory device comprising:
a substrate having a first block region and a second block region each extending in a first direction, the first block region and the second block region being arranged in a second direction crossing the first direction;
a first member and a second member each extending in the first direction in a first boundary part between the first block region and the second block region, the first member and the second member being arranged in the first direction;
a first support pillar arranged between the first member and the second member at the first boundary part;
a plurality of conductive layers including a first conductive layer and a second conductive layer, the plurality of conductive layers being separated from one another and arranged in a third direction crossing each of the first direction and the second direction, the plurality of conductive layers being split by the first member, the second member, and the first support pillar into a first portion located in the first block region and a second portion located in the second block region; and
a first memory pillar penetrating through the plurality of conductive layers, the first memory pillar including a portion intersecting the first conductive layer and functioning as a first memory cell and a portion intersecting the second conductive layer and functioning as a second memory cell next to the first memory cell in the third direction,
wherein the first support pillar has a first shape which includes a lower pillar having an upper end at a level between the first conductive layer and the second conductive layer and an upper pillar having a lower end at a level between the first conductive layer and the second conductive layer, and in which a side face of the lower pillar and an extension of a side face of the upper pillar are displaced from each other in a plane based on the second direction and the third direction,
in the first shape, the side face of the lower pillar and the extension of the side face of the upper pillar are in conformity to each other in a plane based on the first direction and the third direction,
the substrate further has a first area and a second area arranged in the first direction,
the first memory pillar is arranged in the first area, and
the plurality of conductive layers includes a plurality of terrace portions in the second area, each of the plurality of terrace portions not overlapping with upper one or more of the plurality of conductive layers.

2. The semiconductor memory device according to claim 1, wherein:
the first support pillar is arranged in a region where the first boundary part and the second area overlap with each other, and the first support pillar is in contact with a first terrace portion of the plurality of terrace portions.

3. The semiconductor memory device according to claim 2, further comprising a third member and a second support pillar in the region where the first boundary part and the second area overlap with each other, wherein:
the first member, the second member, and the third member are arranged in this order in the first direction;

the second support pillar is arranged between the second member and the third member and in contact with a second terrace portion of the plurality of terrace portions that is lower than the first terrace portion, the second support pillar having the first shape; and the second support pillar has a length in the second direction that is greater than a length in the second direction of the first support pillar.

4. The semiconductor memory device according to claim 3, wherein the first member, the second member, and the third member each have a width in the second direction that is wider at a position corresponding to a lower one of the plurality of terrace portions.

5. The semiconductor memory device according to claim 2, wherein the second area overlaps with respective ends of the first block region and the second block region in the first direction.

6. The semiconductor memory device according to claim 2, wherein:
the substrate further has a third area, the first area, the second area, and the third area being arranged in this order in the first direction; and
the device further comprises a second memory pillar arranged in the third area, the second memory pillar penetrating through the plurality of conductive layers, and including a portion intersecting the first conductive layer and functioning as a third memory cell and a portion intersecting the second conductive layer and functioning as a fourth memory cell next to the third memory cell in the third direction.

7. The semiconductor memory device according to claim 6, wherein:
the second area has a sub-area straddling the first boundary part and overlapping with a portion in the second direction of each of the first block region and the second block region; and
the plurality of conductive layers includes the plurality of terrace portions in the sub-area.

8. The semiconductor memory device according to claim 1, wherein the first memory pillar is arranged in a first area of the substrate extending in the second direction, and the first support pillar is arranged in a region where the first boundary part and the first area overlap with each other.

9. The semiconductor memory device according to claim 1, wherein the first member and the second member each include:
a contact extending in the third direction; and
an insulator arranged between the contact and the first support pillar and between the contact and the plurality of conductive layers, and
the device further comprises a conductor above the first support pillar, the conductor electrically coupling the contact of the first member and the contact of the second member.

10. The semiconductor memory device according to claim 1, wherein:
the substrate further has a third block region, the first block region, the second block region, and the third block region being arranged in this order in the second direction; and
the device further comprises
a fourth member and a fifth member each extending in the first direction in a second boundary part between the second block region and the third block region, the fourth member and the fifth member being arranged in the first direction, and a third support pillar arranged between the fourth member and the fifth member at the second boundary part; and the first support pillar and the third support pillar are arranged at positions different from each other with respect to the first direction.

11. A semiconductor memory device comprising:
a substrate extending in a first direction and a second direction crossing each other, the substrate having a first area and a second area arranged in the first direction and a first block region extending in the first direction;
a plurality of conductive layers including a first conductive layer and a second conductive layer, the plurality of conductive layers being separated from one another and arranged in a third direction crossing each of the first direction and the second direction;
a plurality of insulation layers next to the plurality of conductive layers in the second direction in a region where the first block region and the second area overlap with each other, the plurality of insulation layers being arranged in the third direction at substantially same levels as corresponding ones of the plurality of conductive layers, respectively;
a memory pillar penetrating through the plurality of conductive layers in a region where the first block region and the first area overlap with each other, the memory pillar including a portion intersecting the first conductive layer and functioning as a first memory cell and a portion intersecting the second conductive layer and functioning as a second memory cell next to the first memory cell in the third direction;
a first insulation member and a second insulation member each extending in the first direction in a region between the plurality of conductive layers and the plurality of insulation layers, the first insulation member and the second insulation member being arranged in the first direction; and
a first support pillar arranged between the first insulation member and the second insulation member at the region between the plurality of conductive layers and the plurality of insulation layers,
wherein the first insulation member and the second insulation member each have an internal void, the void in the first insulation member and the void in the second insulation member being separated from each other by the first support pillar.

12. The semiconductor memory device according to claim 11, wherein the first support pillar has a first shape which includes a lower pillar having an upper end at a level between the first conductive layer and the second conductive layer and an upper pillar having a lower end at a level between the first conductive layer and the second conductive layer, and in which a side face of the lower pillar and an extension of a side face of the upper pillar are displaced from each other in a plane based on the second direction and the third direction.

13. The semiconductor memory device according to claim 12, wherein, in the first shape, the side face of the lower pillar and the extension of the side face of the upper pillar are in conformity to each other in a plane based on the first direction and the third direction.

14. The semiconductor memory device according to claim 11, further comprising a contact penetrating through the plurality of insulation layers to extend to a layer between the plurality of conductive layers and the substrate.

15. A semiconductor memory device comprising:
a substrate extending in a first direction and a second direction crossing each other, the substrate having a first area and a second area arranged in the first direction and a first block region extending in the first direction;
a plurality of conductive layers including a first conductive layer and a second conductive layer, the plurality of conductive layers being separated from one another and arranged in a third direction crossing each of the first direction and the second direction;
a plurality of insulation layers next to the plurality of conductive layers in the second direction in a region where the first block region and the second area overlap with each other, the plurality of insulation layers being arranged in the third direction at substantially same levels as corresponding ones of the plurality of conductive layers, respectively;
a memory pillar penetrating through the plurality of conductive layers in a region where the first block region and the first area overlap with each other, the memory pillar including a portion intersecting the first conductive layer and functioning as a first memory cell and a portion intersecting the second conductive layer and functioning as a second memory cell next to the first memory cell in the third direction;
a first insulation member and a second insulation member each extending in the first direction in a region between the plurality of conductive layers and the plurality of insulation layers, the first insulation member and the second insulation member being arranged in the first direction;
a first support pillar arranged between the first insulation member and the second insulation member at the region between the plurality of conductive layers and the plurality of insulation layers;
a third insulation member extending in the first direction in a region between the plurality of conductive layers and the plurality of insulation layers, the third insulation member being arranged so that the plurality of insulation layers are sandwiched in the second direction between the third insulation member and a set including the first insulation member and the second insulation member;
a fourth insulation member extending in the first direction in the region between the plurality of conductive layers and the plurality of insulation layers, the third insulation member and the fourth insulation member being arranged in the first direction; and
a second support pillar arranged between the third insulation member and the fourth insulation member at the region between the plurality of conductive layers and the plurality of insulation layers,
wherein the first support pillar and the second support pillar are arranged at positions different from each other with respect to the first direction.

16. The semiconductor memory device according to claim 11, wherein
the substrate further has a second block region extending in the first direction next to the first block region in the second direction, and
the device further comprises a first member and a second member each extending in the first direction and the third direction in a boundary part between the first block region and the second block region so as to split the plurality of conductive layers, the first member and the second member being arranged in the first direction and separated from each other in the first direction, the first member and the second member each including a portion facing the first insulation member or the second insulation member in the second direction.

17. The semiconductor memory device according to claim 15, wherein the first support pillar has a first shape which includes a lower pillar having an upper end at a level between the first conductive layer and the second conductive layer and an upper pillar having a lower end at a level between the first conductive layer and the second conductive layer, and in which a side face of the lower pillar and an extension of a side face of the upper pillar are displaced from each other in a plane based on the second direction and the third direction.

18. The semiconductor memory device according to claim 17, wherein, in the first shape, the side face of the lower pillar and the extension of the side face of the upper pillar are in conformity to each other in a plane based on the first direction and the third direction.

19. The semiconductor memory device according to claim 15, further comprising a contact penetrating through the plurality of insulation layers to extend to a layer between the plurality of conductive layers and the substrate.

\* \* \* \* \*